United States Patent
Motoki et al.

(10) Patent No.: US 8,029,951 B2
(45) Date of Patent: Oct. 4, 2011

(54) COLORED CURABLE COMPOSITION, COLOR FILTER AND PRODUCTION METHOD THEREOF

(75) Inventors: Masuji Motoki, Minami-Ashigara (JP); Yuki Mizukawa, Minami-Ashigara (JP); Toru Fujimori, Shizuoka-ken (JP); Hideki Takakuwa, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 921 days.

(21) Appl. No.: 11/845,148

(22) Filed: Aug. 27, 2007

(65) Prior Publication Data

US 2008/0081268 A1 Apr. 3, 2008

(30) Foreign Application Priority Data

Sep. 29, 2006 (JP) ................. 2006-267815

(51) Int. Cl.
*G02B 5/20* (2006.01)
*G03F 7/00* (2006.01)
(52) U.S. Cl. ......................... 430/7; 430/270.1
(58) Field of Classification Search .................. None
See application file for complete search history.

(56) References Cited

U.S. PATENT DOCUMENTS

2006/0051685 A1* 3/2006 Fujimori et al. .................. 430/7

FOREIGN PATENT DOCUMENTS

| JP | 6-75375 A | 3/1994 |
| JP | 7-111485 A | 11/1995 |
| JP | 7-111485 B2 | 11/1995 |
| JP | 2002-14221 A | 1/2002 |
| JP | 2002-14222 A | 1/2002 |
| JP | 2006-58700 A | 3/2006 |
| JP | 2006-71822 A | 3/2006 |

OTHER PUBLICATIONS

Computer-generated translation of JP 2006-058700 (Mar. 2006).*

* cited by examiner

*Primary Examiner* — John A. McPherson
(74) *Attorney, Agent, or Firm* — Sughrue Mion, PLLC

(57) ABSTRACT

Provided is a colored curable composition, comprising at least one tetraazaporphyrin dye represented by the following Formula (C1), a color filter prepared by using the same, and a production method thereof.

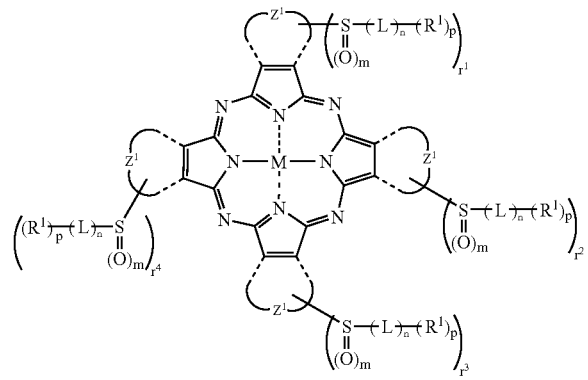

Formula (C1)

wherein, $R^1$ represents a substituent group; L represents an aliphatic or aromatic connecting group; $Z^1$ represents a non-metal atom group needed for forming a six-membered ring with carbon atoms; at least one of the multiple groups $R^1$ has —OY, —COOY, —$SO_3$Y, —CON(Y)CO—, —CON(Y)$SO_2$— or —$SO_2$N(Y)CO—; Y represents a hydrogen atom, a metal atom or a conjugate acid; and M represents two hydrogen atoms, a bivalent metal atom, a bivalent metal oxide, a bivalent metal hydroxide or a bivalent metal chloride.

21 Claims, No Drawings

COLORED CURABLE COMPOSITION, COLOR FILTER AND PRODUCTION METHOD THEREOF

CROSS-REFERENCE TO RELATED APPLICATION

This application claims priority under 35 USC 119 from Japanese Patent Application No. 2006-267,815, the disclosure of which is incorporated by reference herein.

BACKGROUND OF THE INVENTION

1. Field of the Invention

The present invention relates to a colored curable composition favorably used in producing a color filter for use in liquid crystal display elements and solid state image pickup elements, a color filter prepared by using the colored curable composition, and a method of producing the same.

2. Description of the Related Art

Color filters having yellow, magenta, and cyan filter layers and color filters having red, green, and blue filter layers formed together on the same surface of a substrate have been known as the color filters formed for color development on various elements such as solid state image pickup element and liquid crystal display element. A belt-shaped or mosaic pattern is formed with the filter layer in such a color filter.

Various preparative methods were proposed for production of such a color filter. Among them, a so-called color resist method of forming a pattern by exposure and subsequent development of a photosensitive resin composition containing a dye repeatedly for particular times has been practiced widely commercially.

The color resist method, which is a method of preparing a color filter by photolithography by using a colored radiation-sensitive composition containing a pigment dispersed in a photosensitive composition, is considered to be suitable for production of a color filter for large-screen high-resolution color displays, because the color filter is resistant, for example, to heat and light because a pigment is used and also superior in positional accuracy because of the patterning by photolithography.

When a color filter is prepared by a pigment dispersion method of dispersing a pigment as described above, the color filter is prepared by repeating the procedures of coating a radiation-sensitive composition on a glass plate, for example by using a spin coater or a roll coater and obtaining a colored pixel by pattern exposure and development of the coated film, according to the desirable number of colors. Disclosed are many negative working photosensitive compositions containing a photopolymerizable monomer and a photopolymerization initiator together with an alkali-soluble resin that are used in the pigment dispersion method (see, for example, JP-A Nos. 1-102,469, 1-152,499, 2-181,704, 2-199,403, 4-76,062, 5-273,411, 6-184,482, 7-140,654, and 2002-14,222).

However, there is a demand recently for improvement in the resolution of the color filter for use in solid state image pickup elements. However, conventional pigment dispersion systems described above, which were not satisfactory in resolution and had a problem of unevenness in color caused by bulky pigment particles therein, were not suitable for applications demanding fine patterning such as solid state image pickup element.

To overcome the problems, use of a traditional dye was proposed (see, for example, JP-A Nos. 6-75,375 and 2002-14,221 and JP-B No. 7-111,485). However, such dye-containing curable compositions also had the following problems and demanded further improvement thereon:

(1) Dyes are generally lower in heat resistance and light stability and also in fastness than pigments.

(2) When the molar absorption coefficient of a dye is low, it is needed to add a greater amount of the dye, and in such a case, it is necessary to reduce relatively the content of the other components in curable composition, such as polymerizable compound, binder, and photopolymerization initiator, which leads, for example, to deterioration in the curable efficiency of the composition, the heat resistance of hardened region, and the developing efficiency of unhardened area.

(3) Such a dye often interacts with the other components in the curable composition, making it difficult to control the developing efficiency (solubility) of the hardened and unhardened regions.

Thus, the dyes used in traditional photosensitive compositions were unsatisfactory especially in fastness and also lower in solubility in the photosensitive composition, often leading to precipitation of the dye in the liquid or coated-film state and thus, prohibiting addition of the dye at higher concentration.

On the other hand, a mixture of violet and cyan dyes is known to be used for the blue filter array of color filter (see, for example, JP-A No. 2002-14,222). However, the dyes used in JP-A No. 2002-14,222 were unsatisfactory in heat resistance and light stability and thus demanded further improvement.

As described above, although dye-containing curable compositions are useful in applications demanding high resolution and uniform color such as solid state image pickup element, the stability in the color density and tone of the dye, for example against discoloration, is still unsatisfactory, and there is a concern about the fastness, such as heat resistance and light stability, especially of cyan and violet dyes. There is also a demand for improvement in the resistance to dye precipitation due to the low stability over time thereof in the state of liquid preparation or coated film, because the dyes are less soluble. There was also a concern about the color remaining in the unexposed region in the step of forming a pattern by exposing and developing the dye-containing photosensitive resin composition.

SUMMARY OF THE INVENTION

The present invention has been made in view of the above circumstances and provides a colored curable composition, a color filter and a production method thereof.

A first aspect of the invention provides a colored curable composition containing at lease one tetraazaporphyrin dye represented by the following Formula (C1):

Formula (C1)

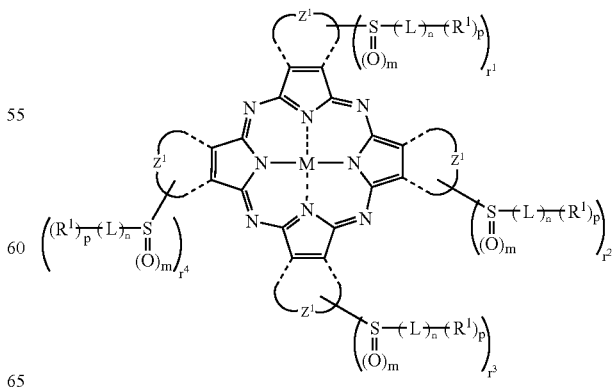

[in Formula (C1), $R^1$ represents a substituent group; L represents an aliphatic or aromatic connecting group; each $Z^1$ represents a non-metal atom needed for forming a six-membered ring with two carbon atoms, and the four groups $Z^1$ may be the same as or different from each other; M represents two hydrogen atoms, a bivalent metal atom, a bivalent metal oxide, a bivalent metal hydroxide or a bivalent metal chloride; m is 1 or 2; n is 0 or 1; p is an integer of 1 to 5; multiple groups $R^1$ in the molecule may be the same as or different from each other, and at least one of the multiple groups $R^1$ contains —OY, —COOY, —SO$_3$Y, —CON(Y)CO—, —CON(Y)SO$_2$— or —SO$_2$N(Y)CO—; Y represents a hydrogen atom, a metal atom or a conjugate acid; and each of $r^1$, $r^2$, $r^3$ and $r^4$ is 0 or 1 and satisfies the following relationship: $r^1+r^2+r^3+r^4 \geq 1$].

A second aspect of the invention provides a color filter, containing at least one tetraazaporphyrin dye represented by the following Formula (C1):

Formula (C1)

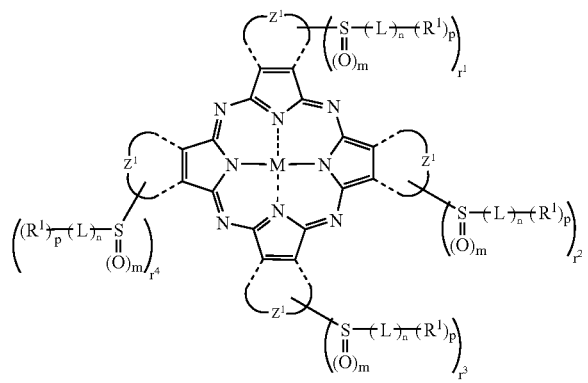

[in Formula (C1), $R^1$ represents a substituent group; L represents an aliphatic or aromatic connecting group; each $Z^1$ represents a non-metal atom needed for forming a six-membered ring with two carbon atoms, and the four groups $Z^1$ may be the same as or different from each other; M represents two hydrogen atoms, a bivalent metal atom, a bivalent metal oxide, a bivalent metal hydroxide or a bivalent metal chloride; m is 1 or 2; n is 0 or 1; p is an integer of 1 to 5; multiple groups $R^1$ in the molecule may be the same as or different from each other, and at least one of the multiple groups $R^1$ contains —OY, —COOY, —SO$_3$Y, —CON(Y)CO—, —CON(Y)SO$_2$— or —SO$_2$N(Y)CO—; Y represents a hydrogen atom, a metal atom or a conjugate acid; and each of $r^1$, $r^2$, $r^3$ and $r^4$ is 0 or 1 and satisfies the following relationship: $r^1+r^2+r^3+r^4 \geq 1$].

A third aspect of the invention provides a method of producing a color filter, including a step of coating the colored curable composition described in the first aspect of the invention <1> above on a substrate and a step of forming a pattern image by exposing the coated film through a mask and developing the coated film.

DETAILED DESCRIPTION OF THE INVENTION

Hereinafter, the colored curable composition and the color filter and the production method according to the invention thereof will be described in detail.

[Colored Curable Composition]

The colored curable composition according to the invention characteristically contains at least one tetraazaporphyrin dye represented by Formula (C1) below as its dye. A colored curable composition containing the tetraazaporphyrin dye is favorable in color and also superior in heat resistance, light fastness and storability over time, and leaves a thinner residual color remaining in the region developed and removed in the patterning step of light exposure and development.

Formula (C1)

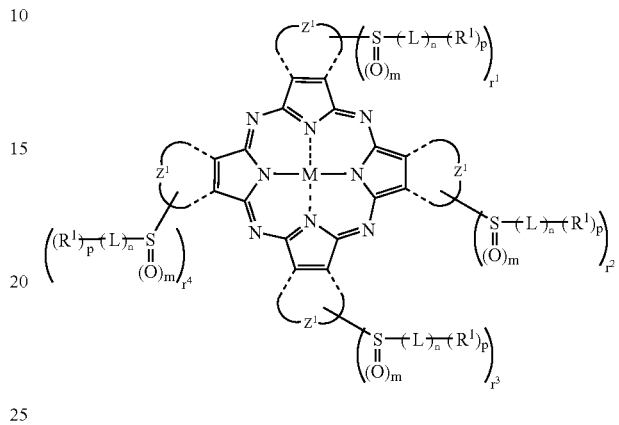

In Formula (C1) above, $R^1$ represents a substituent group. L represents an aliphatic or aromatic connecting group. Each $Z^1$ represents a non-metal atom needed for forming a six-membered ring with two carbon atoms, and the four groups $Z^1$ may be the same as or different from each other. M represents two hydrogen atoms, a bivalent metal atom, a bivalent metal oxide, a bivalent metal hydroxide or a bivalent metal chloride. m is 1 or 2; and n is 0 or 1. p is 0 or an integer of 1 to 5. Multiple groups $R^1$ in the molecule may be the same as or different from each other, and at least one of the multiple groups $R^1$ contains —OY, —COOY, —SO$_3$Y, —CON(Y)CO—, —CON(Y)SO$_2$— or —SO$_2$N(Y)CO—. Y represents a hydrogen atom, a metal atom or a conjugate acid. Each of $r^1$, $r^2$, $r^3$ and $r^4$ is 0 or 1 and satisfies the following relationship: $r^1+r^2+r^3+r^4 \geq 1$.

The colored curable composition according to the invention preferably further contains at least one azomethine dye represented by the following Formula (I). By the addition of the azomethine dye a colored curable composition may be obtained that has: a more favorable color hue; higher heat fastness and light fastness; superior stability over time; and lower residual color in the regions that have been removed by exposure and developing in the patterning process.

Formula (I)

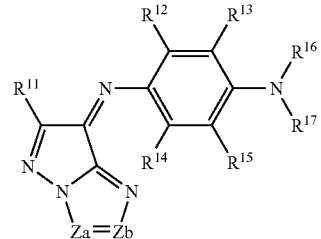

In Formula (I), $R^{11}$, $R^{12}$, $R^{14}$ and $R^{15}$ each independently represent a hydrogen atom or a substituent group; and $R^{16}$ and $R^{17}$ each independently represent an alkyl, alkenyl, aryl or heterocyclic group. Za and Zb each independently represent —N= or —C($R^{18}$)=; and $R^{18}$ represents a hydrogen atom or an alkyl, aryl or heterocyclic group. $R^{12}$ and $R^{13}$, $R^{13}$ and $R^{16}$, $R^{14}$ and $R^{15}$, $R^{15}$ and $R^{17}$, and $R^{16}$ and $R^{17}$ each may independently bind to each other, forming a five- to seven-membered ring.

The colored curable composition according to the invention preferably contains a binder, a radiation-sensitive compound, and a polymerizable monomer, in addition to the dye above (hereinafter, referred to generally as "the dye according to the invention"). Generally, the colored curable composition may contain a solvent additionally and also as needed other components such as crosslinking agent.

Addition of the dye according to the invention makes the colored curable composition according to the invention, more favorable particularly in fastness, more sensitive, more high-resolution, and more transparent.

Hereinafter, the dye according to the invention will be described in detail. The "aliphatic group" in the present specification is a straight-chain, branched-chain or cyclic aliphatic group that may be saturated or unsaturated, and examples thereof include alkyl, alkenyl, cycloalkyl, and cycloalkenyl groups that may be unsubstituted or substituted. The "aryl group" in the present specification is a monocyclic or fused cyclic group that may be unsubstituted or substituted. The "heterocyclic group" in the present specification is a heterocyclic group having a heteroatom (e.g., nitrogen, sulfur or oxygen) therein that may be unsubstituted or substituted, and may be a monocyclic or fused ring that may be unsubstituted or substituted.

The "substituent group" in the present specification is not particularly limited, if it is a substitutable group, and examples thereof include halogen atoms and aliphatic (alkyl, alkenyl, and alkynyl), aryl, heterocyclic, acyl, imide, aliphatic azo, aryl azo, acyloxy, carbamoyloxy, acylamino, aliphatic oxy, aryloxy, heterocyclic oxy, aliphatic oxycarbonyl, aryloxycarbonyl, heterocyclic oxycarbonyl, aliphatic oxycarbonyloxy, aryloxycarbonyloxy, heterocyclic oxycarbonyloxy, carbamoyl, aliphatic sulfonyl, arylsulfonyl, heterocyclic sulfonyl, aliphatic sulfonyloxy, arylsulfonyloxy, heterocyclic sulfonyloxy, sulfamoyl, sulfamoyloxy, aliphatic sulfonylamino, arylsulfonylamino, heterocyclic sulfonylamino, amino, aliphatic amino, arylamino, heterocyclic amino, aliphatic oxycarbonylamino, aryloxycarbonylamino, heterocyclic oxycarbonylamino, nitro, aliphatic sulfinyl, arylsulfinyl, aliphatic thio, arylthio, heterocyclic thio, hydroxy, cyano, sulfo, carboxyl, phosphonyl, phosphinoylamino, silyl, silyloxy, aliphatic oxyamino, aryl oxyamino, carbamoylamino, sulfamoylamino, sulfamoylcarbamoyl, carbamoylsulfamoyl, dialiphatic oxyphosphinyl, diaryloxyphosphinyl, aliphatic sulfonylcarbamoyl, arylsulfonylcarbamoyl, aliphatic carbonylsulfamoyl, arylcarbonylsulfamoyl, aliphatic sulfonylsulfamoyl, arylsulfonylsulfamoyl and other groups.

—Tetraazaporphyrin Dye Represented by Formula (C1)—

The colored curable composition according to the invention contains at least one tetraazaporphyrin dye represented by the following Formula (C1) (hereinafter, referred to as "the phthalocyanine dye according to the invention"). The dye has a favorable cyan color higher in light-transmitting characteristics and is also superior in stability without precipitation over time as liquid preparation or coated film and in resistance especially to heat and light. Hereinafter, the tetraazaporphyrin dye represented by Formula (C1) will be described.

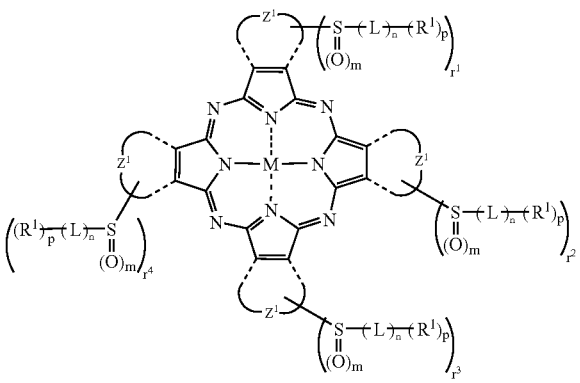

Formula (C1)

In Formula (C1), $R^1$ represents a substituent group. Favorable substituent groups represented by $R^1$ include halogen atoms and aliphatic, aryl, heterocyclic, cyano, carboxyl, carbamoyl, aliphatic oxycarbonyl, aryloxycarbonyl, acyl, hydroxy, aliphatic oxy, aryloxy, acyloxy, carbamoyloxy, heterocyclic oxy, acylamino, carbamoylamino, sulfamoylamino, aliphatic oxycarbonylamino, aryloxycarbonylamino, aliphatic sulfonylamino, arylsulfonylamino, aliphatic thio, arylthio, aliphatic sulfonyl, arylsulfonyl, sulfamoyl, aliphatic sulfonylcarbamoyl, arylsulfonylcarbamoyl, aliphatic carbonylsulfamoyl, arylcarbonylsulfamoyl, aliphatic sulfonylsulfamoyl, arylsulfonylsulfamoyl, sulfo, imido, and heterocyclic thio groups.

The halogen atom represented by $R^1$ is, for example, a fluorine, chlorine or bromine atom. The aliphatic group represented by $R^1$ may be an unsubstituted or substituent, saturated or unsaturated, cyclic or linear aliphatic group, preferably having 1 to 15 total carbon atoms, such as methyl, ethyl, vinyl, allyl, ethynyl, isopropenyl, or 2-ethylhexyl.

The aryl group represented by $R^1$ may be an unsubstituted or substituent aryl group, preferably having 6 to 16 total carbon atoms, more preferably 6 to 12 total carbon atoms, such as phenyl, 4-nitrophenyl, 2-nitrophenyl, 2-chlorophenyl, 2,4-dichlorophenyl, 2,4-dimethylphenyl, 2-methylphenyl, 4-methoxyphenyl, 2-methoxyphenyl, or 2-methoxycarbonyl-4-nitrophenyl.

The heterocyclic group represented by $R^1$ may be a saturated or unsaturated heterocyclic group, preferably having 3 to 15 total carbon atoms, more preferably having 3 to 10 total carbon atoms, such as 3-pyridyl, 2-pyridyl, 2-pyrimidinyl, 2-pyrazinyl, or 1-piperidyl. The group may be substituted additionally.

The carbamoyl group represented by $R^1$ may be an unsubstituted or substituent carbamoyl group, preferably having 1 to 16 total carbon atoms, more preferably 1 to 12 total carbon atoms, such as carbamoyl, dimethylcarbamoyl, diethylcarbamoyl, N-methyl-n-propylcarbamoyl, N-ethyl-N-methoxyethylcarbamoyl, bis(2-methylbutyl)carbamoyl, bis(2-ethylhexyl)carbamoyl, bis(methoxyethyl)carbamoyl, bis(ethoxyethyl)carbamoyl, bis(propoxyethyl)carbamoyl, or N-carboxymethyl-N-methylcarbamoyl.

The aliphatic oxycarbonyl group represented by $R^1$ may be an unsubstituted or substituent, saturated or unsaturated, cyclic or acyclic oxycarbonyl group, preferably having 2 to 16 total carbon atoms, more preferably 2 to 10 total carbon atoms, such as methoxycarbonyl or butoxycarbonyl.

The aryloxycarbonyl group represented by $R^1$ may be an unsubstituted or substituent aryloxycarbonyl group, preferably having 7 to 17 total carbon atoms, more preferably 7 to 15 total carbon atoms, such as phenoxycarbonyl.

The acyl group represented by $R^1$ may be an aliphatic carbonyl or aryloxycarbonyl group, which may be substituted when it is an aliphatic carbonyl group and may be substituted and also saturated or unsaturated when it is an aryloxycarbonyl group. The acyl group is preferably an acyl group having 2 to 15 total carbon atoms, more preferably having 2 to 10 total carbon atoms, such as acetyl, pivaloyl or benzoyl. The group may be substituted additionally.

The aliphatic oxy group represented by $R^1$ may be an unsubstituted or substituent, saturated or unsaturated, cyclic or linear aliphatic oxy group. The aliphatic oxy group is preferably an aliphatic oxy group having 1 to 12 total carbon atoms, more preferably having 1 to 10 total carbon atoms, such as methoxy, ethoxyethoxy, methoxyethoxy, methoxydiethoxy, phenoxyethoxy, or thiophenoxyethoxy.

The aryloxy group represented by $R^1$ may be an unsubstituted or substituent aryloxy group, preferably having 6 to 18 total carbon atoms, more preferably having 6 to 14 total carbon atoms, such as phenoxy or 4-methylphenoxy group.

The acyloxy group represented by $R^1$ may be an unsubstituted or substituent acyloxy group, preferably having 2 to 14 total carbon atoms, more preferably having 2 to 14 carbon atoms, such as acetoxy, methoxyacetoxy, or benzoyloxy.

The carbamoyloxy group represented by $R^1$ may be an unsubstituted or substituent carbamoyloxy group, preferably having 1 to 16 total carbon atoms, more preferably having 1 to 16 total carbon atoms, such as dimethylcarbamoyloxy, diisopropylcarbamoyl, N,N-bis(methoxyethyl)-carbamoyl, or N,N-bis(ethoxyethyl)-carbamoyl.

The heterocyclic oxy group represented by $R^1$ may be an unsubstituted or substituent heterocyclic oxy group, preferably having 1 to 15 total carbon atoms, more preferably having 3 to 10 total carbon atoms, such as 3-furyloxy, 3-pyridyloxy, or N-methyl-2-piperidyloxy.

The aliphatic oxycarbonylamino group represented by $R^1$ may be an unsubstituted or substituent aliphatic oxycarbonylamino group, preferably having 2 to 15 total carbon atoms, more preferably having 2 to 10 total carbon atoms, such as methoxycarbonylamino or methoxyethoxycarbonylamino.

The aryloxycarbonylamino group represented by $R^1$ may be an unsubstituted or substituent aryloxycarbonylamino group, preferably having 7 to 17 total carbon atoms, more preferably having 7 to 15 total carbon atoms, such as phenoxycarbonylamino or 4-methoxycarbonylamino group.

The aliphatic sulfonylamino group represented by $R^1$ may be an unsubstituted or substituent, saturated or unsaturated, cyclic or linear aliphatic sulfonylamino group. The aliphatic sulfonylamino group is preferably an aliphatic sulfonylamino group having 1 to 12 total carbon atoms, more preferably having 1 to 8 total carbon atoms, such as methanesulfonylamino or butanesulfonylamino.

The arylsulfonylamino group represented by $R^1$ may be an unsubstituted or substituent arylsulfonylamino group, preferably having 6 to 17 total carbon atoms, more preferably having 6 to 15 total carbon atoms, such as phenylsulfonylamino or 4-methylphenylsulfonylamino.

The acylamino group represented by $R^1$ may be an unsubstituted or substituent acylamino group, preferably having 2 to 15 total carbon atoms, more preferably having 3 to 12 total carbon atoms, such as N-methyl acetylamino, N-ethoxyethylbenzoylamino, or N-methylmethoxyacetylammo.

The carbamoylamino group represented by $R^1$ may be an unsubstituted or substituent carbamoylamino group, preferably having 1 to 16 total carbon atoms, more preferably having 1 to 12 total carbon atoms, such as N,N-dimethylcarbamoylamino or N-methyl-N-methoxyethylcarbamoylamino.

The sulfamoylamino group represented by $R^1$ may be an unsubstituted or substituent sulfamoylamino group, preferably having 0 to 16 total carbon atoms, more preferably having 0 to 12 total carbon atoms, such as N,N-dimethylsulfamoylamino.

The aliphatic thio group represented by $R^1$ may be an unsubstituted or substituent, saturated or unsaturated, cyclic or linear aliphatic thio group. The aliphatic thio group is preferably an aliphatic thio group having 1 to 16 total carbon atoms, more preferably having 1 to 12 total carbon atoms, such as methylthio, ethylthio or ethoxyethylthio.

The arylthio group represented by $R^1$ may be an unsubstituted or substituent arylthio group, preferably having 6 to 22 total carbon atoms, more preferably having 6 to 14 total carbon atoms, such as phenylthio or 2-t-butylthio.

The aliphatic sulfonyl group represented by $R^1$ may be an unsubstituted or substituent aliphatic sulfonyl group, preferably having 1 to 15 total carbon atoms, more preferably having 1 to 8 total carbon atoms, such as methanesulfonyl, butanesulfonyl or methoxyethanesulfonyl.

The arylsulfonyl group represented by $R^1$ may be an unsubstituted or substituent arylsulfonyl group, preferably having 6 to 16 total carbon atoms, more preferably having 6 to 12 total carbon atoms, such as benzenesulfonyl, 4-t-butylbenzenesulfonyl, 4-toluenesulfonyl, or 2-toluenesulfonyl.

The sulfamoyl group represented by $R^1$ may be an unsubstituted or substituent sulfamoyl group, preferably having 0 to 16 total carbon atoms, more preferably having 0 to 12 carbon atoms, such as sulfamoyl, dimethylsulfamoyl or N,N-diethylsulfamoyl.

The imide group represented by $R^1$ is preferably an imide group having 3 to 22 total carbon atoms, more preferably having 3 to 15 total carbon atoms, that may be fused with another ring, such as succinimide or phthalimide.

The heterocyclic thio group represented by $R^1$ may be an unsubstituted or substituent five- to seven-membered heterocyclic thio group, preferably having 1 to 20 total carbon atoms, more preferably having 1 to 12 total carbon atoms, such as 3-furylthio or 3-pyridylthio.

The aliphatic sulfonylcarbamoyl group represented by $R^1$ may be an unsubstituted or substituent aliphatic sulfonylcarbamoyl group, preferably having 2 to 17 total carbon atoms, more preferably having 2 to 13 carbon atoms, such as methylsulfonylcarbamoyl, butylsulfonylcarbamoyl, or 2-methylbutylsulfonylcarbamoyl.

The arylsulfonylcarbamoyl group represented by $R^1$ may be an unsubstituted or substituent arylsulfonylcarbamoyl group, preferably having 7 to 21 total carbon atoms, more preferably having 7 to 17 total carbon atoms, such as phenylsulfonylcarbamoyl.

The aliphatic carbonylsulfamoyl group represented by $R^1$ may be an unsubstituted or substituent aliphatic carbonylsulfamoyl group, preferably having 2 to 17 total carbon atoms, more preferably having 2 to 13 total carbon atoms, such as methylcarbonylsulfamoyl, butylcarbonylsulfamoyl or 2-ethylhexylcarbonylsulfamoyl.

The arylcarbonylsulfamoyl group represented by $R^1$ may be an unsubstituted or substituent arylcarbonylsulfamoyl group, preferably having 7 to 21 total carbon atoms, more preferably having 7 to 17 total carbon atoms, such as phenylcarbonylsulfamoyl.

The aliphatic sulfonylsulfamoyl group represented by $R^1$ may be an unsubstituted or substituent aliphatic sulfonylsulfamoyl group, preferably having 1 to 16 total carbon atoms, more preferably having 1 to 12 total carbon atoms, such as methylcarbonylsulfamoyl, butylcarbonylsulfamoyl, or 2-ethylhexylcarbonylsulfamoyl.

The arylsulfonylsulfamoyl group represented by $R^1$ may be an unsubstituted or substituent arylsulfonylsulfamoyl group, preferably having 6 to 16 total carbon atoms, more preferably having 6 to 12 total carbon atoms, such as phenylsulfonylsulfamoyl.

For the advantageous effects of the invention, $R^1$ is more preferably a halogen atom or an aliphatic, cyano, carboxy, carbamoyl, aliphatic oxycarbonyl, aryloxycarbonyl, hydroxy, aliphatic oxy, carbamoyloxy, heterocyclic oxy, aliphatic oxycarbonyloxy, carbamoylamino, sulfamoylamino, aliphatic oxycarbonylamino, aliphatic sulfonylamino, arylsulfonylamino, aliphatic thio, arylthio, aliphatic sulfonyl, arylsulfonyl, sulfamoyl, aliphatic sulfonylcarbamoyl, arylsulfonylcarbamoyl, aliphatic carbonylsulfamoyl, arylcarbonylsulfamoyl, aliphatic sulfonylsulfamoyl, arylsulfonylsulfamoyl, imide or sulfo group; still more preferably an aliphatic, carboxy, carbamoyl, hydroxy, aliphatic oxycarbonyl, aryloxycarbonyl, aliphatic oxy, aliphatic oxycarbonyloxy, carbamoylamino, sulfamoylamino, aliphatic oxycarbonylamino, aliphatic sulfonylamino, arylsulfonylamino, aliphatic sulfonyl, arylsulfonyl, sulfamoyl, aliphatic sulfonylcarbamoyl, aliphatic carbonylsulfamoyl, aliphatic sulfonylsulfamoyl, imide or sulfo group; and most preferably a carboxy, carbamoyl, hydroxy, aliphatic oxycarbonyl, aliphatic oxy, aliphatic oxycarbonyloxy, carbamoylamino, aliphatic oxycarbonylamino, arylsulfonyl, aliphatic sulfonylcarbamoyl, aliphatic carbonylsulfamoyl, aliphatic sulfonylsulfamoyl, imido or aliphatic sulfonyl group.

In Formula (C1) above, L represents an aliphatic or aromatic connecting group. When there are multiple groups L in the molecule, the groups L may be the same as or different from each other. The aliphatic connecting group represented by L above may be an unsubstituted or substituent aliphatic group, preferably having 1 to 20 total carbon atoms, more preferably having 1 to 15 total carbon atoms, such as methylene, ethylene, propylene, or butylene group.

The aromatic connecting group represented by L above may be an unsubstituted or substituent aromatic group, preferably having 6 to 20 total carbon atoms, more preferably having 6 to 16 carbon total atoms, such as phenylene or naphthylene, and a phenylene group is most preferable.

In Formula (C1) above, each $Z^1$ represents a non-metal atom group needed for forming a six-membered ring with two carbon atoms, and the four groups $Z^1$ may be the same as or different from each other. The six-membered ring formed may be an aryl ring or a heterocyclic ring that may be fused with another ring, and the fused ring may be substituted additionally. Examples of the six-membered rings include benzene, pyridine, cyclohexene, and naphthalene rings, and the like, and a benzene ring is favorable.

In Formula (C1) above, M represents two hydrogen atoms, a bivalent metal atom, a bivalent metal oxide, a bivalent metal hydroxide, or a bivalent metal chloride. Exemplary embodiments of M include VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$, $H_2$, and the like, and VO, Zn, Mn, Cu, Ni, and Co are favorable. For the advantageous effects of the invention, M is preferably VO, Mn, Co, Ni, Cu, Zn or Mg, more preferably VO, Co, Cu or Zn, and still more preferably Cu.

In Formula (C1) above, m is 1 or 2, preferably 2. n is 0 or 1, preferably 1. p is an integer of 1 to 5, preferably 1 to 3, and more preferably 1.

In the invention, multiple groups $R^1$ in the molecule may be the same as or different from each other, and at least one of the multiple groups $R^1$ has —OY, —COOY, —$SO_3$Y, —CON(Y)CO—, CON(Y)$SO_2$— or —$SO_2$N(Y)CO—. It is thus possible to control the residual color remaining in the region developed and removed in the patterning step.

In Formula (C1), the group —OY, —COOY, —$SO_3$Y, —CON(Y)CO—, CON(Y)$SO_2$— or —$SO_2$N(Y)CO— may be bound to the connecting group L or directly to —S(=O)m- without the connecting group L. When it is bound directly to —S(=O)m- without the connecting group L, $R^1$ is preferably —OY, forming —$SO_3$Y directly bound to the tetraazaporphyrin ring with —S(=O)m- (m=2).

Y represents a hydrogen atom, a metal atom or a conjugate acid. The metal atom represented by Y is, for example, Li, Na, K, Mg, or Ca, preferably Li, Na, or K. Examples of the bases forming the conjugate acid represented by Y include tertiary amines, (such as triethylamine, tripropylamine, tributylamine, diisopropylethylamine, N-methylpiperidine, and 4-methylmorpholine), guanidines (such as guanidine, N,N-diphenylguanidine, and 1,3-di-o-toluoylguanidine), pyridines (such as pyridine and 2-methylpyridine), and the like. Among them, triethylamine, tripropylamine, tributylamine, N,N-diphenylguanidine, and 1,3-di-o-toluoylguanidine are preferable.

Each of $r^1$, $r^2$, $r^3$ and $r^4$ is 0 or 1; $r^1+r^2+r^3+r^4$ is 1 or more; and $r^1+r^2+r^3+r^4$ is preferably 2 to 4. Alternatively, all of $r^1$, $r^2$, $r^3$ and $r^4$ are preferably 1.

Preferably in the tetraazaporphyrin dye represented by Formula (C1) above, $R^1$ is a carboxy, carbamoyl, hydroxy, aliphatic oxycarbonyl, aliphatic oxy, aliphatic oxycarbonyloxy, carbamoylamino, aliphatic oxycarbonylamino, arylsulfonyl, aliphatic sulfonylcarbamoyl, aliphatic carbonylsulfamoyl, aliphatic sulfonylsulfamoyl, imido or aliphatic sulfonyl group; L represents an aliphatic group having 1 to 15 total carbon atoms or an aromatic group having 6 to 16 total carbon atoms; $Z^1$ represents a non-metal atom group needed for forming a benzene, pyridine, cyclohexene or naphthalene ring; M is VO, Co, Cu or Zn; m is 2; n is 0 or 1; p is 1; and $r^1+r^2+r^3+r^4$ is 2 to 4.

More preferably, $R^1$ is a carboxy, a carbamoyl group (such as diethylcarbamoyl, N-methyl-n-propylcarbamoyl, N-ethyl-N-methoxyethylcarbamoyl, bis(2-methylbutyl)carbamoyl, bis(2-ethylhexyl)carbamoyl, bis(methoxyethyl)carbamoyl, bis(ethoxyethyl)carbamoyl, bis(propoxyethyl)carbamoyl, or N-carboxymethyl-N-methylcarbamoyl), a hydroxy group, an aliphatic oxycarbonyl group (such as butoxycarbonyl), an aliphatic oxy group (such as methoxyethoxy or methoxydiethoxy), an aliphatic sulfonylcarbamoyl group (such as 2-methylbutylsulfonylcarbamoyl), an aliphatic carbonylsulfamoyl group (such as 2-ethylhexylcarbonylsulfamoyl), an aliphatic sulfonylsulfamoyl group (such as 2-ethylhexylcarbonylsulfamoyl), an imide group or an aliphatic sulfonyl group; L represents an aliphatic group having 1 to 6 total carbon atoms or an aromatic group having 6 to 10 total carbon atoms; $Z^1$ represents a non-metal atom group needed for forming a benzene ring; M is VO, Co, Cu or Zn; m is 2; n is 0 or 1; and p is 1.

Hereinafter, typical examples of the compounds represented by Formula (C1) are shown below as exemplary compounds C-1 to C-66, but the invention is not limited thereby.

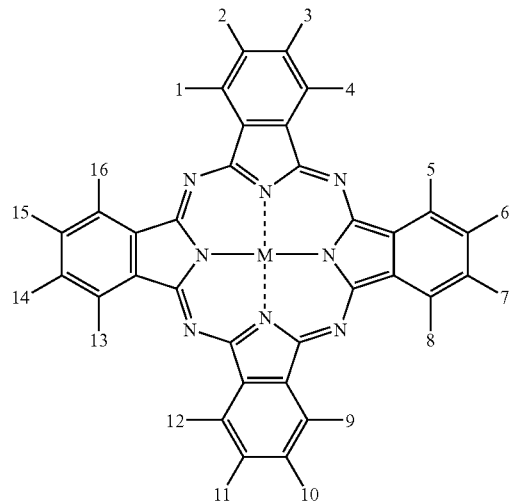

| Exemplary compound | M | Substituents at 1 or 4, 5 or 8, and 9 or 12 (H at the other 3 sites) | Substituent at 13 or 16 (H at the other site) | Substituents at the other eight sites |
|---|---|---|---|---|
| C-1 | Cu | —SO$_2$—C$_6$H$_4$—C(O)N(CH$_2$CH$_2$OC$_2$H$_5$)$_2$ | —SO$_2$—C$_6$H$_4$—C(O)N(CH$_3$)CH$_2$COOH | H |
| C-2 | Cu | —SO$_2$—C$_6$H$_4$—C(O)N(CH$_2$CH$_2$OC$_2$H$_5$)$_2$ | —SO$_2$—C$_6$H$_4$—C(O)OH | H |
| C-3 | Cu | —SO$_2$—C$_6$H$_4$—C(O)N(CH$_2$CHCH$_2$CH$_3$)$_2$ (with CH$_3$) | —SO$_2$—C$_6$H$_4$—C(O)N(CH$_3$)CH$_2$COOH | H |
| C-4 | Cu | —SO$_2$—C$_6$H$_4$—C(O)N(CH$_2$CHCH$_2$CH$_3$)$_2$ (with CH$_3$) | —SO$_2$—C$_6$H$_4$—C(O)OH | H |
| C-5 | Cu | ortho —SO$_2$—C$_6$H$_4$—C(O)N(CH$_2$CH$_2$OC$_2$H$_5$)$_2$ | ortho —SO$_2$—C$_6$H$_4$—N(CH$_3$)C(O)CH$_2$COOH | H |
| C-6 | Cu | ortho —SO$_2$—C$_6$H$_4$—C(O)N(CH$_2$CH$_2$OC$_2$H$_5$)$_2$ | meta —SO$_2$—C$_6$H$_4$—C(O)OH | H |
| C-7 | Cu | meta —SO$_2$—C$_6$H$_4$—C(O)N(CH$_2$CH$_2$OC$_3$H$_7$)$_2$ | —SO$_2$—C$_6$H$_4$—C(O)N(CH$_3$)CH$_2$COOH | H |

-continued

| | | | | |
|---|---|---|---|---|
| C-8 | Cu | —SO$_2$—C$_6$H$_4$—C(O)N(CH$_2$CH$_2$OC$_3$H$_7$)$_2$ (meta) | —SO$_2$—C$_6$H$_4$—C(O)N(CH$_3$)CH$_2$COOH (meta) | H |
| C-9 | VO | —SO$_2$—C$_6$H$_4$—C(O)N(CH$_2$CH$_2$OC$_2$H$_5$)$_2$ (para) | —SO$_2$—C$_6$H$_4$—C(O)N(CH$_3$)CH$_2$COOH (para) | H |
| C-10 | Co | —SO$_2$—C$_6$H$_4$—C(O)N(CH$_2$CH$_2$OC$_2$H$_5$)$_2$ (para) | —SO$_2$—C$_6$H$_4$—C(O)N(CH$_3$)CH$_2$COOH (para) | H |
| C-11 | Cu | —SO$_2$—CH(CH$_3$)C(O)N(CH$_2$CH$_2$OC$_2$H$_5$)$_2$ | —SO$_2$—C$_6$H$_4$—C(O)N(CH$_3$)CH$_2$COOH (para) | H |
| C-12 | Cu | —SO$_2$—CH(CH$_3$)C(O)N(CH$_2$CH$_2$OC$_2$H$_5$)$_2$ | —SO$_2$—C$_6$H$_4$—COOH (para) | H |
| C-13 | Cu | —SO$_2$—CH$_2$CH$_2$SO$_2$N(CH$_2$CH$_2$OCH$_3$)$_2$ | —SO$_2$—C$_6$H$_4$—C(O)N(CH$_3$)CH$_2$COOH (para) | H |
| C-14 | Cu | —SO$_2$—CH$_2$CH$_2$SO$_2$N(CH$_2$CH$_2$OC$_2$H$_5$)$_2$ | —SO$_2$—C$_6$H$_3$(3-CH$_3$)—COOH (para-SO$_2$, COOH at 4) | H |
| C-15 | Cu | —SO$_2$—CH(CH$_3$)C(O)N(CH$_2$CH$_2$OC$_2$H$_5$)$_2$ | 2-(SO$_2$—)C$_6$H$_4$—C(CH$_3$)=N—CH$_2$COOH (with O=) | H |
| C-16 | Cu | —SO$_2$—CH(CH$_3$)C(O)N(CH$_2$CH$_2$OC$_2$H$_5$)$_2$ | —SO$_2$—C$_6$H$_4$—C(O)OH (meta) | H |
| C-17 | Cu | —SO$_2$—CH(CH$_3$)C(O)N(CH$_2$CH$_2$OCH$_3$)$_2$ | —SO$_2$—C$_6$H$_4$—C(O)N(CH$_3$)CH$_2$COOH (para) | H |
| C-18 | Cu | —SO$_2$—CH(CH$_3$)C(O)N(CH$_2$CH$_2$OC$_2$H$_5$)$_2$ | —SO$_2$—C$_6$H$_4$—C(O)NHSO$_2$CH$_2$CH(CH$_3$)CH$_3$ (para) | H |

-continued

| Exemplary compound | M | | | |
|---|---|---|---|---|
| C-19 | Cu | —SO$_2$—(CH$_2$)$_2$O(CH$_2$)$_2$OCH$_3$ | 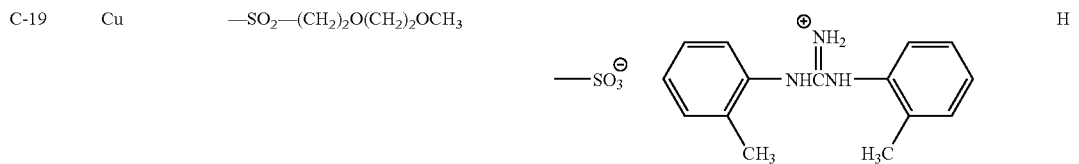 | H |
| C-20 | Cu | —SO$_2$—(CH$_2$)$_2$O(CH$_2$)$_2$O(CH$_2$)$_2$OCH$_3$ | 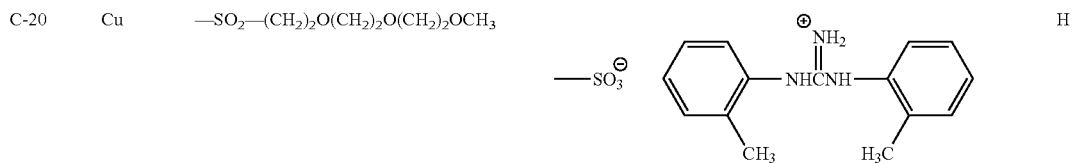 | H |

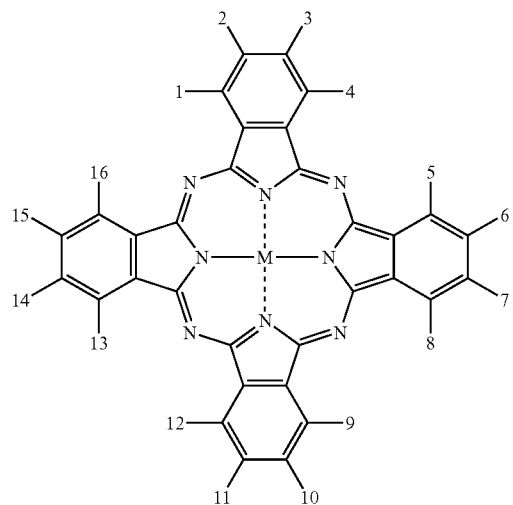

| Exemplary compound | M | Substituents at 1 or 4, 5 or 8, and 9 or 12 (H at the other 3 sites) | Substituent at 14 or 15 (H at the other site) | Substituents at the other eight sites |
|---|---|---|---|---|
| C-21 | Cu | —SO$_2$—CH(CH$_3$)CN(CH$_2$CH$_2$OC$_2$H$_5$)$_2$ (C=O) | —SO$_2$—CH$_2$CH$_2$C(=O)—OH | H |
| C-22 | Cu | —SO$_2$—CH(CH$_3$)CN(CH$_2$CH$_2$OC$_2$H$_5$)$_2$ (C=O) | —SO$_2$—CH$_2$CH$_2$CH$_2$C(=O)—OH | H |
| C-23 | Cu | —SO$_2$—CH(CH$_3$)CN(CH$_2$CH$_2$OCH$_3$)$_2$ (C=O) | —SO$_2$—CH$_2$CH(CH$_3$)CH$_2$C(=O)—OH | H |
| C-24 | Cu | —SO$_2$—(CH$_2$)$_2$O(CH$_2$)$_2$OCH$_3$ | —SO$_2$—CH$_2$CH(CH$_3$)CH$_2$C(=O)—OH | H |
| C-25 | Cu | —SO$_2$—(CH$_2$)$_2$O(CH$_2$)$_2$O(CH$_2$)$_2$OCH$_3$ | 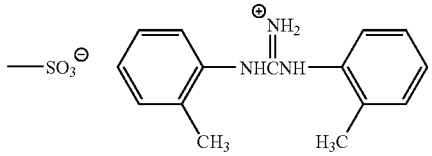 | H |

-continued

| | | | | |
|---|---|---|---|---|
| C-26 | Cu | —SO$_2$—CH(CH$_3$)COOC$_4$H$_9$ | —SO$_3^\ominus$ [di(2-methylphenyl)guanidinium cation] | H |
| C-27 | Cu | —SO$_2$—C(CH$_3$)$_2$CN(CH$_3$)CH$_2$CH$_2$CH$_3$ (with C=O) | —SO$_3^\ominus$ [di(2-methylphenyl)guanidinium cation] | H |
| C-28 | Cu | —SO$_2$—CH(CH$_3$)CON(C$_2$H$_5$)$_2$ | —SO$_3^\ominus$ [diphenylguanidinium cation] | H |
| C-29 | Cu | —SO$_2$—CH(CH$_3$)CN(C$_2$H$_5$)(CH$_2$CHC$_4$H$_9$)$_2$ (with C=O) | —SO$_3^\ominus$ [diphenylguanidinium cation] | H |
| C-30 | Cu | —SO$_2$—CH(CH$_3$)CN(C$_2$H$_5$)(CH$_2$CHC$_4$H$_9$)$_2$ (with C=O) | —SO$_3^\ominus$  Na$^\oplus$ | H |
| C-31 | Cu | —SO$_2$—C$_6$H$_4$—C(=O)N(CH$_2$CH$_2$OC$_2$H$_5$)$_2$ | —SO$_2$—C$_6$H$_4$—C(=O)N(CH$_3$)CH$_2$COOH | H |
| C-32 | Cu | —SO$_2$—C$_6$H$_4$—C(=O)N(CH$_2$CH$_2$OC$_2$H$_5$)$_2$ | —SO$_2$—C$_6$H$_4$—COOH | H |
| C-33 | Cu | —SO$_2$—C$_6$H$_4$—C(=O)N(CH$_2$CH$_2$OC$_2$H$_5$)$_2$ | —SO$_2$—C$_6$H$_4$—COOH (meta) | H |
| C-34 | Cu | —SO$_2$—C$_6$H$_4$—C(=O)N(CH$_2$CH$_2$OC$_2$H$_5$)$_2$ | —SO$_2$—C$_6$H$_3$(CH$_3$)—COOH | H |
| C-35 | Cu | —SO$_2$—C$_6$H$_4$—C(=O)N(CH$_2$CH$_2$OC$_2$H$_5$)$_2$ | —SO$_2$—C$_6$H$_4$—C(=O)N(CH$_3$)CH$_2$COOH | H |
| C-36 | Cu | —SO$_2$—C$_6$H$_4$—C(=O)N(CH$_2$CH$_2$CH$_3$)CH(CH$_3$) | —SO$_2$—C$_6$H$_4$—C(=O)N(C$_2$H$_5$)CH$_2$COOH | H |

-continued

| Exemplary compound | M | | | |
|---|---|---|---|---|
| C-37 | Cu | —SO₂—C₆H₄—C(O)N(CH₂CH(CH₃)CH₂CH₃)₂ | —SO₂—C₆H₄—C(O)NHSO₂CH₂CH(CH₃)CH₂CH₃ | H |
| C-38 | Cu | 2-[C(O)N(CH₂CH₂OC₂H₅)₂]-C₆H₄—SO₂— | 2-[C(O)N(CH₃)CH₂COOH]-C₆H₄—SO₂— | H |
| C-39 | Cu | —SO₂—C₆H₄—C(O)N(CH₂CH₂OC₂H₅)₂ | 2-[C(O)N(CH₃)CH₂COOH]-C₆H₄—SO₂— | H |
| C-40 | Cu | —SO₂—C₆H₄—C(O)N(CH₂CH₂OC₃H₇)₂ | —SO₂—C₆H₄—C(O)N(CH₃)CH₂COOH | H |

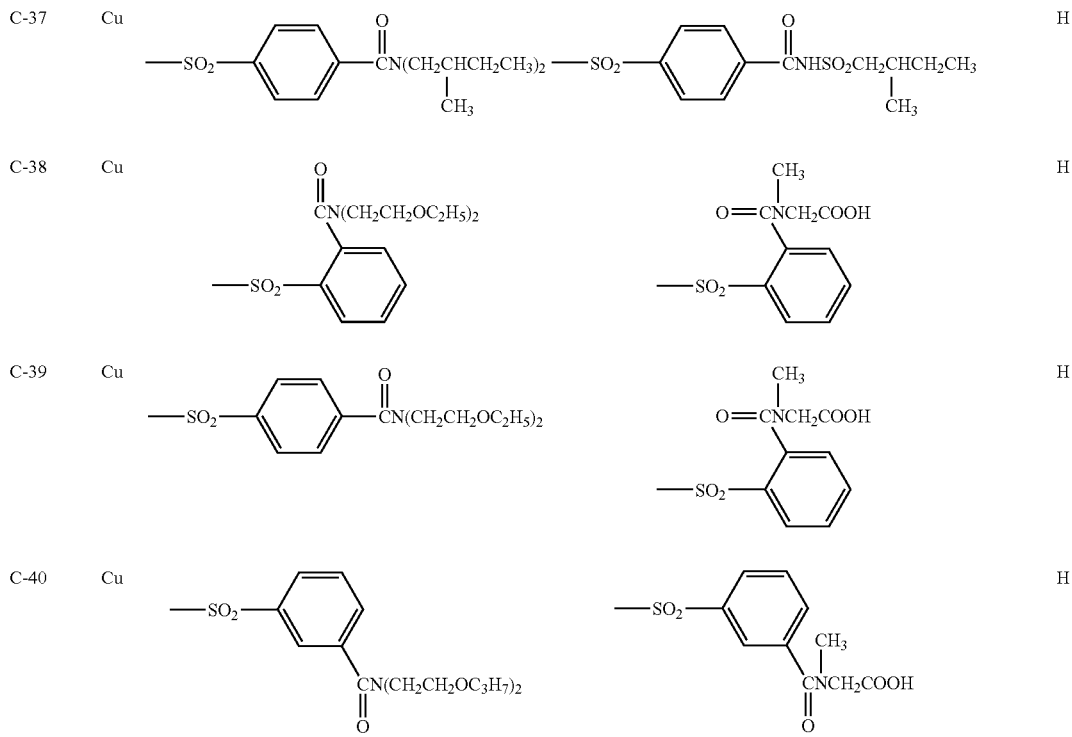

| Exemplary compound | M | Substituents at 1 or 4, 5 or 8 (H at the other 2 sites) | Substituent at 14 or 15, 9 or 12 (H at the other site) | Substituents at the other eight sites |
|---|---|---|---|---|
| C-41 | Cu | —SO₂—C₆H₄—C(O)N(CH₂CH₂OC₂H₅)₂ | —SO₂—C₆H₄—C(O)N(CH₃)CH₂COOH | H |
| C-42 | Cu | —SO₂—C₆H₄—C(O)N(CH₂CH₂OC₂H₅)₂ | —SO₂—C₆H₄—C(O)OH | H |

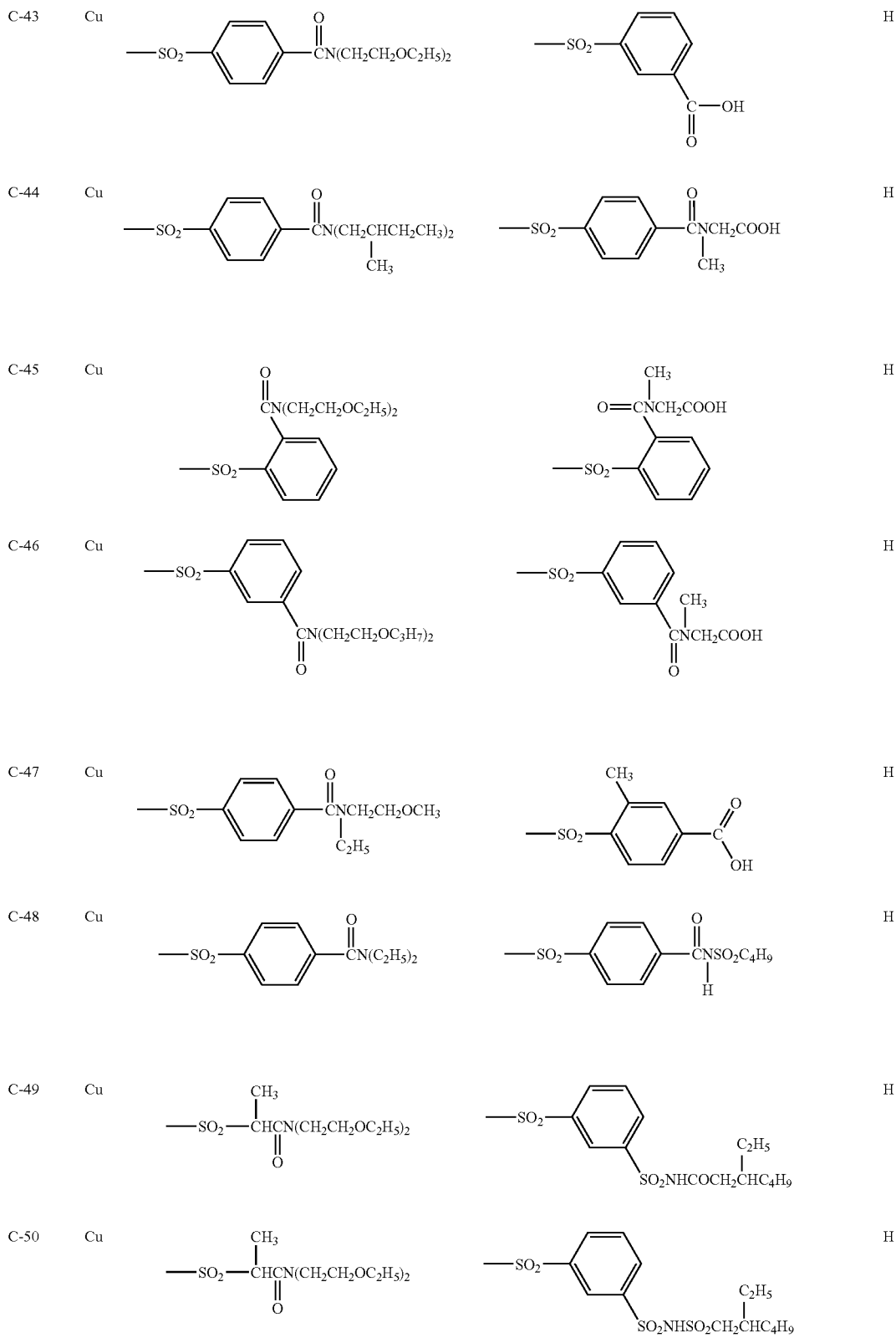

C-51
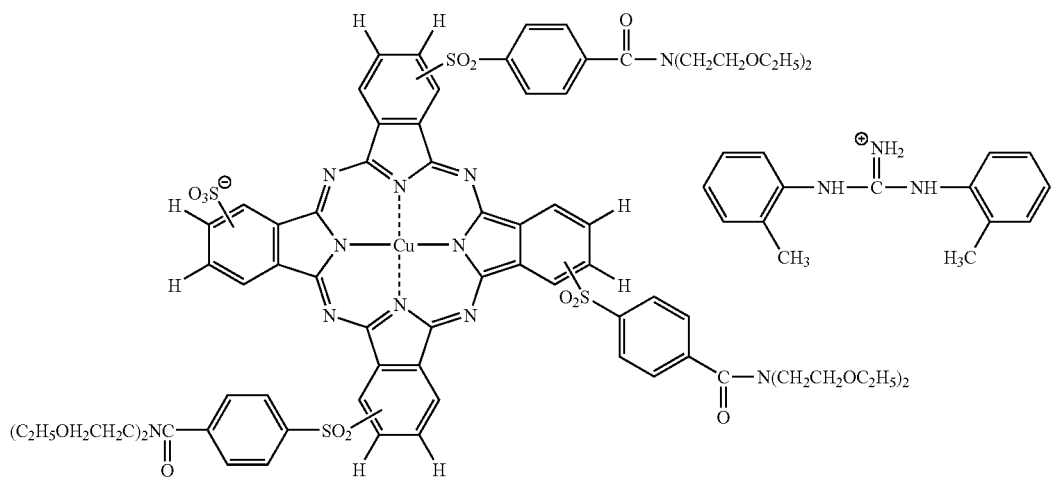
C-52
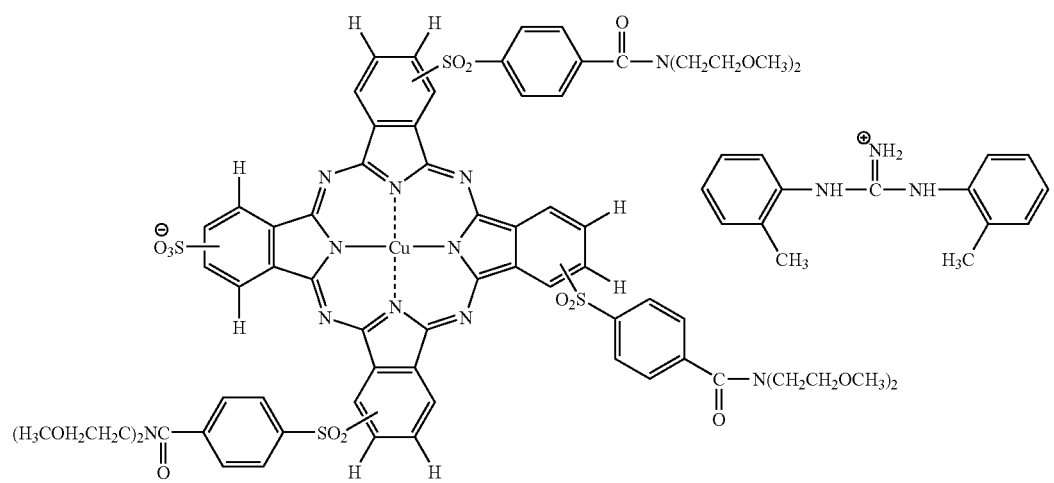
C-53
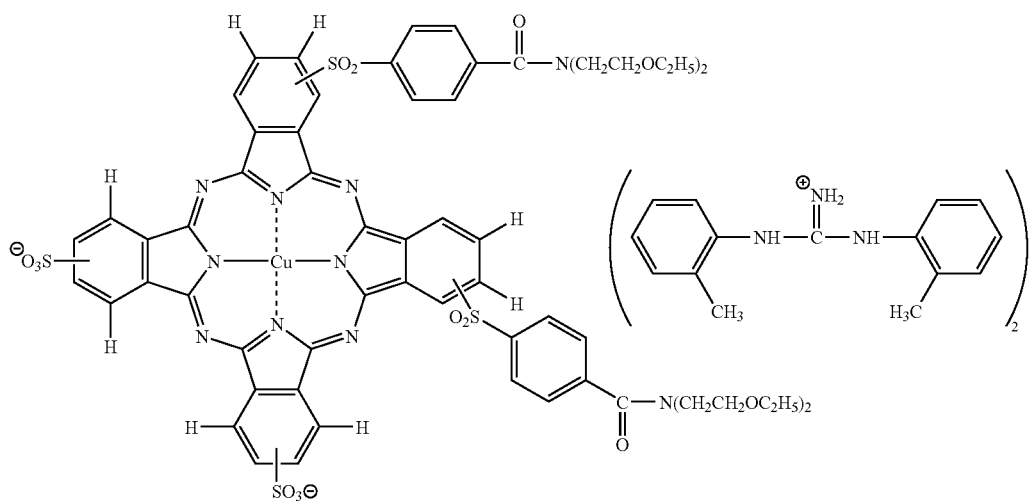

-continued
C-54
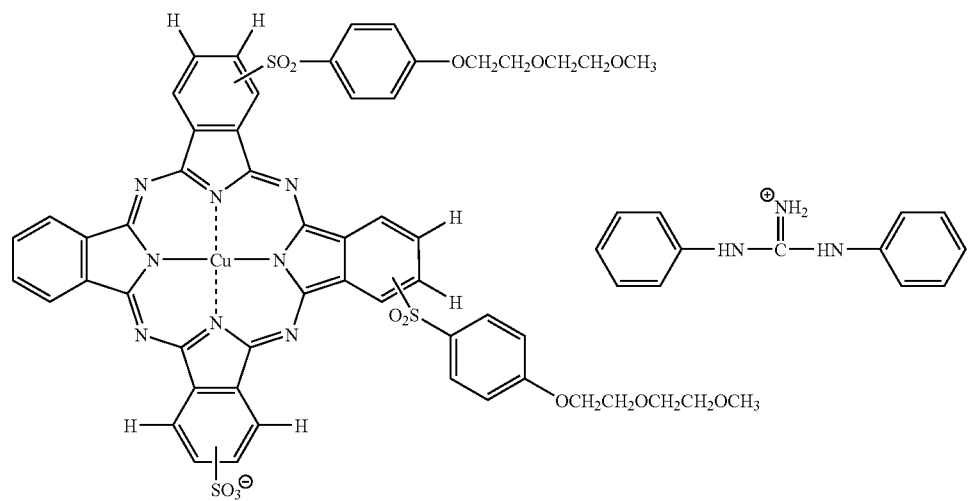
C-59
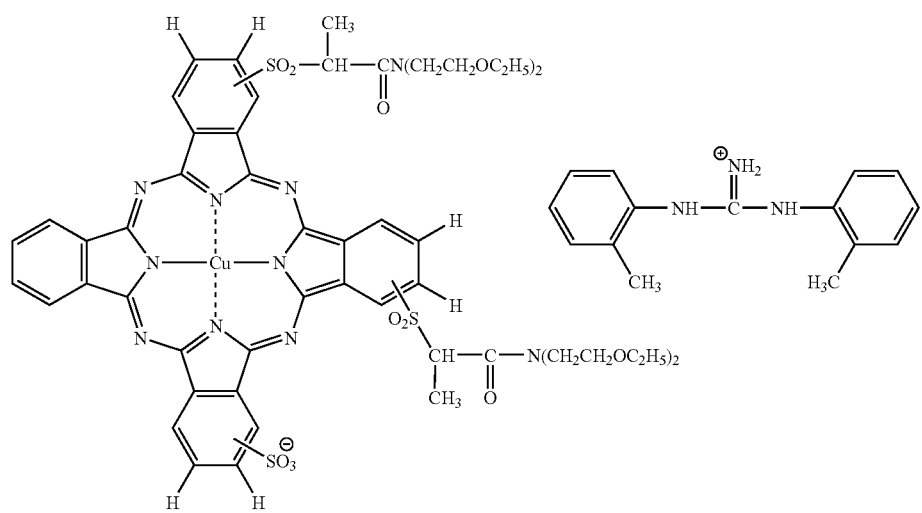
C-60
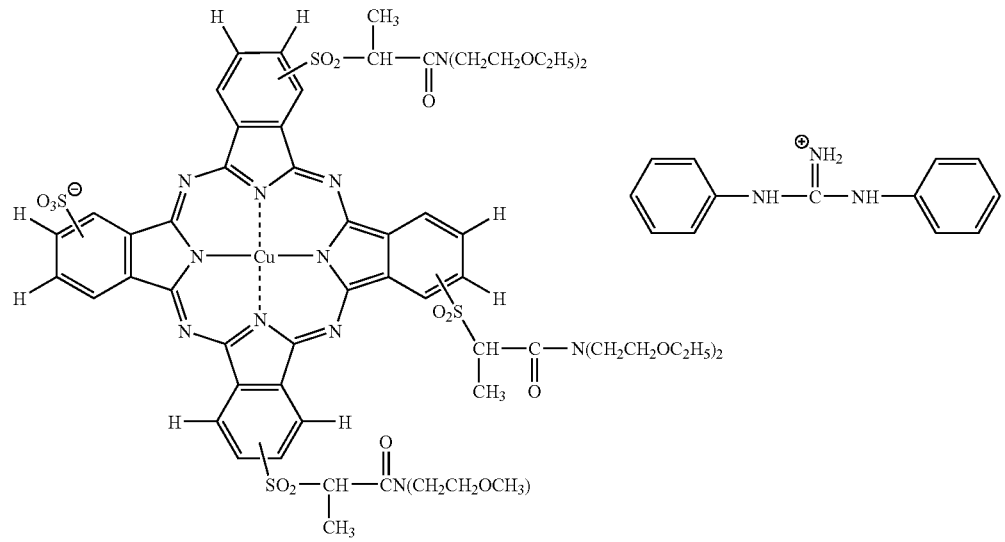

-continued
C-61
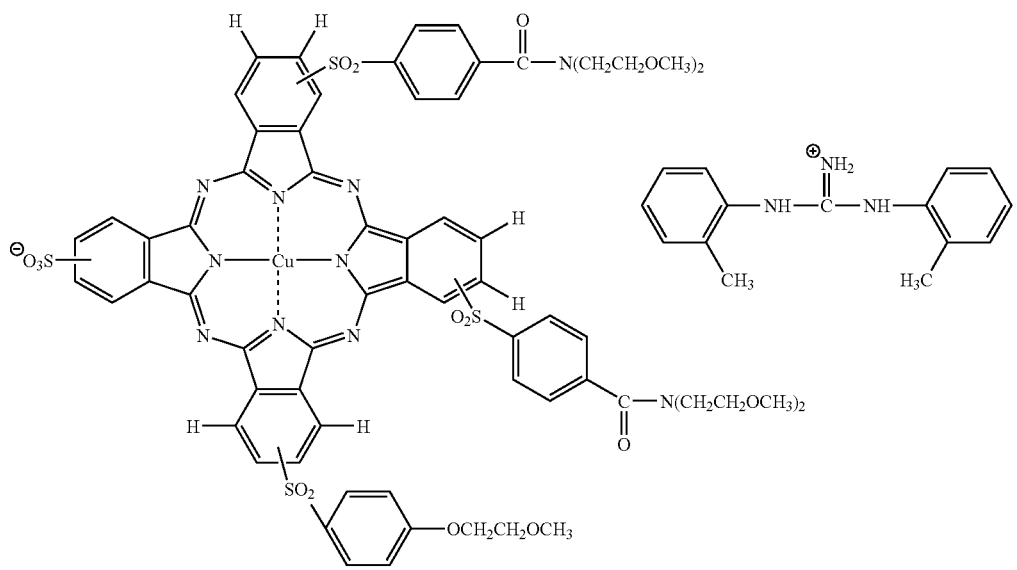
C-62
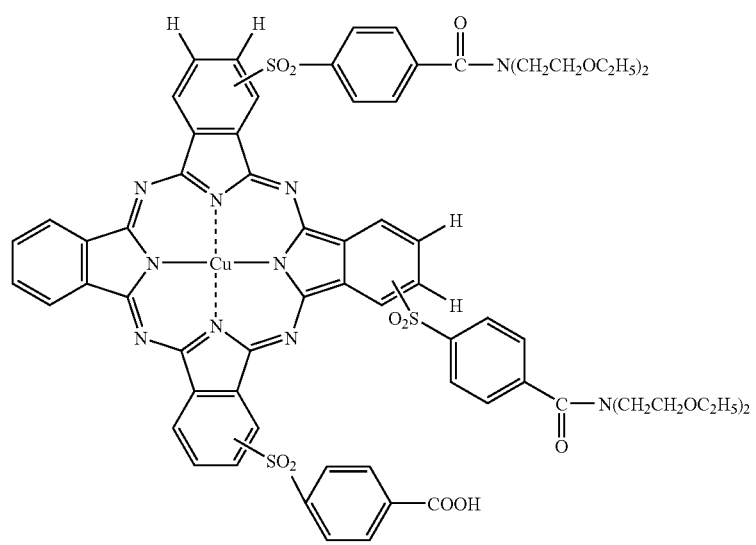
C-63
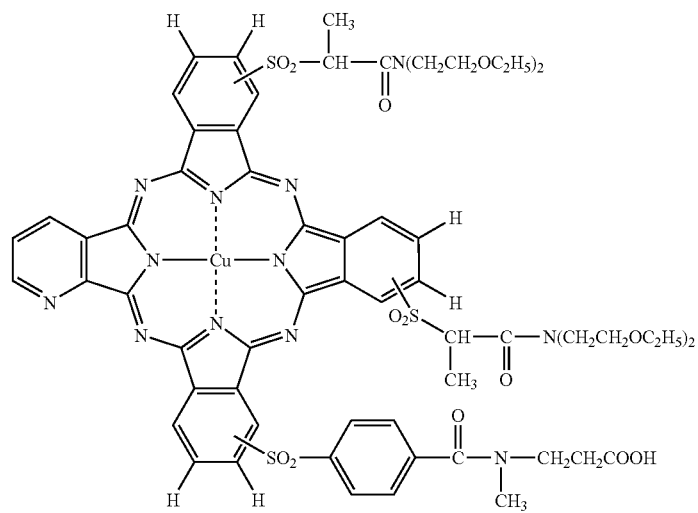

C-64
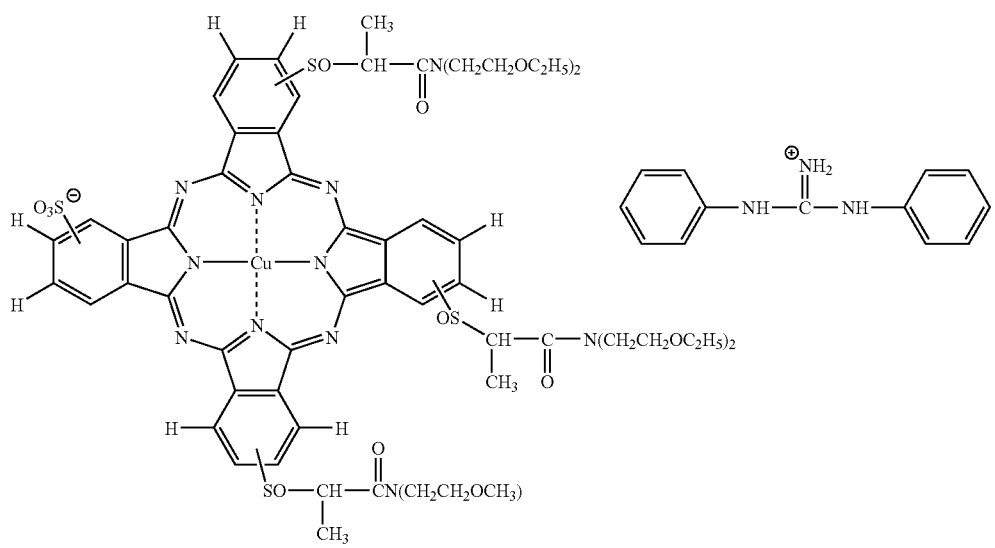
C-65
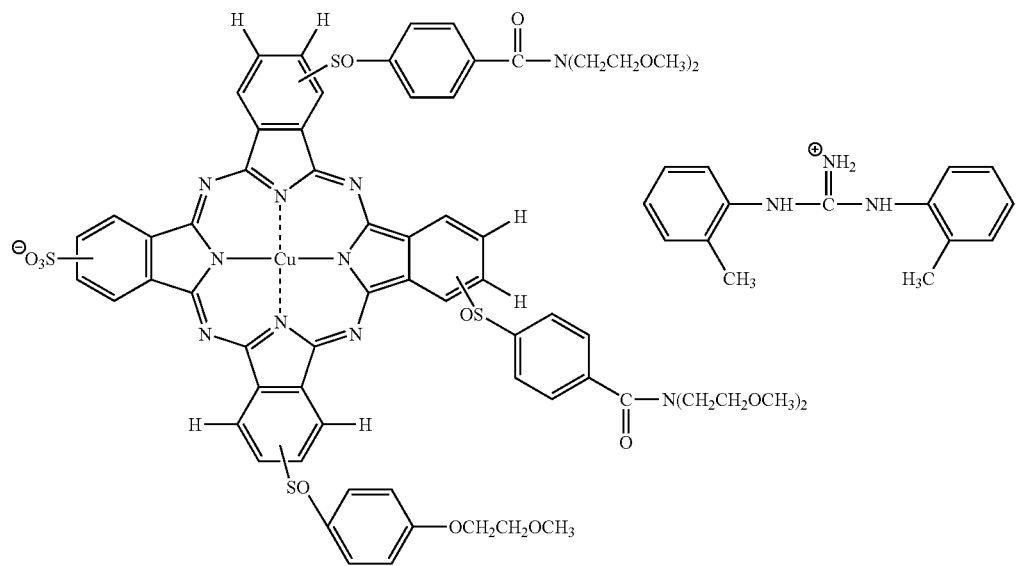

C-66
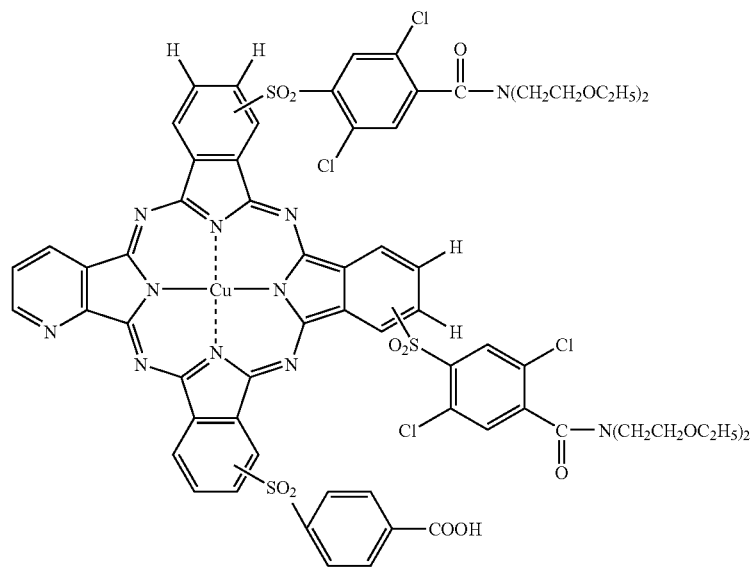
The tetraazaporphyrin dye represented by Formula (C1) can be prepared according to the methods described, for example, JP-A Nos. 2006-58,787, 2006-124,379 and 2006-124,679, and others. A method of preparing the exemplary compound C-1 will be described below as a typical example.
Exemplary compound C-1
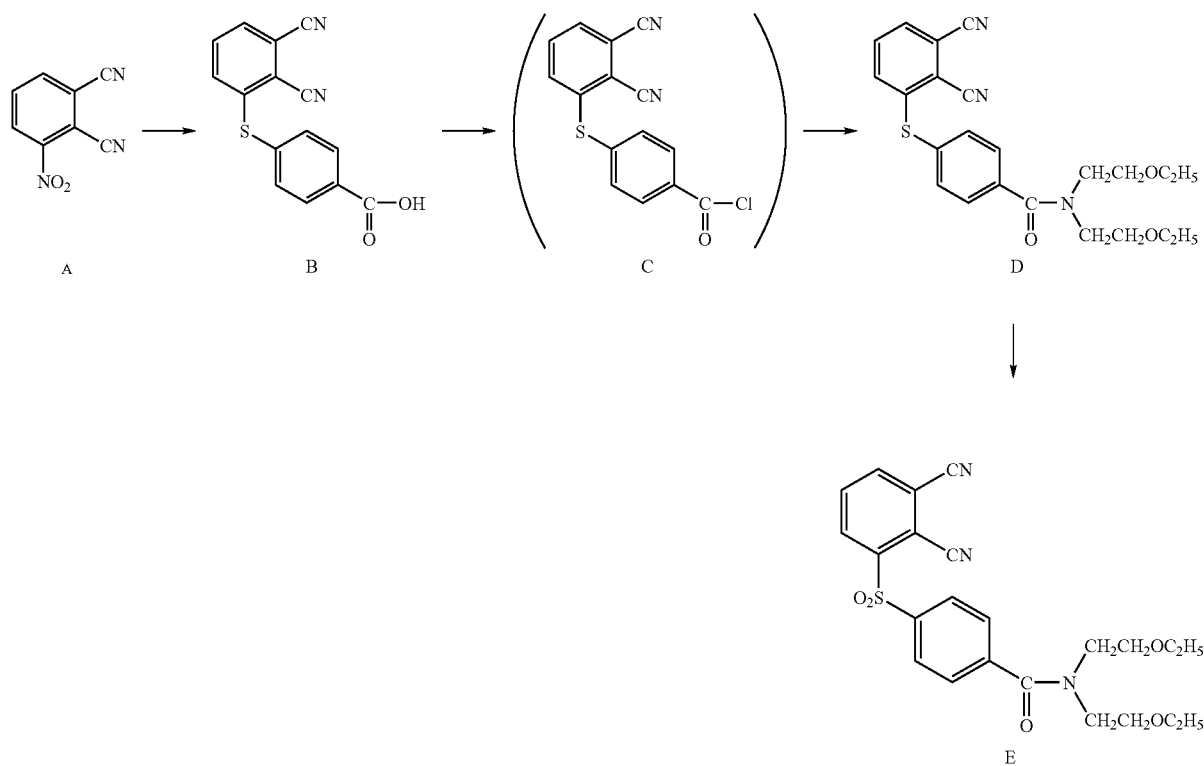

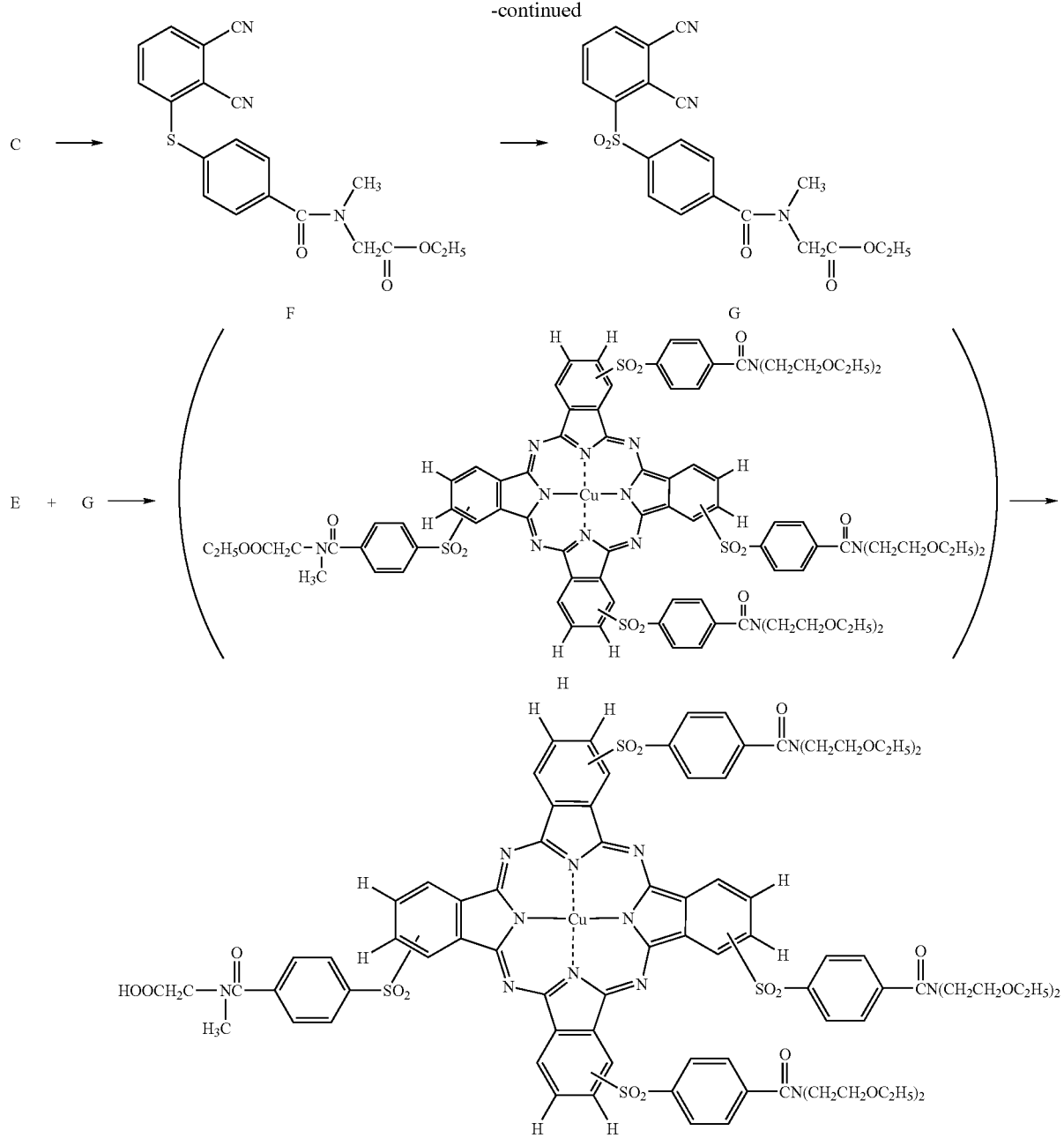

(1) Preparation of Compound B 125 g (0.722 mole) of compound A and (0.904 mole) of potassium carbonate were added to 600 ml of N-methylpyrrolidone. A solution of 125 g (0.811 mole) of 4-carboxylbenzenethiol dissolved in N-methylpyrrolidone was added dropwise over 30 minutes, while the mixture was cooled with water. After the solution was stirred for two hours while water-cooled, 1.3 L of water was added thereto dropwise over 30 minutes. The mixture was heated to an internal temperature of 40° C.; a mixed solution of 67 ml (0.978 mole) of 85% phosphoric acid and 150 ml water was added dropwise over 30 minutes; and the mixture was stirred at 50° C. for one hour. 700 ml of water was added dropwise, while the mixture was stirred at room temperature. The precipitated crystal was filtered, and washed thoroughly with water and then with acetonitrile. The crystal obtained was dried, to give 200.4 g of a white crystalline compound B (yield 99.0%).

(2) Preparation of Compound D 60 g (0.214 mole) of the compound B was added to and dissolved in 350 ml of N-methylpyrrolidone at room temperature. 20.3 ml (0.278 mole) of thionyl chloride was added dropwise while the mixture was water-cooled, and the mixture was stirred additionally for 2 hours. 41.4 g (0.257 mole) of bis(2-ethoxyethyl)amine was added dropwise over 20 minutes, while the mixture was water-cooled. 74.6 ml (0.535 mole) of triethylamine was then added dropwise over 10 minutes. The mixture was stirred while water-cooled for 2 hours, and 0.9 l of water was added dropwise. The precipitated crystal was filtered, and washed thoroughly with water and then with 0.5 l of acetonitrile. The crystal obtained was dried, to give 82.8 g of a white crystalline compound D (yield 91.4%).

(3) Preparation of Compound E 12 g (0.03 mole) of the compound D was added to and dissolved in 100 ml acetic acid and 20 ml of water at room temperature. 7.7 g (0.049 mole) of potassium permanganate powder was divided into portions and added thereto while the mixture was water-cooled. The mixture was stirred for one hour while water-cooled, and the reaction solution was poured into 300 ml of water and extracted with 200 ml of ethyl acetate. The ethyl acetate layer was washed with aqueous sodium bicarbonate solution and then thoroughly with water. Ethyl acetate was distilled off under reduced pressure, and the residue was purified by column chromatography, to give 9.5 g of an oily compound E (71.8%).

(4) Preparation of Compound F 140 g (0.5 mole) of the compound B was added to and dissolved in 900 ml of N-methylpyrrolidone at room temperature. 47.4 ml (0.65 mole) of thionyl chloride was added dropwise over 15 minutes while the mixture was water-cooled, and the mixture was stirred additionally for two hours. 92.1 g (0.6 mole) of sarcosine ethyl ester hydrochloride salt was added over 5 minutes, while the mixture was water-cooled. 258 ml (1.85 mole) of triethylamine was added dropwise over one hour, while the mixture was ice-cooled. The mixture was allowed to react at 15 to 20° C. for 2 hours, and then, 2.4 l of water was added dropwise. The mixture was stirred at room temperature for 1 hour, and the precipitated crystal was filtered, and washed thoroughly with water and also with 0.5 l of acetonitrile. The crystal obtained was dried, to give 176.3 g of a white crystalline compound F (yield: 93.0%).

(5) Preparation of Compound G 25 g (0.066 mole) of the compound F was added to and dissolved in 200 ml of acetic acid and 40 ml of water at room temperature. 16.7 g (0.106 mole) of potassium permanganate powder was added in portions thereto, while the mixture was water-cooled. The mixture was stirred while water-cooled for 1 hour, and the reaction solution was added to 500 ml of water and extracted with 300 ml of ethyl acetate. The ethyl acetate layer was washed with aqueous sodium bicarbonate solution and then thoroughly with water. Ethyl acetate was distilled off under reduced pressure, and the residue was purified by column chromatography, to give 20.4 g of an oily compound G (75.0%).

(6) Preparation of Exemplary Compound C-1

4.92 g (0.0108 mole) of the compound E and 1.48 g (0.0036 mole) of the compound G were added to and dissolved in 10 ml of diethylene glycol and 18 ml of 1-methoxy-2-propanol at room temperature. The mixture was heated to an internal temperature of 110° C. 2.0 g (0.0143 mole) of ammonium benzoate and then 0.65 g (0.0036 mole) of copper acetate (II) were added thereto under nitrogen stream. The mixture was stirred at an internal temperature of 110 to 115° C. for 5 hours. To the reaction solution cooled to 50° C., added was a solution of 2 g (0.036 mole) of potassium hydroxide dissolved in 40 ml of methanol and 5 ml of water, and the mixture was stirred at 50° C. for 2 hours. To the reaction solution cooled to 30° C., a liquid mixture of 250 ml of water and 25 ml (0.29 mole) of hydrochloric acid was added dropwise at room temperature over 10 minutes. The precipitated crystal was filtered and washed thoroughly with water until the filtrate became neutral. The crystal obtained was dried, to give 5.3 g (81.2%) of a desired exemplary compound C-1 as blue crystal.

Maximum absorption wavelength λmax in ethyl acetate: 662.2 nm (∈119,300)

Other compounds represented by Formula (C1) can be prepared by a synthetic method. Hereinafter, the azomethine dye according to the invention represented by Formula (I) will be described in detail.

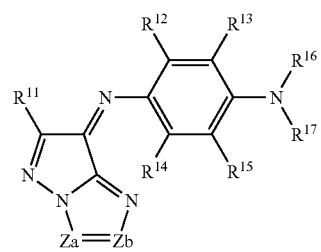

Formula (I)

In Formula (I) above, $R^{11}$ represents a hydrogen atom or a substituent group.

The substituent group is, for example, a halogen atom (such as fluorine, chlorine or bromine), an alkyl group (preferably straight-chain, branched-chain or cyclic alkyl group represented by $R^{11}$ having 1 to 48 carbon atoms, more preferably 1 to 18, such as methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl, or 1-adamantyl), an alkenyl group (preferably alkenyl group having 2 to 48 carbon atoms, more preferably 2 to 18, such as vinyl, allyl, or 3-buten-1-yl), an aryl group (preferably aryl group having 6 to 48 carbon atoms, more preferably 6 to 12, such as phenyl or naphthyl), a heterocyclic group (preferably heterocyclic group having 1 to 32 carbon atoms, more preferably 1 to 12, such as 2-thienyl, 4-pyridyl, 2-furyl, 2-pyrimidinyl, 1-pyridyl, 2-benzothiazolyl, 1-imidazolyl, 1-pyrazolyl, or benzotriazolyl-1-yl), a silyl group (preferably silyl group having 3 to 38 carbon atoms, more preferably 3 to 12, such as trimethylsilyl, triethylsilyl, tributylsilyl, t-butyldimethylsilyl, or t-hexyldimethylsilyl), a hydroxyl group, a cyano group, a nitro group, an alkoxy group (preferably alkoxy group having 1 to 48 carbon atoms, more preferably 1 to 12, such as methoxy, ethoxy, 1-butoxy, 2-butoxy, isopropoxy, t-butoxy, or dodecyloxy group, or cycloalkyloxy group such as cyclopentyloxy or cyclohexyloxy), an aryloxy group (preferably aryloxy group having 6 to 48 carbon atoms, more preferably 6 to 12, such as phenoxy or 1-naphthoxy), a heterocyclic oxy group (preferably heterocyclic oxy group having 1 to 32 carbon atoms, more preferably 1 to 12, such as 1-phenyltetrazole-5-oxy or 2-tetrahydropyranyloxy), a silyloxy group (preferably silyloxy group having 1 to 32 carbon atoms, more preferably 1 to 12, such as trimethylsilyloxy, t-butyldimethylsilyloxy, or diphenylmethylsilyloxy), an acyloxy group (preferably acyloxy group having 2 to 48 carbon atoms, more preferably 2 to 12, such as acetoxy, pivaloyloxy, benzoyloxy, or dodecanoyloxy), an alkoxycarbonyloxy group (preferably alkoxycarbonyloxy group having 2 to 48 carbon atoms, more preferably 2 to 12, such as ethoxycarbonyloxy or t-butoxycarbonyloxy group, or cycloalkyloxycarbonyloxy group such as cyclohexyloxycarbonyloxy), an aryloxycarbonyloxy group (preferably aryloxycarbonyloxy group having 7 to 32 carbon atoms, more preferably 7 to 18, such as phenoxycarbonyloxy), a carbamoyloxy group (preferably carbamoyloxy group having 1 to 48 carbon atoms, more preferably 1 to 12, such as N,N-dimethylcarbamoyloxy, n-butylcarbamoyloxy, N-phenylcarbamoyloxy, or N-ethyl-N-phenylcarbamoyloxy), a sulfamoyloxy group (preferably sulfamoyloxy group having 1 to 32 carbon atoms, more preferably 1 to 12, such as N,N-diethylsulfamoyloxy or N-propylsulfamoyloxy), an alkylsulfonyloxy group (preferably alkylsulfonyloxy group having 1 to 38 carbon atoms, more preferably 1 to 12, such as methylsulfonyloxy, hexadecylsulfonyloxy, or cyclohexylsulfonyloxy), an arylsulfonyloxy group (preferably arylsulfonyloxy group having 6 to 32 carbon atoms, more preferably 6 to 12, such as phenylsulfonyloxy, etc.), an acyl group (preferably acyl group having 1 to 48 carbon atoms, more preferably 1 to 12, such as formyl, acetyl, pivaloyl, benzoyl, tetradecanoyl, or cyclohaxanoyl), an alkoxycarbonyl group (preferably alkoxycarbonyl group having 2 to 48 carbon atoms, more preferably 2 to 12, such as methoxycarbonyl, ethoxycarbonyl, octadecyloxycarbonyl, or cyclohexyloxycarbonyl), an aryloxycarbonyl group (preferably aryloxycarbonyl group having 7 to 32 carbon atoms, more preferably 7 to 12, such as phenoxycarbonyl), a carbamoyl group (preferably carbamoyl group having 1 to 48 carbon atoms, more preferably 1 to 12, such as carbamoyl, N,N-diethylcarbamoyl, N-ethyl-N-octylcarbamoyl, N,N-dibutylcarbamoyl, N-propylcarbamoyl, N-pheylcarbamoyl, N-methyl-N-pheylcarbamoyl, or N,N-dicyclohexylcarbamoyl), an amino group (preferably amino group having 32 or less carbon atoms, more preferably 12 or less, such as amino, methylamino, N,N-dibutylamino, tetradecylamino, 2-ethylhexylamino, or cyclohexylamino), an anilino group (preferably anilino group having 6 to 32 carbon atoms, more preferably 6 to 12, such as anilino or N-methylanilino), a heterocyclic amino group (preferably heterocyclic amino group having 1 to 32 carbon atoms, more preferably 1 to 12, such as 4-pyridylamino), an acylamino group (preferably acylamino group having 2 to 48 carbon atoms, more preferably 2 to 12, such as acetamido, benzamido, tetradecaneamido, pivaloylamido, or cyclohexaneamido), a ureido group (preferably ureido group having 1 to 32 carbon atoms, more preferably 1 to 12, such as ureido, N,N-dimethylureido, or N-phenylureido), an imido group (preferably imido group having 20 or less carbon atoms, more preferably 12 or less, such as N-succinimido or N-phthalimido), an alkoxycarbonylamino group (preferably alkoxycarbonylamino group having 2 to 48 carbon atoms, more preferably 2 to 12, such as methoxycarbonylamino, ethoxycarbonylamino, t-butoxycarbonylamino, octadecyloxycarbonylamino, or cyclohexyloxycarbonylamino), an aryloxycarbonylamino group (preferably aryloxycarbonylamino group having 7 to 32 carbon atoms, more preferably 7 to 12, such as phenoxycarbonylamino), an alkyl or arylsulfonylamino group (preferably sulfonamino group having 1 to 48 carbon atoms, more preferably 1 to 12, such as methanesulfonamino, butanesulfonamino, benzenesulfonamino, hexadecanesulfonamino, or cyclohexane sulfonamino), a sulfamoylamino group (preferably sulfamoylamino group having 1 to 48 carbon atoms, more preferably 1 to 12, such as N,N-dipropylsulfamoylamino or N-ethyl-N-dodecylsulfamoylamino), an azo group (preferably azo group having 1 to 48 carbon atoms, more preferably 1 to 24, such as phenylazo or 3-pyrazolyl azo), an alkylthio group (preferably alkylthio group having 1 to 48 carbon atoms, more preferably 1 to 12, such as methylthio, ethylthio, octylthio, or cyclohexylthio), an arylthio group (preferably arylthio group having 6 to 48 carbon atoms, more preferably 6 to 12, such as phenylthio), a heterocyclic thio group (preferably heterocyclic thio group having 1 to 32 carbon atoms, more preferably 1 to 12, such as 2-benzothiazolylthio, 2-pyridylthio, or 1-phenyltetrazolylthio), an alkylsulfinyl group (preferably alkylsulfinyl group having 1 to 32 carbon atoms, more preferably 1 to 12, such as dodecanesulfinyl), an arylsulfinyl group (preferably arylsulfinyl group having 6 to 32 carbon atoms, more preferably 6 to 12, such as phenylsulfinyl), an alkylsulfonyl group (preferably alkylsulfonyl group having 1 to 48 carbon atoms, more preferably 1 to 12, such as methylsulfonyl, ethylsulfonyl, propylsulfonyl, butylsulfonyl, isopropylsulfonyl, 2-ethylhexylsulfonyl, hexadecylsulfonyl, octylsulfonyl, or cyclohexylsulfonyl), an arylsulfonyl group (preferably arylsulfonyl group having 6 to 48 carbon atoms, more preferably 6 to 12, such as phenylsulfonyl or 1-naphthylsulfonyl), a sulfamoyl group (preferably sulfamoyl group having 32 or fewer carbon atoms, more preferably 16 or fewer, such as sulfamoyl, N,N-dipropylsulfamoyl, N-ethyl-N-dodecylsulfamoyl, N-ethyl-N-phenylsulfamoyl, or N-cyclohexylsulfamoyl), a sulfo group, a phosphonyl group (preferably phosphonyl group having 1 to 32 carbon atoms, more preferably 1 to 12, such as phenoxyphosphonyl, octyloxyphosphonyl, or phenylphosphonyl), a phosphinoylamino group (preferably phosphinoylamino group having 1 to 32 carbon atoms, more preferably 1 to 12, such as diethoxyphosphinoylamino or dioctylphosphinoylamino), or the like.

When the group $R^{11}$ is substituted, $R^{11}$ may be substituted additionally by a substituent group represented by $R^{11}$ above, and, when it has two or more substituent groups, the multiple substituent groups may be the same as or different from each other.

In Formula (I) above, $R^2$, $R^{13}$, $R^{14}$ and $R^{15}$ each independently represent a hydrogen atom or a substituent group. The substituent groups represented by $R^{12}$ to $R^{15}$ are the same as the substituent group represented by $R^{11}$ above, and the exemplary embodiments are also the same. When each group $R^{12}$ to $R^{15}$ is substituted, the substituent group represented by $R^{12}$ to $R^{15}$ may be substituted with a group represented by $R^{11}$ above, and, when it has two or more substituent groups, the multiple group may be the same as or different from each other.

In Formula (I) above, $R^{16}$ and $R^{17}$ each independently represent an alkyl, alkenyl, aryl or heterocyclic group. The alkyl, alkenyl, aryl, and heterocyclic group represented by the substituent group represented by $R^{16}$ or $R^{17}$ are the same as the alkyl, alkenyl, aryl, heterocyclic group represented by $R^{11}$ above, and the exemplary embodiments thereof are also the same.

When $R^{16}$ or $R^{17}$ is substituted, the substituent group represented by $R^{16}$ or $R^{17}$ may be substituted additionally with a group represented by $R^{11}$ above, and $R^{16}$ or $R^{17}$ in Formula (I) above is substituted additionally, it may be substituted with a substituent group described for $R^{11}$ above, and, if it has two or more substituent groups, the multiple substituent groups may be the same as or different from each other.

$R^{12}$ and $R^{13}$, $R^{13}$ and $R^{16}$, $R^{14}$ and $R^{15}$, $R^{15}$ and $R^{17}$, and $R^{16}$ and $R^{17}$ each may independently bind to each other, forming a five-, six-, or seven-membered ring. The five-, six-, or seven-membered ring is favorably a cyclopentene, cyclohexene, cycloheptene, dihydropyrrole, or tetrahydropyridine ring or the like, and the ring may be substituted with a substituent group represented by $R^{11}$ above. When it is substituted with two or more substituent groups, the multiple substituent groups may be the same as or different from each other.

In Formula (I) above, Za and Zb each independently represent —N= or —C($R^{18}$)=; and $R^{18}$ represents a hydrogen atom or an alkyl, aryl, or heterocyclic group.

The alkyl, aryl, or heterocyclic group represented by the substituent group $R^{18}$ is the same as the alkyl, aryl, or heterocyclic group represented by $R^{18}$ above, and the exemplary embodiments thereof are also the same.

When the group represented by $R^{18}$ is substituted, the group represented by $R^{18}$ may be substituted with a substituent group represented by $R^{11}$ above, and, if it is substituted with two or more groups, the multiple groups may be the same as or different from each other.

When each of Za and Zb is —C($R^{18}$)=, the two groups $R^{18}$ may be the same as or different from each other.

Among the azomethine dyes represented by Formula (I), azomethine dyes represented by the following Formula (II) are preferable.

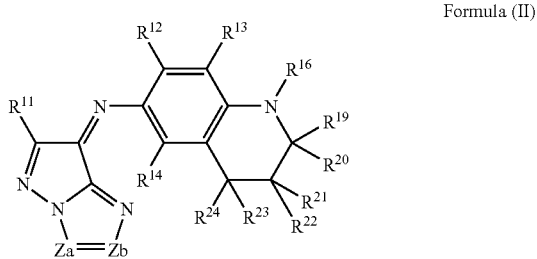

Formula (II)

In Formula (II) above, $R^{19}$ to $R^{24}$ each independently represent a hydrogen atom or a substituent group. Also in Formula (II), $R^{11}$ to $R^{14}$ and $R^{16}$ are the same as $R^{11}$ to $R^{14}$ and $R^{16}$ in Formula (I) above, and exemplary embodiments thereof are also the same respectively. Za and Zb in Formula (I) are also the same as Za and Zb in the Formula (I), and the exemplary embodiments are also the same.

The substituent groups represented by $R^{19}$ to $R^{24}$ are the same as the substituent group represented by $R^{11}$ in Formula (I) above, and the exemplary embodiments are also the same. When the substituent group represented by $R^{19}$ to $R^{24}$ is a group that may be substituted additionally, the group of $R^{19}$ to $R^{24}$ may be substituted with a substituent group described for $R^{11}$ above, and if it is substituted with two or more substituent groups, the multiple substituent groups may be the same as or different form each other.

$R^{12}$ and $R^{13}$, $R^{13}$ and $R^{16}$, $R^{16}$ and $R^{19}$, and $R^{14}$ and $R^{24}$ each may independently bind to each other, forming a five-, six-, or seven-membered ring. The five-, six- or seven-membered ring is preferably, for example, a cyclopentene, cyclohexane, cyclohexene, cycloheptene, dihydropyrrole, or tetrahydropyridine ring.

Among the azomethine dyes represented by Formula (II), more preferably are the azomethine dye represented by the following Formula (III).

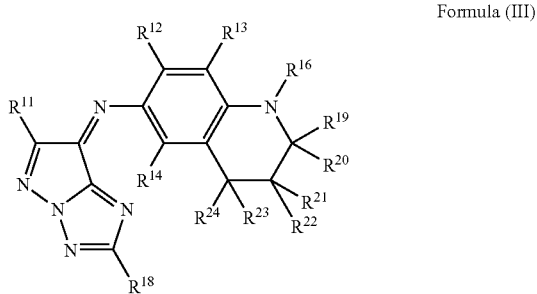

Formula (III)

In Formula (III) above, $R^{18}$ represents a hydrogen atom or an alkyl, aryl or heterocyclic group. Also in Formula (III) above, $R^{11}$ to $R^{14}$ and $R^{16}$ and $R^{19}$ to $R^{24}$ are the same as $R^{11}$ to $R^{14}$ and $R^{16}$ and $R^{19}$ to $R^{24}$ in Formula (I) or (II) above respectively, and the exemplary embodiments thereof are also the same.

The alkyl, aryl, and heterocyclic groups represented by $R^{18}$ above are the same as the alkyl, aryl, and heterocyclic groups for the substituent group represented by $R^{11}$ in Formula (I) above, and the exemplary embodiments thereof are also the same.

Each group represented by $R^{18}$ may be substituted with a substituent group represented by $R^{11}$ in Formula (I), and, when it is substituted with two or more substituent groups, the multiple substituent groups may be the same as or different from each other.

$R^{11}$ in the azomethine dye represented by Formula (III) preferably represents an alkyl, alkenyl, aryl, heterocyclic, hydroxyl, cyano, alkoxy, aryloxy, heterocyclic oxy, carbamoyloxy, acyl, alkoxycarbonyl, aryloxycarbonyl, carbamoyl, imide, azo, alkylthio, arylthio, heterocyclic thio, alkylsulfinyl, arylsulfinyl, alkylsulfonyl, arylsulfonyl, sulfamoyl, sulfo, phosphonyl, or, phosphinoyl amino group;

$R^{12}$, $R^{13}$, and $R^{14}$ each independently represent a hydrogen or halogen atom or an alkyl, alkenyl, aryl, heterocyclic, alkoxy, aryloxy, alkoxycarbonyl, carbamoyl, amino, anilino, acylamino, ureido, alkoxycarbonylamino, alkylsulfonylamino, arylsulfonylamino, sulfamoylamino, alkyl azo, aryl azo, alkylthio, arylthio, heterocyclic thio, alkylsulfinyl, arylsulfinyl, alkylsulfonyl, arylsulfonyl, sulfamoyl, sulfo, phosphonyl, or phosphinoylamino group; $R^{16}$ preferably represents an alkyl, alkenyl, aryl or heterocyclic group; and $R^{18}$ represents a hydrogen atom or an alkyl, aryl or heterocyclic group; and $R^{19}$ to $R^{24}$ each independently represent a hydrogen or halogen atom or an alkyl or alkoxy group.

More preferably in the azomethine dye represented by Formula (III), $R^{11}$ represents an alkyl, alkenyl, aryl, heterocyclic, alkoxycarbonyl, carbamoyl, imide, alkylthio, arylthio, heterocyclic thio, alkylsulfonyl, or arylsulfonyl group;

$R^{12}$, $R^{13}$, and $R^{14}$ each independently represent a hydrogen or halogen atom or an alkyl, alkoxy, aryloxy, alkoxycarbonyl, carbamoyl, acylamino, ureido, alkoxycarbonylamino, alkylsulfonylamino, arylsulfonylamino, alkylthio, or arylthio group;

$R^{16}$ represents an alkyl, alkenyl, aryl or heterocyclic group; $R^{18}$ represents a hydrogen atom or an alkyl, alkenyl, aryl or heterocyclic group; and $R^{19}$ to $R^{24}$ each independently represent a hydrogen atom or an alkyl group.

Still more preferably in the azomethine dye represented by Formula (III), $R^{11}$ represents an alkyl, aryl, heterocyclic, alkoxycarbonyl, carbamoyl, alkylthio, arylthio, alkylsulfonyl, or arylsulfonyl group; $R^{12}$, $R^{13}$, and $R^{14}$ each independently represent a hydrogen or halogen atom or an alkyl, alkoxy, aryloxy, alkoxycarbonyl, carbamoyl, acylamino, ureido, alkoxycarbonylamino, alkylsulfonylamino, arylsulfonylamino, alkylthio, or arylthio group; $R^{16}$ represents an alkyl or aryl group; $R^{18}$ represents a hydrogen atom or an alkyl, alkenyl, aryl or heterocyclic group; and $R^{19}$ to $R^{24}$ each independently represents a hydrogen atom or an alkyl group.

Particularly preferably in the azomethine dye represented by Formula (III), $R^{11}$ represents an alkyl group; $R^2$, $R^3$ and $R^4$ each independently represent a hydrogen or halogen atom or an alkyl or alkoxy group; $R^{16}$ represents an alkyl group; $R^{18}$ represents an alkyl, aryl or heterocyclic group; and $R^{19}$ to $R^{24}$ each independently represent a hydrogen atom or an alkyl group.

Most preferably in the azomethine dye represented by Formula (III), $R^{11}$ represents a tertiary alkyl group (preferably tertiary alkyl group having 4 to 16 carbon atoms, more preferably 4 to 8, such as t-butyl, t-amyl, t-octyl, or 1-adamantyl);

$R^{12}$, $R^{13}$ and $R^{14}$ each independently represent a hydrogen atom, a halogen atom (such as fluorine, chlorine, bromine, or iodine, preferably fluorine or chlorine), an alkyl group (preferably alkyl group having 1 to 12 carbon atoms, more preferably 1 to 8, such as methyl, ethyl, propyl, isopropyl, t-butyl, cyclohexyl, 2-ethylhexyl), an alkoxy group (preferably alkoxy group having 1 to 12 carbon atoms, more preferably 1 to 8, such as methoxy, ethoxy, isopropyloxy, octyloxy, or 2-ethylhexyloxy), an acylamino group (preferably acylamino group having 2 to 14 carbon atoms, more preferably 2 to 10, such as acetylamino, propionylamino, butyloylamino or haxanoylamino), or an alkoxycarbonylamino group (preferably alkoxycarbonylamino group having 2 to 14 carbon atoms, more preferably 2 to 10, such as methoxycarbonylamino, ethoxycarbonylamino, propyloxycarbonylamino, or hexyloxycarbonylamino);

$R^{16}$ represents an alkyl group (preferably alkyl group having 1 to 18 carbon atoms, more preferably 1 to 12, such as methyl, ethyl, isopropyl, t-butyl, 2-ethylhexyl, 2-hydroxyethyl, 3-hydroxypropyl, ethoxycarbonylmethyl, 3-carboxypropyl, 2-ethoxyethyl, 2-(methylsulfonylamino)ethyl, 2-(4-methoxyphenyloxy)ethyl, 2-(4-dioxo thiomorpholino phenyloxy)ethyl, 2-methylsulfonylethyl, 2-ethylsulfanylethyl, 2-butylsulfanylethyl, methoxyethoxyethyl, or 3-sulfopropyl);

$R^{18}$ represents an alkyl group (preferably alkyl group having 1 to 24 carbon atoms, more preferably 1 to 18, such as methyl, ethyl, isopropyl, t-butyl, 2-ethylhexyl, dodecyl, or hexadecyl), an aryl group (preferably aryl group having 6 to 24 carbon atoms, more preferably 6 to 12, such as phenyl or naphthyl), or a heterocyclic group (preferably heterocyclic group having 1 to 12 carbon atoms, more preferably 2 to 12, such as 2-thienyl, 4-pyridyl, 2-pyridyl, 2-imidazolyl, or 3-pyrazolyl);

$R^{19}$ and $R^{20}$ each independently represent an alkyl group (preferably alkyl group having 1 to 8 carbon atoms, more preferably 1 to 4, such as methyl, ethyl, or propyl (most preferably methyl)); $R^{21}$ to $R^{23}$ are hydrogen atoms; and $R^{24}$ represents an alkyl group (preferably alkyl group having 1 to 8 carbon atoms, more preferably 1 to 4, such as methyl, ethyl or propyl (most preferably, methyl)).

Typical examples of the azomethine dyes represented by Formula (I) will be shown below as exemplary compounds M-1 to M-84. However, the invention is not limited thereby.

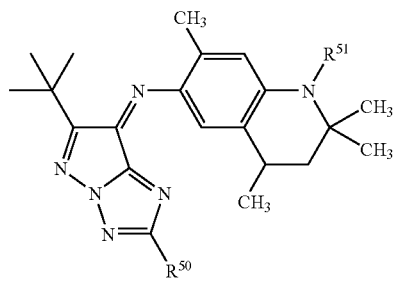

| Exemplary compound number | $R^{50}$ | $R^{51}$ |
|---|---|---|
| M-1 | —CHCH₂NHCOCHO—⟨C₆H₄⟩—OCH₃ (with C₂H₅ and CH₃ substituents) | —CH₂CH₂CH₂CH |
| M-2 | —CHCH₂NHCOCHO—⟨C₆H₄⟩—OCH₃ (with C₂H₅ and CH₃ substituents) | —CH₂CH₂OH |
| M-3 | —CHCH₂NHCOCHO—⟨C₆H₄⟩—OCH₃ (with C₂H₅ and CH₃ substituents) | —CH₂COOC₂H₅ |
| M-4 | —CHCH₂NHCOCHO—⟨C₆H₄⟩—OCH₃ (with C₂H₅ and CH₃ substituents) | —CH₂CH₂CH₂COOH |
| M-5 | —CHCH₂NHCOCHO—⟨C₆H₄⟩—OCH₃ (with C₂H₅ and CH₃ substituents) | —C₃H₇(iso) |

-continued

| | | |
|---|---|---|
| M-6 | ![structure with -CHCH₂NHCOCHO-phenyl(C₄H₉(t), OH), CH₃, C₂H₅] | —CH₂CH(C₂H₅)C₄H₉ |
| M-7 | ![structure -CHCH₂NH—COCHC₄H₉, CH₃, C₂H₅] | —CH₂CH₂NHSO₂CH₃ |
| M-8 | ![structure -CHCH₂NH—CO-phenyl-OCH₃, CH₃] | —CH₂CH₂CH₂COOH |
| M-9 | ![structure -CHCH₂NHCOCHO-phenyl-OCH₃, CH₃, C₆H₁₃] | —CH₂CH₂CH₂OH |
| M-10 | ![structure -CHCH₂NH—CO-phenyl-OH, CH₃] | —CH₂CH₂CH₂OH |
| M-11 | ![structure -CHCH₂NH—CO-pyridyl, CH₃] | —CH₂CH₂CH₂OH |
| M-12 | ![3-methylpyridine structure] | —CH₂CH₂CH₂OH |
| M-13 | ![structure -CHCH₂NHCOCHO-phenyl-OCH₃, CH₃, C₂H₅] | —CH₂CH₂O-phenyl-N(thiomorpholine-SO₂) |
| M-14 | ![structure -CHCH₂NHCOCHO-phenyl-N(thiomorpholine-SO₂), CH₃, C₂H₅] | —CH₂CH₂CH₂O-phenyl-OCH₃ |
| M-15 | —CHCH₂NHCOCH₂OCH₂COOH, CH₃ | —CH₂CH(C₂H₅)C₄H₉ |
| M-16 | ![structure -CHCH₂-N(3-methylsuccinimide), CH₃] | —CH₂CH(C₂H₅)C₄H₉ |
| M-17 | ![structure -CHCH₂NH—CO-pyridyl-COOH, CH₃] | —C₈H₁₇ |

-continued

| | | |
|---|---|---|
| M-18 | —CHCH₂NH·CO—CHNHSO₂C₄H₉ with CH₃ groups | —C₈H₁₇ |
| M-19 | —CCH₂NHCO—(phenyl)-NHSO₂CH₃ with (CH₃)₂ | —CH₂CH₂CH₂OH |
| M-20 | —CHCH₂NHSO₂C₄H₉ with CH₃ | —CH₂CH₂CH₂OH |
| M-21 | —(phenyl)-NHCO—CH₂O—(phenyl)-N(thiomorpholine-SO₂) | —(CH₂)₃COOH |
| M-22 | —(phenyl)-N(thiomorpholine-SO₂) | —(CH₂)₃COOH |
| M-23 | —CHCH₂NHSO₂CH₃ with CH₃ | —CH₂CH₂CH₂O—(phenyl)—OCH₃ |
| M-24 | —CHCH₂NHSO₂—(phenyl) with CH₃ | —CH₂CH₂CH₂O—(phenyl)—OCH₃ |
| M-25 | —CHCH₂NHSO₂—(phenyl)—CH₃ with CH₃ | —(CH₂)₃COOH |
| M-26 | —CHCH₂NHSO₂—(phenyl)—C₄H₉(iso) with CH₃ | —(CH₂)₃COOH |
| M-27 | —CHCH₂NHSO₂—(phenyl with COOH) with CH₃ | —(CH₂)₂OC₂H₅ |
| M-28 | —(phenyl)—NHSO₂CH₃ | —(CH₂)₂SO₂CH₃ |
| M-29 | —(phenyl)—NHSO₂CH₃ | —(CH₂)₂SO₂CH₃ |
| M-30 | —(phenyl with NHSO₂CH₃) | —(CH₂)₂SC₂H₅ |

-continued
| | | |
|---|---|---|
| M-31 | 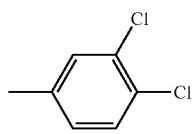 | —(CH$_2$)$_2$SC$_2$H$_5$ |
| M-32 | 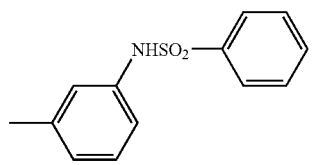 | —CH$_2$CH$_2$OH |
| M-33 | 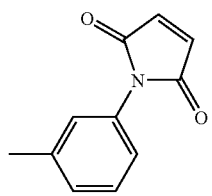 | —CH$_2$CH$_2$OH |
| M-34 | 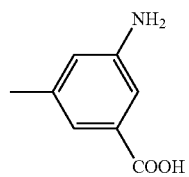 | —CH$_2$CH(C$_2$H$_5$)C$_4$H$_9$ |
| M-35 | 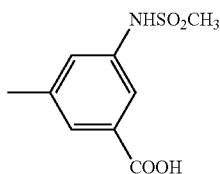 | 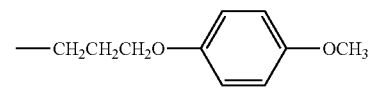 |
| M-36 | 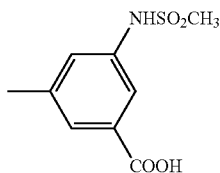 | 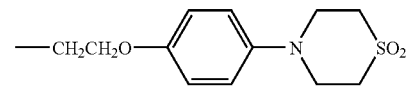 |
| M-37 | 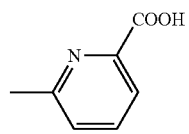 | 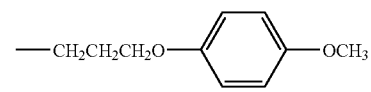 |
| M-38 |  —CF$_3$ | 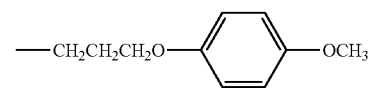 |
| M-39 |  —C$_7$F$_{15}$ | 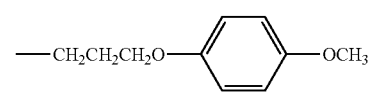 |
| M-40 | 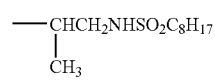 | —CH$_2$CH$_2$SO$_2$CH$_3$ |
| M-41 | 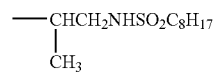 | —CH$_2$CH$_2$SC$_4$H$_9$ |

-continued
| M-42 | —CHCH₂NHSO₂C₈H₁₇<br>  |<br>  CH₃ | —CH₂CH₂OCH₂CH₂OCH₃ |
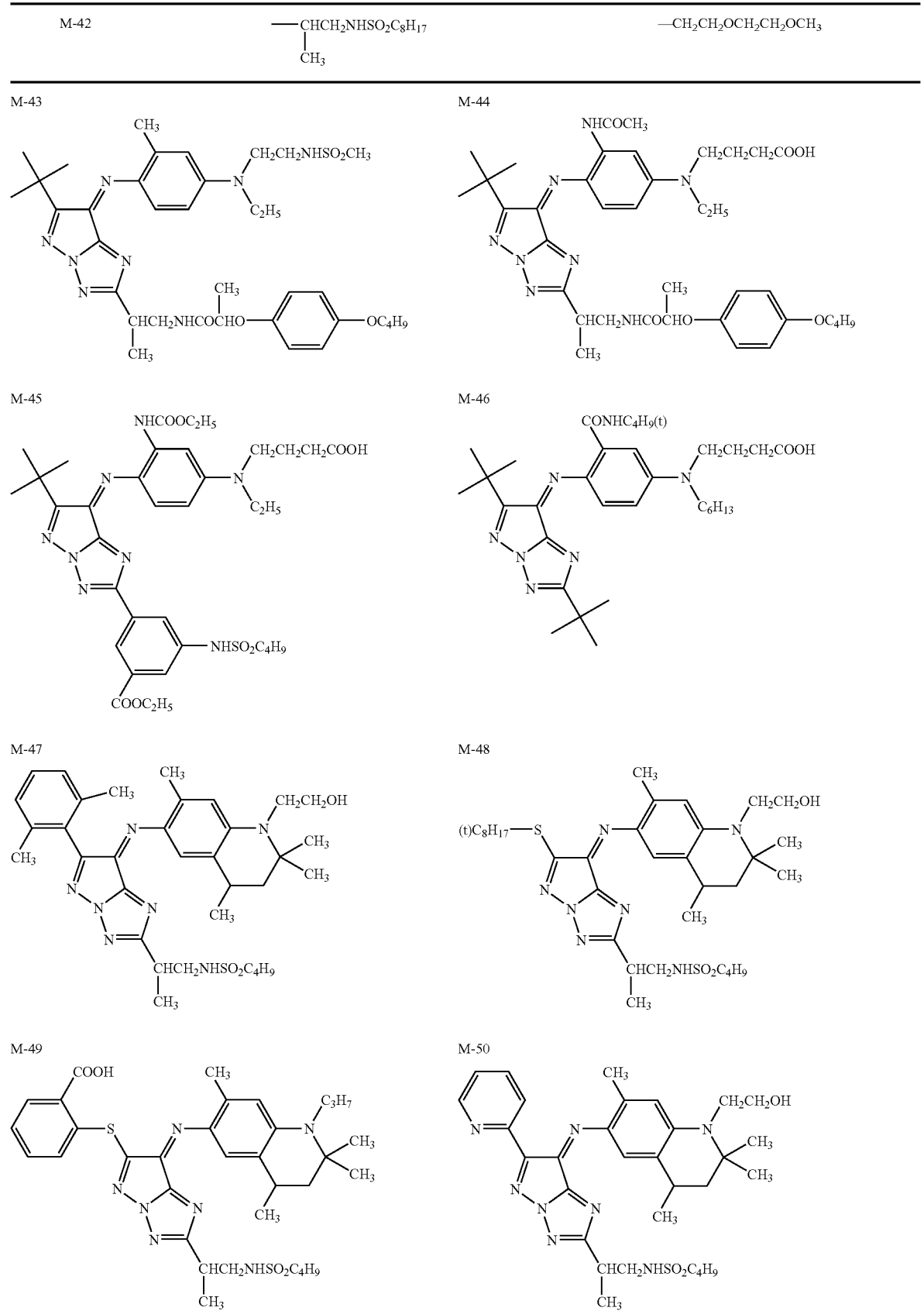

-continued
M-51
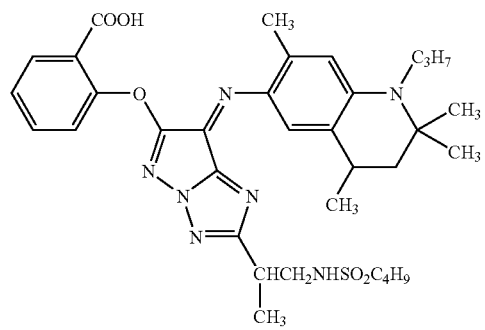
M-52
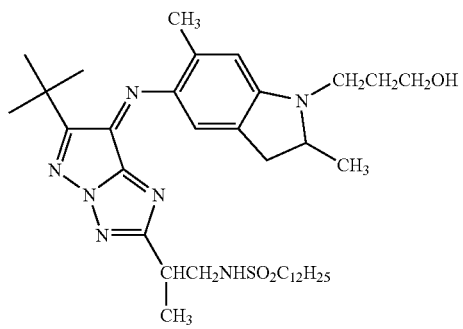
M-53
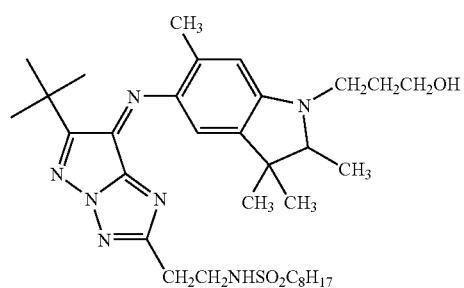
M-54
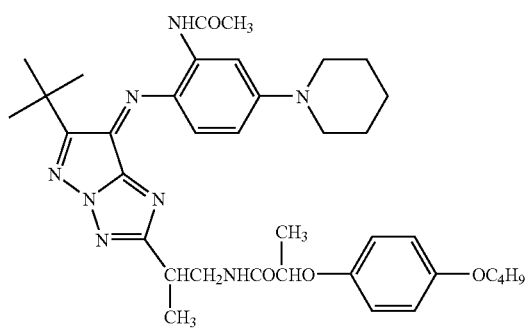
M-55
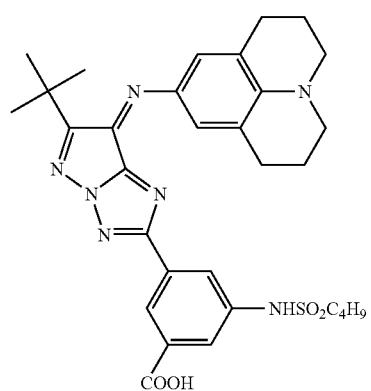
M-56
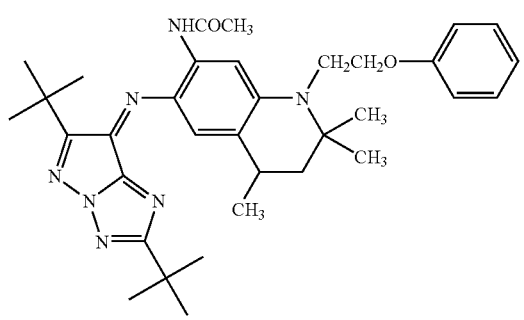
M-57
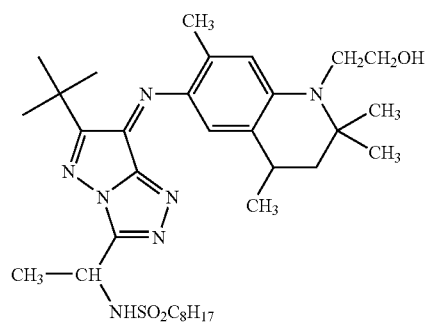
M-58
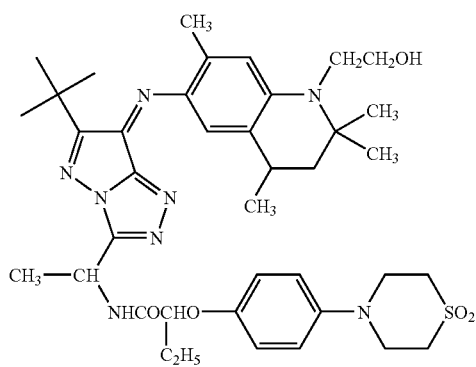

-continued
M-59
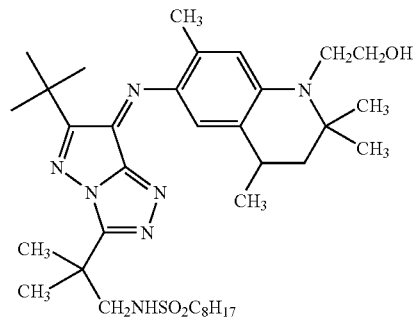
M-60
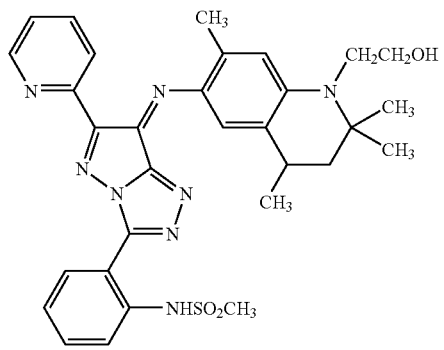
M-61
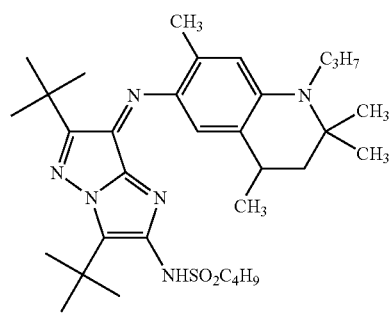
M-62
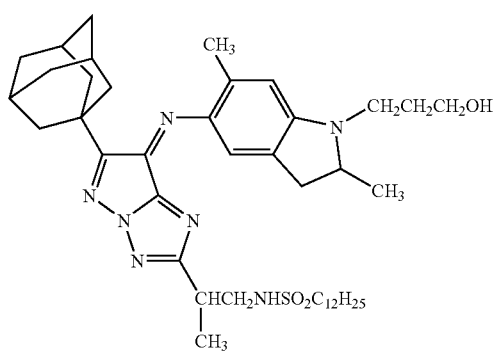
M-63
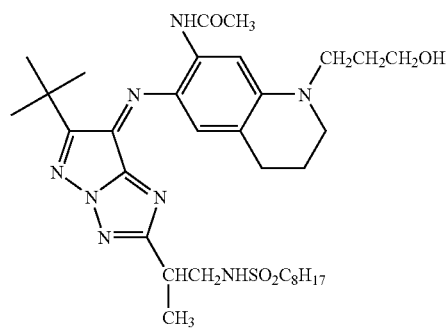
M-64
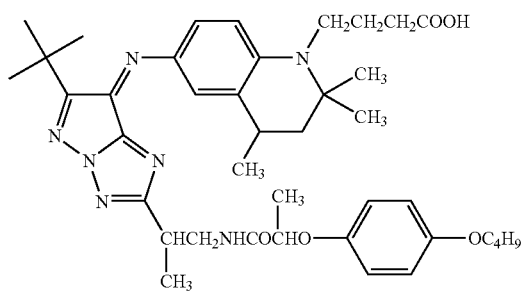
M-65
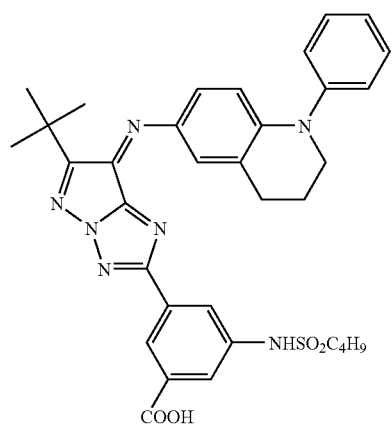
M-66
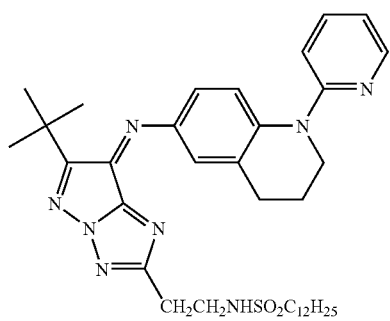

M-67
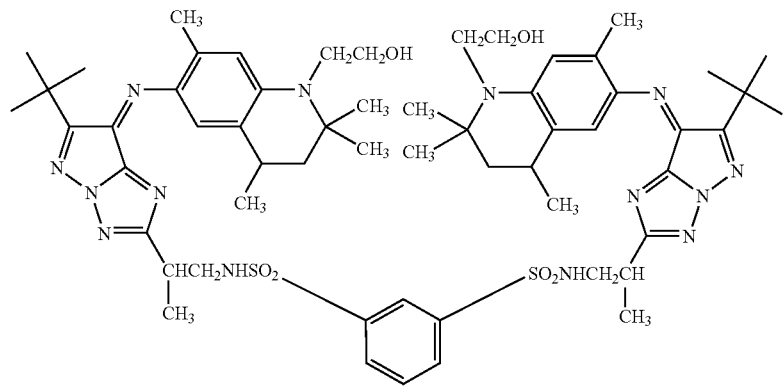
M-68
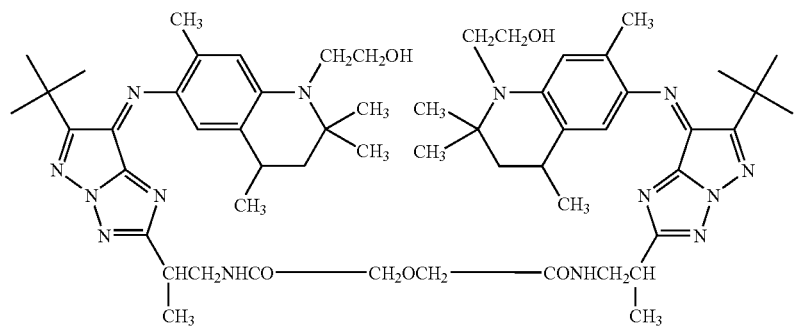
M-69
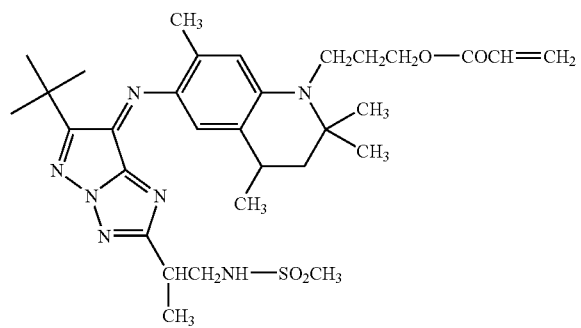
M-70
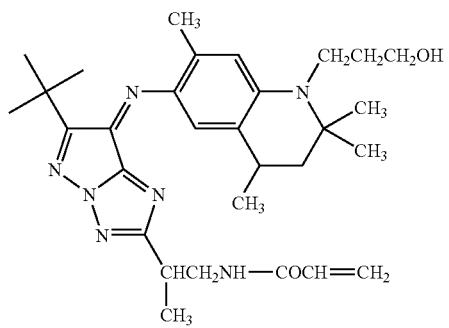
M-71
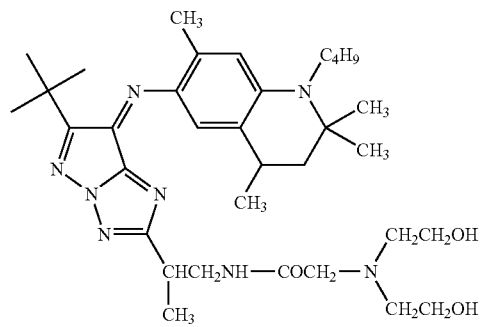
M-72
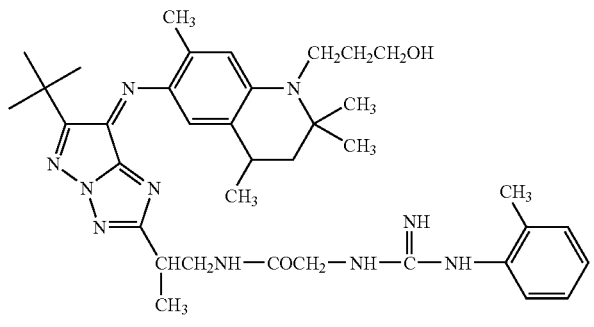

M-73 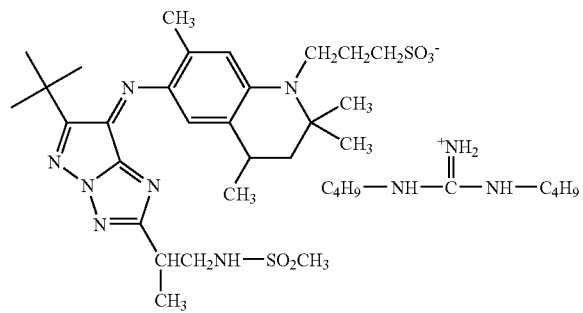
M-74 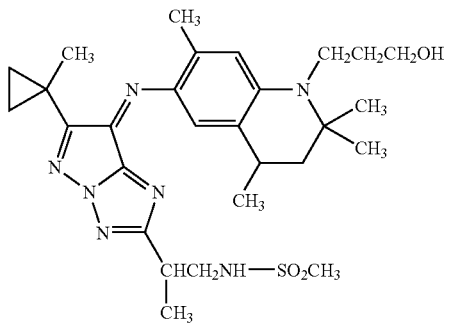
M-75 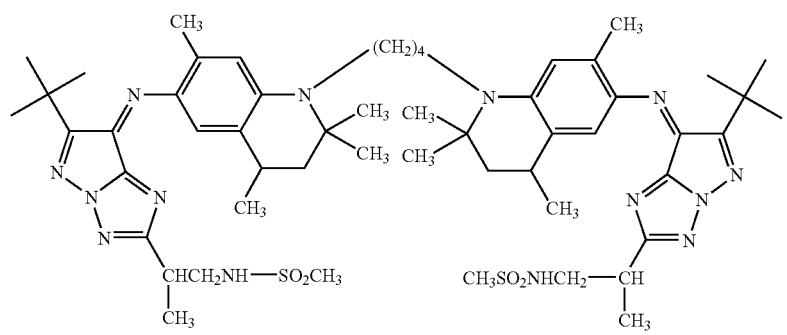
M-76 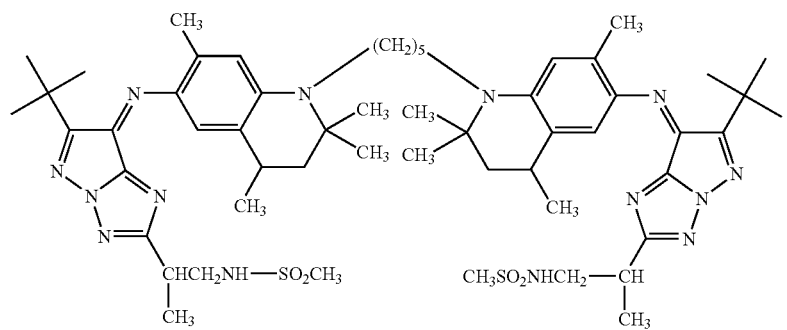
M-77 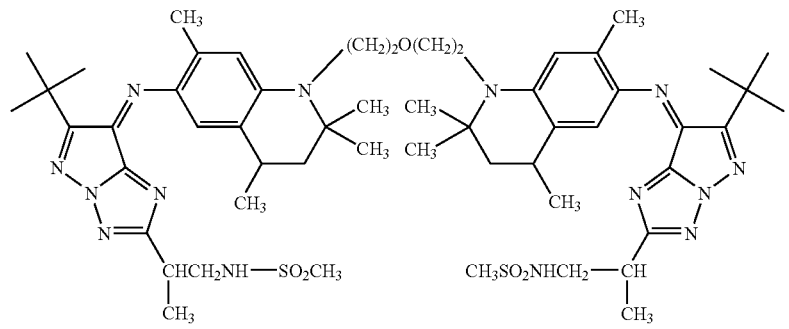

-continued
M-78
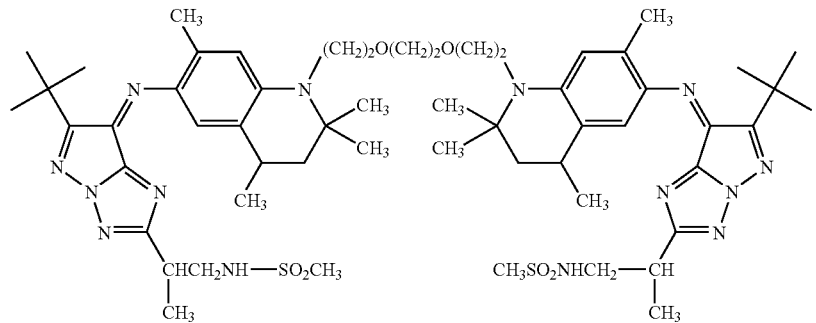
M-79
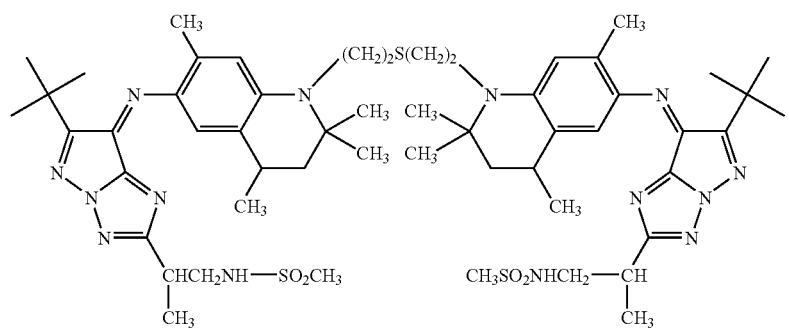
M-80
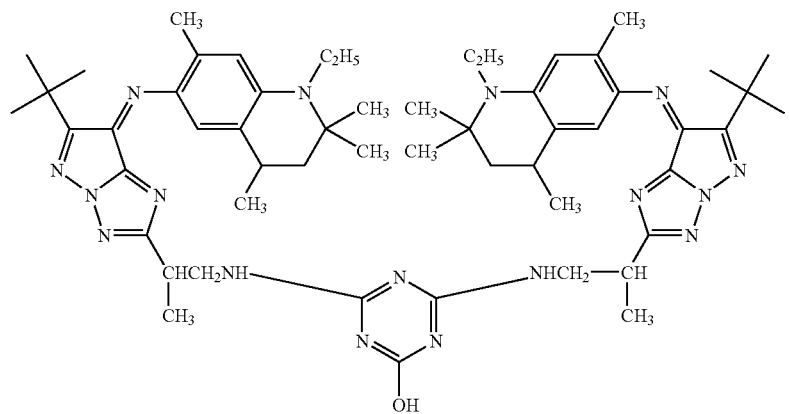

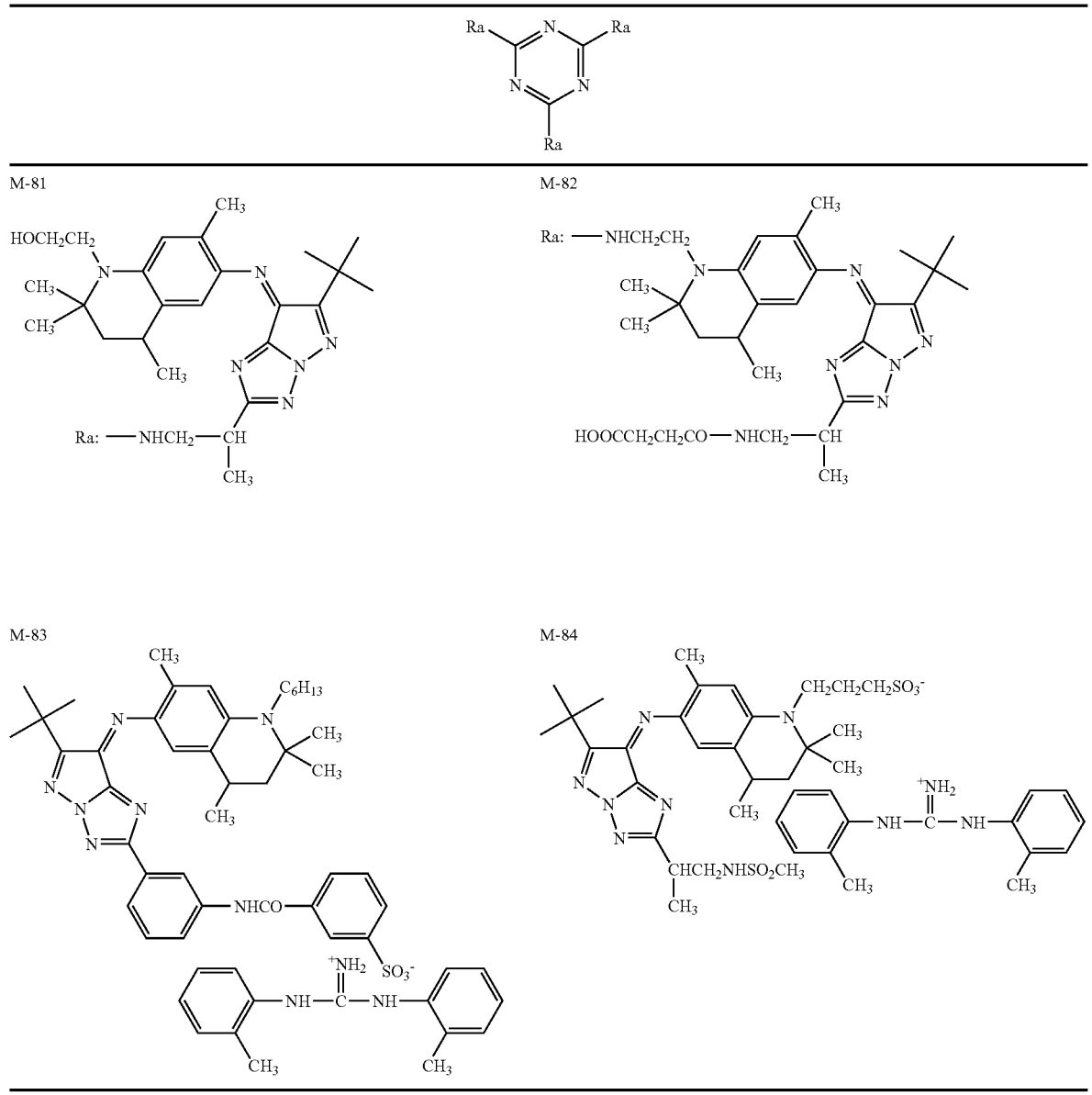
PREPARATIVE EXAMPLE
Hereinafter, methods of preparing the azomethine dye represented by Formula (I) will be described along the following reaction scheme A or B, by taking the dye M-1, an exemplary compound, as an example.
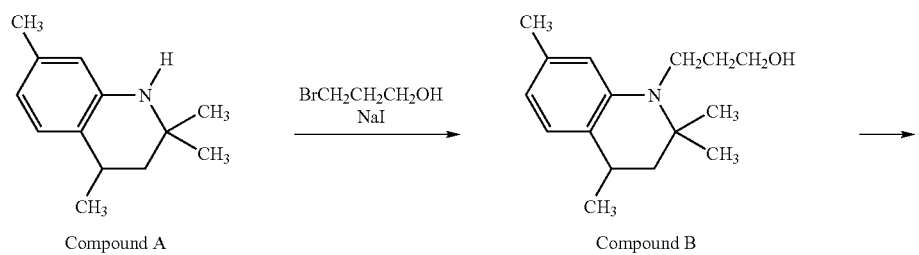

-continued

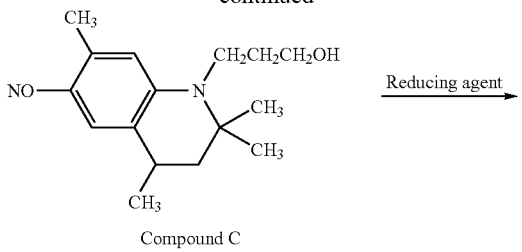

Compound C

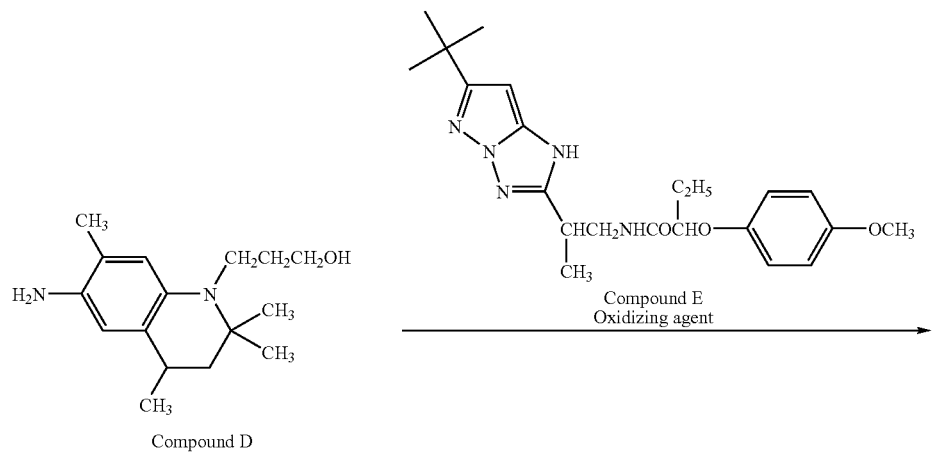

Compound D

Compound E
Oxidizing agent

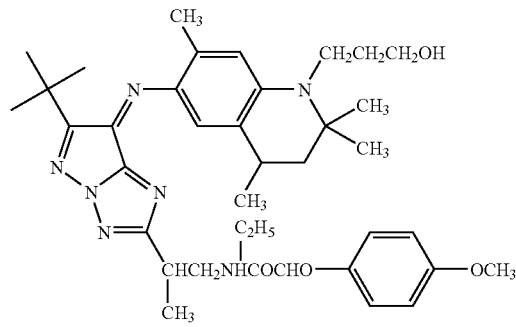

Exemplary Compound M-1

(1) Preparation of Compound B

First as shown in reaction scheme A above, 94.7 g (0.5 mole) of compound A (manufactured by Sigma Aldrich), 37.5 g (0.25 mole) of sodium iodide, and 126 g (1.5 mole) of sodium bicarbonate were added to 300 ml of dimethylimidazolidinone, and the mixture was stirred while heated to 95° C. 90.3 g (0.65 mole) of 3-bromopropanol was added dropwise to the solution. After dropwise addition, the mixture was stirred while heated at 95° C. to 100° C. for 5 hours, to complete the reaction. After reaction, the reaction solution was allowed to cool to room temperature and extracted with added 600 ml of water and 500 ml of ethyl acetate. The ethyl acetate solution was washed with water and dried over anhydrous magnesium sulfate. The ethyl acetate solution was concentrated under reduced pressure and purified by silica gel column chromatography (eluant: n-hexane/ethyl acetate: 10/1), to give 90.5 g of a compound B (yield: 73.2%).

(2) Preparation of Compound C 90 g (0.364 mole) of the compound B thus obtained was added to and stirred in 270 ml of methanol while the mixture was cooled to 5° C. 93.7 ml (1.09 mole) of concentrated hydrochloric acid was added dropwise to the solution. A solution of 27.6 g (0.4 mole) of sodium nitrite dissolved in 75 ml of water was added dropwise thereto, while the mixture was kept at 5° C. to 10° C. After dropwise addition, the mixture was stirred at 5° C. to 10° C. additionally for 2 hours, to complete the reaction. After reaction, 500 ml ethyl acetate and 1,000 ml of water were added. The solution was neutralized by addition of 84 g of sodium bicarbonate, and the aqueous layer was removed. The ethyl acetate solution was washed with water and dried over anhydrous magnesium chloride. The ethyl acetate solution was concentrated under reduced pressure, allowing precipitation of crystal. The crystal was added to 200 ml of n-hexane and 200 ml of ethyl acetate for dispersion. The crystal was filtered and dried, to give 78 g of a compound C (yield: 77.6%).

(3) Preparation of Compound E

The compound E was prepared by the method shown by the following scheme B.

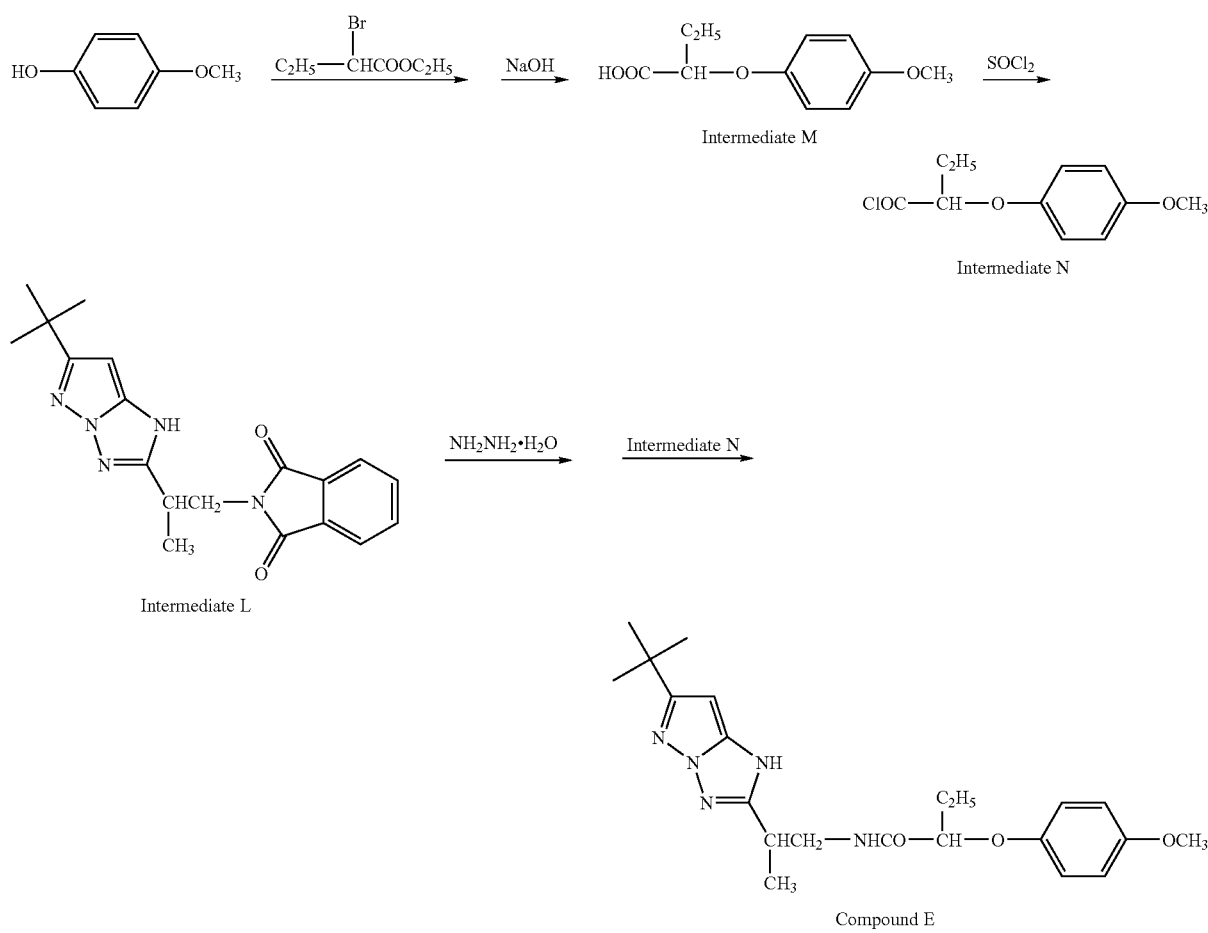

Reaction scheme B

—Preparation of Intermediate M—

112 g (0.9 mole) of 4-methoxyphenol was added to 600 ml of dimethylacetamide, and the mixture was stirred as room temperature. 196 ml of 28% sodium methoxide methanol solution was added to the solution. After addition, 190 g (0.97 mole) of ethyl 2-bromobutanoate ester was added dropwise to the solution. After dropwise addition, the mixture was stirred at room temperature additionally for 3 hours, to complete the reaction. 1,000 ml of water and 1,000 ml of ethyl acetate were added to the reaction solution, and the product was extracted with ethyl acetate. The ethyl acetate solution was washed with brine; ethyl acetate was distilled off under reduced pressure; 250 ml of methanol was added to the residue; and the mixture was stirred at room temperature. An aqueous solution of 144 g sodium hydroxide dissolved in 1,000 ml water was added to the solution. The solution was stirred while heated to 50° C. to 55° C. for 2 hours. After reaction, the reaction solution was made acidic by dropwise addition of 340 ml of conc. hydrochloric acid. The product was then extracted with 1,000 ml of added ethyl acetate. The ethyl acetate solution was washed with brine and dried over anhydrous sodium sulfate. The ethyl acetate solution was concentrated under reduced pressure, to give quantitative amounts of an intermediate M.

—Preparation of Intermediate N—

93.1 g (0.433 mole) of the intermediate M thus obtained was added to 400 ml of toluene, and the mixture was stirred while heated to 85° C. to 90° C. 50 ml of thionyl chloride was added to the solution dropwise, and the mixture was stirred under heat for 3 hours. After reaction, toluene and excessive thionyl chloride was removed by distillation under reduced pressure. The concentrate was then cooled to room temperature and mixed with 100 ml of ethyl acetate, to give an ethyl acetate solution of the intermediate N. The solution was used in the next step as it was.

—Preparation of Compound E—

An intermediate L was prepared similarly the method described in JP-A No. 2-201,443, except that the raw material 5-amino-3-methylpyrazole was replaced with 5-amino-3-tert-butyl pyrazole (prepared by the method described in Japanese Patent No. 2,670,943).

189 g (0.538 mole) of the intermediate L was added to and stirred in 570 ml of 2-propanol. 33.6 g (0.673 mole) of hydrazine monohydrate was added to the solution dropwise, and the mixture was stirred under heat for 2 hours. After reaction, approximately 400 ml of 2-propanol was distilled off under reduced pressure. 420 g of sodium bicarbonate, 1,500 ml of water, and 1,200 ml of ethyl acetate were added to the residue, and the mixture was stirred at room temperature.

The ethyl acetate solution of intermediate N obtained by the method above was added dropwise to the solution. After dropwise addition, the mixture was stirred at room temperature for 2 hours, and then, the aqueous layer removed. Water washing of the ethyl acetate solution lead to precipitation of crystal. 1,200 ml of n-hexane was added to the dispersion; the mixture was stirred additionally for one hour; and the crystal was filtered, washed with water, and dried, to give 159 g of a compound E (yield: 86.9%).

(4) Preparation of Exemplary Compound M-1

Then in the manner shown in scheme A, 50 ml of methanol, 100 ml of ethyl acetate and 100 ml of water were added to 7.35 g (0.0266 mole) of the compound C, and the mixture was stirred while heated to 40° C. 25 g of sodium hydrosulfite was added to the solution gradually. After addition, the mixture was allowed to react at 40° C. for one hour. After reaction, the mixture was cooled to room temperature; 100 ml of ethyl acetate and 200 m of water were added; the aqueous layer was removed, to give an ethyl acetate phase containing a compound D; and the ethyl acetate solution was used as it was.

Subsequently, 10.0 g (0.0242 mole) of the compound E obtained and 21 g of sodium bicarbonate were mixed with 100 ml of methanol and 200 ml of water, and the mixture was stirred as room temperature. All of the ethyl acetate solution above was added to the solution. An aqueous solution of 12 g ammonium persulfate dissolved in 100 ml water was added dropwise to the solution. After dropwise addition, the mixture was allowed to react at room temperature for one hour. After reaction, the aqueous layer was removed, and the ethyl acetate solution was washed with water. The ethyl acetate solution was concentrated under reduced pressure. The residue was purified by silica gel column chromatography (eluant: n-hexane/ethyl acetate: 1/1), to give an amorphous exemplary compound M-1.

The maximum absorption wavelength ($\lambda$max) and the molar extinction coefficient ($\epsilon$) of the dye obtained, as determined as ethyl acetate solution by using a spectrophotometer UV-2400PC (manufactured by Shimadzu Corporation), were respectively 556 nm and 55,000.

Exemplary compounds other than the exemplary compound above M-1 can also be prepared by a method similar to that above. Alternatively, they may be prepared according to the methods described, for example, in JP-A Nos. 2-208094, 3-7386 and 2006-58700.

The colored curable composition according to the invention may contain only a dye represented by Formula (C1) described above or may contain one or more dyes represented by Formula (C1) and one or more dyes represented by any one of Formulae (I) to Formula (III), and as needed a known dye such xanthene-based or triaryl methane-based dye additionally.

In an exemplary embodiment, one or more of the tetraazaporphyrin dyes described above represented by Formula (C1) and one or more of the azomethine dyes represented by Formula (III) described above are used in combination.

The content of the dyes in the colored curable composition according to the invention may vary according to their molecular weights and molar extinction coefficients, but is preferably 0.5 to 80 mass %, more preferably 0.5 to 70 mass %, and particularly preferably 0.5 to 60 mass %, with respect to the total solid matter in the composition.

The content ratio of the tetraazaporphyrin dyes represented by Formula (C1) and the azomethine dyes represented by Formulae (I) to Formula (III) [tetraazaporphyrin dyes (including phthalocyanine dyes)/azomethine dyes] may vary according to their molecular weights and molar extinction coefficients, but is preferably 1/9 to 9/1, more preferably 1/4 to 4/1, and particularly preferably 1/4 to 2/1 by mass.

—Binder—

The colored curable composition according to the invention may contain at least one binder. The binder according to the invention is not particularly limited, if it is alkali-soluble, but preferably selected properly from the viewpoints, for example, of heat resistance, developing efficiency, availability.

The alkali-soluble binder is preferably a linear organic high-molecular-weight polymer that is soluble in organic solvent and can be developed with weakly alkaline aqueous solution. Examples of the linear organic high-molecular-weight polymers include polymers having a carboxylic acid group on the side chain such as methacrylate copolymers, acrylate copolymers, itaconate copolymers, crotonate copolymers, maleate copolymers, and partially esterified maleate copolymers, described, for example, in JP-A No. 59-44615, JP-B Nos. 54-34327, 58-12577, and 54-25957, JP-A Nos. 59-53836 and 59-71048, and others, and acidic cellulose derivatives having a carboxylic acid on the side chain are useful. Hydroxyl group-containing polymers treated with an acid anhydride, polyhydroxystyrene resins, polysiloxane resins, poly(2-hydroxyethyl(meth)acrylate), polyvinylpyrrolidone, polyethyleneoxide, polyvinylalcohol, and the like are also useful.

In addition, copolymers of a hydrophilic group-containing monomer are also favorable, and examples thereof include copolymers of an alkoxyalkyl(meth)acrylate, a hydroxyalkyl (meth)acrylate, glycerol(meth)acrylate, (meta)acrylamide, N-methylol acrylamide, a secondary or tertiary alkylacrylamide, a dialkylaminoalkyl(meth)acrylate, morpholino(meth) acrylate, N-vinylpyrrolidone, N-vinylcaprolactam, vinylimidazole, vinyltriazole, methyl(meth)acrylate, ethyl(meth) acrylate, a branched- or straight-chain propyl(meth)acrylate, a branched- or straight-chain butyl(meth)acrylate, phenoxy-hydroxypropyl(meth)acrylate, or the like.

Further, monomers having a hydrophilic group such as tetrahydrofurfuryl, phosphoric acid, phosphoric ester, quaternary ammonium, ethyleneoxy chain, propyleneoxy chain, or sulfonic acid or the salt, or morpholinoethyl are also useful.

The monomer may have a polymerizable group on the side chain for improvement in crosslinking efficiency, and polymers having an allyl, (meth)acryl, or allyloxyalkyl group on the side chain are also useful.

Examples of the polymerizable group-containing polymers include KS resist 106 (manufactured by Osaka Organic Chemical Industry Ltd.), Cyclomer P series products (manufactured by Daicel Chemical Industries, Ltd.) and the like.

Alternatively, alcohol-soluble nylon and polyethers of 2,2-bis(4-hydroxyphenyl)propane and epichlorohydrin are also useful, for improvement of the strength of the hardened film.

Among the various binders above, polyhydroxystyrene resins, polysiloxane resins, acrylic resins, acrylamide resins, and acryl/acrylamide copolymer resins are favorable from the viewpoint of heat resistance. Acrylic resins, acrylamide resins, and acryl/acrylamide copolymer resins are preferable, for controlling printing efficiently. Exemplary embodiments of the acrylic resins include copolymers with a monomer selected from benzyl(meth)acrylate, (meth)acryl, hydroxyethyl(meth)acrylate, (meta)acrylamide and the like, KS Resist 106 (manufactured by Osaka Organic Chemical Industry Ltd.), Cyclomer P series products, and the like.

The binder for use in the invention is, for example, an alkali-soluble phenol resin. The alkali-soluble phenol resin is used favorably when the colored curable composition according to the invention is a positive working composition. Examples of the alkali-soluble phenol resins include novolak resins, vinyl polymers and the like.

Examples of the novolak resins include polymers obtained in condensation reaction between a phenol and an aldehyde in the presence of an acid catalyst. Examples of the phenols include phenol, cresol, ethylphenol, butylphenol, xylenol, phenylphenol, catechol, resorcinol, pyrogallol, naphthol, bisphenol A, and the like. Examples of the aldehydes include formaldehyde, paraformaldehyde, acetaldehyde, propionaldehyde, benzaldehyde, and the like.

The phenols and the aldehydes may be used alone or in combination of two or more respectively.

Typical examples of the novolak resins include condensation polymers of m-cresol, p-cresol or the mixture thereof and formalin.

The molecular weight distribution of the novolak resin may be adjusted, for example, by means of fractionation. In addition, a phenolic hydroxyl group-containing low-molecular-weight component such as bisphenol C or bisphenol A may be added to the novolak resin.

The binder is preferably a polymer having a weight-average molecular weight (as polystyrene, as determined by GPC) of 1,000 to $2 \times 10^5$, more preferably 2,000 to $1 \times 10^5$, and particularly preferably, 5,000 to $5 \times 10^4$.

The content of the binder in the composition according to the present invention is preferably 10 to 90 mass %, more preferably 20 to 80 mass %, and particularly preferably 30 to 70 mass %, with respect to the total solid matters in the composition.

—Crosslinking Agent—

By the invention, it is possible carry out the curing reaction of the film faster than before and to obtain a favorably hardened film by using a dye according to the invention described above, but it is also possible to obtain a more tightly hardened film by using an additional crosslinking agent. Use of it is also favorable for improvement in resolution of the colored curable composition according to the invention.

The crosslinking agent for use in the invention is not particularly limited, if it hardens the film in crosslinking reaction, and examples thereof include (a) epoxy resins, (b) melamine, guanamine, glycoluryl and urea compounds substituted with at least one substituent group selected from methylol, alkoxymethyl and acyloxymethyl group, and (c) phenol, naphthol and hydroxyanthracene compounds substituted with at least one substituent group selected from methylol, alkoxymethyl and acyloxymethyl groups. In particular, multifunctional epoxy resins are preferable.

The epoxy resin (a) is not particularly limited, if it has an epoxy group and is also crosslinkable, and examples thereof include bivalent glycidyl group-containing low-molecular weight compounds such as bisphenol A-glycidyl ether, ethylene glycol diglycidyl ether, ethylene glycol diglycidyl ether, butanediol diglycidyl ether, hexanediol diglycidyl ether, dihydroxybiphenyl diglycidyl ether, diglycidy phthalate ester, and N,N-diglycidylaniline; trivalent glycidyl group-containing low-molecular weight compounds such as trimethylolpropane triglycidyl ether, trimethylol phenol triglycidyl ether, and TrisP-PA triglycidyl ether; quadrivalent glycidyl group-containing low-molecular weight compounds such as pentaerythritol tetraglycidyl ether and tetramethylol bisphenol-A tetraglycidyl ether; polyvalent glycidyl group-containing low-molecular weight compounds such as dipentaerythritol pentaglycidyl ether and dipentaerythritol hexaglycidyl ether; glycidyl group-containing polymer compounds such as polyglycidyl(meth)acrylate and 2,2-bis(hydroxymethyl)-1-butanol 1,2-epoxy-4-(2-oxiranyl)cyclohexane adducts; and the like.

The number of the substituents on the methylol, alkoxymethyl, or acyloxymethyl group contained in the crosslinking agent (b) is 2 to 6 in the case of a melamine compound and 2 to 4 in the case of a glycoluril, guanamine, or urea compound, but preferably 5 to 6 in the case of a melamine compound and 3 to 4 in the case of a glycoluril, guanamine, or urea compound.

Hereinafter, the melamine, guanamine, glycoluril and urea compounds (b) will be called collectively as compounds (b) (methylol group-, alkoxymethyl group-, and acyloxymethyl group-containing compounds).

The methylol group-containing compound (b) is obtained by heating the alkoxymethyl group-containing compound (b) above in alcohol in the presence of an acid catalyst such as hydrochloric acid, sulfuric acid, nitric acid, or methanesulfonic acid. The acyloxymethyl group-containing compound (b) is obtained by mixing the methylol group-containing compound (b) with an acyl chloride in the presence of a base catalyst.

Hereinafter, typical examples of the compounds having the substituent above (b) will be shown below. Examples of the melamine compounds include compounds such as hexamethylol melamine, hexamethoxymethylmelamine, and hexamethylol melamine of which one to five methylol groups are methoxymethylated or the mixture thereof; compounds such as hexakis(methoxymethyl)melamine, hexakis(acyloxymethyl)melamine, and hexamethylol melamine of which one to five methylol groups are acyloxymethylated or the mixture thereof; and the like.

Examples of the guanamine compounds include compounds of tetramethylol guanamine, tetrakis(methoxymethyl)guanamine, and tetramethylol guanamine of which 1 to 3 methylol groups are methoxymethylated compound or the mixtures thereof; compounds of tetrakis(methoxyethyl)guanamine, tetrakis(acyloxymethyl)guanamine, and tetramethylol guanamine of which 1 to 3 methylol groups are acyloxymethylated or the mixtures thereof, and the like.

Examples of the glycoluril compounds include compounds of tetramethylol glycoluril, tetrakis(methoxymethyl)glycoluril, and tetramethylol glycoluril of which 1 to 3 methylol groups are methoxymethylated or the mixtures thereof; compounds of tetramethylol glycoluril of which 1 to 3 methylol groups are acyloxymethylated, or the mixture thereof; and the like.

Examples of the urea compounds include compounds of tetramethylol urea, tetrakis(methoxymethyl)urea, and tetramethylol urea of which 1 to 3 methylol groups are methoxymethylated or the mixtures thereof, tetrakis(methoxyethyl)urea, and the like. The compounds (b) may be used alone or in combination.

The crosslinking agent (c), i.e., the phenol, naphthol or hydroxyanthracene compound substituted with at least one group selected from methylol, alkoxymethyl, and/or acyloxymethyl groups, prevents the intermixing with the topcoat photoresist by thermal crosslinking and raise the strength of film, similarly to the crosslinking agent (b).

Hereinafter, these compounds may be referred to collectively as compounds (c) (methylol group-, alkoxymethyl group-, and/or acyloxymethyl group-containing compounds).

The number of the methylol, acyloxymethyl, or alkoxymethyl groups contained in the crosslinking agent (c) is at least two per molecule, and phenolic compounds of which all 2 and 4 positions are substituted are preferable from the viewpoints of thermal crosslinking efficiency and storage stability. All of the ortho and para positions to the OH group of the skeletal naphthol or hydroxyanthracene compound are also preferably substituted. The 3 or 5 position of the skeletal phenol compound may be unsubstituted or substituted. Any position of the skeletal naphthol compound excluding the positions ortho to the OH group may be unsubstituted or substituted.

These methylol group-containing compounds (c) are prepared by reacting a raw material phenolic compound having hydrogen atoms at the para and ortho positions to the phenolic OH group (positions 2 or 4) with formalin in the presence of a basic catalyst such as sodium hydroxide, potassium hydroxide, ammonia, or tetraalkylammonium hydroxide.

The alkoxymethyl group-containing compounds (c) are prepared by heating the methylol group-containing compound (c) in alcohol in the presence of an acid catalyst such as hydrochloric acid, sulfuric acid, nitric acid, or methanesulfonic acid.

The acyloxymethyl group-containing compounds (c) are prepared by reacting the methylol group-containing compound (c) with an acyl chloride in the presence of a base catalyst.

Examples of the skeletal compounds for the crosslinking agent (c) include phenol, naphthol and hydroxyanthracene compounds unsubstituted at the ortho and para positions to the phenolic OH group, and typical examples thereof include isomers of phenol and cresol, bisphenols such as 2,3-xylenol, 2,5-xylenol, 3,4-xylenol, 3,5-xylenol, and bisphenol A, 4,4'-dihydroxybiphenyl, TrisP-PA (manufactured by Honshu Chemical Industry Co., Ltd.), naphthol, dihydroxynaphthalene, 2,7-dihydroxyanthracene, and the like.

Typical examples of the crosslinking agents (c) include trimethylol phenol, tris(methoxymethyl)phenol, trimethylol phenol compounds of which one or two methylol groups are methoxymethylated, trimethylol-3-cresol, tris(methoxymethyl)-3-cresol, trimethylol-3-cresol compounds of which one or two methylol groups are methoxymethylated, dimethylol cresol such as 2,6-dimethylol-4-cresol, tetramethylol bisphenol A, tetrakis(methoxymethyl)bisphenol A, tetramethylol bisphenol A compounds of which 1 to 3 methylol groups are methoxymethylated, tetramethylol-4,4'-dihydroxybiphenyl, tetrakis(methoxymethyl)-4,4'-dihydroxybiphenyl, TrisP-PA hexamethylol derivatives, TrisP-PA hexamethoxymethyl derivatives, TrisP-PA hexamethylol derivatives of which 1 to 5 methylol groups are methoxymethylated, bishydroxymethylnaphthalene diol, and the like.

Examples of the hydroxyanthracene compounds include 1,6-bis(hydroxymethyl)-2,7-dihydroxyanthracene and the like.

Examples of the acyloxymethyl group-containing compounds include the methylol group-containing compounds above of which all or some of the methylol groups are acyloxymethylated.

Preferable among these compounds are trimethylol phenol, bishydroxymethyl-p-cresol, tetramethylol bisphenol A, TrisP-PA (manufactured by Honshu Chemical Industry Co., Ltd.) hexamethylol derivatives, or the phenol compounds of which the methylol groups are substituted with an alkoxymethyl group or both with a methylol group and an alkoxymethyl group.

These compounds (c) may be used alone or in combination.

When the crosslinking agent is contained in the invention, the total content of the crosslinking agents (a) to (c) in the colored curable composition may vary according to the raw materials, but is preferably 1 to 70 mass %, more preferably 5 to 50 mass %, and particularly preferably 7 to 30 mass %, with respect to the solid matter (by weight) of the composition.

—Polymerizable Monomer—

The colored curable composition according to the invention preferably contains at least one polymerizable monomer. The polymerizable monomer is used mainly when the colored curable composition is a negative working composition.

It may be added together with a photopolymerization initiator described below to a positive working composition containing a naphthoquinonediazide compound described below, and, in such a case, it leads to increase in the curable degree of the formed pattern.

Use of the polymerizable monomer is advantageous, because, when used with a photopolymerization initiator described below, it makes the colored curable composition according to the invention more sensitive and raises the resolution thereof. Hereinafter, the polymerizable monomer will be described.

The polymerizable monomer is preferably a compound having an ethylenic unsaturated group that has a boiling point of 100° C. or higher under atmospheric pressure, and examples thereof include monofunctional acrylates and methacrylates such as polyethylene glycol mono(meth)acrylate, polypropylene glycol mono(meth)acrylate, and phenoxyethyl(meth)acrylate; polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tris(acryloyloxypropyl)ether, tri(acryloyloxyethyl)isocyanurate, and multifunctional alcohol (such as glycerol or trimethylolethane)/ethyleneoxide or propyleneoxide adducts that are additionally (meth)acrylated; the urethane acrylates described in JP-B Nos. 48-41708 and 50-6034 and JP-A No. 51-37193; the polyacrylate esters described in JP-A No. 48-64183 and JP-B Nos. 49-43191 and No. 52-30490; polyfunctional acrylates and methacrylates such as epoxyacrylates, i.e., reaction products of an epoxy resin and (meth)acrylic acid, and the mixture thereof. The photocurable monomers and oligomers described in J. Adhesion Soc. Jpn., Vol. 20, No. 7, p. 300 to 308 are also included favorably.

The content of the polymerizable monomer in the colored curable composition is preferably 0.1 to 90 mass %, more preferably 1.0 to 80 mass %, and particularly preferably 2.0 to 70 mass %, with respect to the solid matter in the composition.

—Radiation-Sensitive Compound—

The colored curable composition according to the invention favorably contains at least one radiation-sensitive compound. The radiation-sensitive compound according to the invention is a compound that causes a chemical reaction such as radical generation, acid generation, or base generation by irradiation of radiation ray such as UV, Deep UV, visible light, infrared light, or electron beam, but it may also be used for the purpose of making the coated film insoluble to the alkaline developing solution, by inactivating the alkali-soluble resin in reactions of crosslinking, polymerization, decomposition of acidic group and others and also allowing polymerization the polymerizable monomer and oligomer and crosslinking of the crosslinking agent coexist in the coated film.

In particular, the colored curable composition preferably contains a photopolymerization initiator when it is a negative working composition and a naphthoquinonediazide compound when it is a positive working composition.

—Photopolymerization Initiator—

First, the photopolymerization initiator contained when the colored curable composition according to the invention is a negative working composition will be described. The photopolymerization initiator is not particularly limited, if it polymerizes the polymerizable monomer, and preferably selected properly from the viewpoints of its properties, polymerization-initiating efficiency, absorption wavelength, availability, cost, and others. It may be added to a positive working composition containing a naphthoquinonediazide compound, and in such a case, addition thereof increases the curable degree of the formed pattern further.

Examples of the photopolymerization initiators include activated halogen compounds such as halomethyloxadiazole compounds and halomethyl-s-triazine compounds, 3-aryl-substituted coumarin compounds, Rofin dimers, benzophenone compounds, acetophenone compounds and the derivatives thereof, cyclopentadiene-benzene-iron complexes and the salts thereof, oxime compounds, and the like.

Examples of the halomethyloxadiazole-based activated halogen compounds include the 2-halomethyl-5-vinyl-1,3,4-oxadiazole compound and others described in JP-B No. 57-6,096; 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole and the like.

Examples of the halomethyl-s-triazine activated halogen compounds include the vinyl-halomethyl-s-triazine compounds described in JP-B No. 59-1,281, the 2-(naphtho-1-yl)-4,6-bis-halomethyl-s-triazine compounds described in JP-A No. 53-133,428; 4-(p-aminophenyl)-2,6-bis-halomethyl-s-triazine compounds, and the like.

Other typical examples include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-(4-butoxy-naphtho-1-yl)-4,6-bis(trichloromethyl)-s-triazine, 2-[4-(2-methoxyethyl)-naphtho-1-yl]-4,6-bis(trichloromethyl)-s-triazine, 2-[4-(2-ethoxyethyl)-naphtho-1-yl]-4,6-bis(trichloromethyl)-s-triazine, 2-[4-(2-butoxyethyl)-naphtho-1-yl]-4,6-bis(trichloromethyl)-s-triazine, 2-(2-methoxy-naphtho-1-yl)-4,6-bis(trichloromethyl)-s-triazine, 2-(6-methoxy-5-methyl-naphtho-2-yl)-4,6-bis(trichloromethyl)-s-triazine, 2-(6-methoxy-naphtho-2-yl)-4,6-bis(trichloromethyl)-s-triazine, 2-(5-methoxy-naphtho-1-yl)-4,6-bis(trichloromethyl)-s-triazine, 2-(4,7-dimethoxy-naphtho-1-yl)-4,6-bis(trichloromethyl)-s-triazine, 2-(6-ethoxy-naphtho-2-yl)-4,6-bis(trichloromethyl)-s-triazine, 2-(4,5-dimethoxy-naphtho-1-yl)-4,6-bis(trichloromethyl)-s-triazine, 4-[p-N,N-bis(ethoxycarbonylmethyl)aminophenyl]-2,6-bis(trichloromethyl)-s-triazine, 4-[o-methyl-p-N,N-bis(ethoxycarbonylmethyl)aminophenyl]-2,6-bis(trichloromethyl)-s-triazine, 4-[p-N,N-bis(chloroethyl)aminophenyl]-2,6-bis(trichloromethyl)-s-triazine, 4-[o-methyl-p-N,N-bis(chloroethyl)aminophenyl]-2,6-bis(trichloromethyl)-s-triazine, 4-(p-N-chloroethylaminophenyl)-2,6-bis(trichloromethyl)-s-triazine, 4-(p-N-ethoxycarbonylmethylaminophenyl)-2,6-bis(trichloromethyl)-s-triazine, 4-[p-N,N-diphenylaminophenyl]-2,6-bis(trichloromethyl)-s-triazine, 4-(p-N-chloroethylcarbonylaminophenyl)-2,6-bis(trichloromethyl)-s-triazine, 4-[p-N-(p-methoxyphenyl)carbonylaminophenyl]-2,6-bis(trichloromethyl)-s-triazine, 4-[m-N,N-bis(ethoxycarbonylmethyl)aminophenyl]-2,6-bis(trichloromethyl)-s-triazine, 4-[m-bromo-p-N,N-bis(ethoxycarbonylmethyl)aminophenyl]-2,6-bis(trichloromethyl)-s-triazine, 4-[m-chloro-p-N,N-bis(ethoxycarbonylmethyl)aminophenyl]-2,6-bis(trichloromethyl)-s-triazine, 4-[m-fluoro-p-N,N-bis(ethoxycarbonylmethyl)aminophenyl]-2,6-bis(trichloromethyl)-s-triazine, 4-[o-bromo-p-N,N-bis(ethoxycarbonylmethyl)aminophenyl]-2,6-bis(trichloromethyl)-s-triazine, 4-[o-chloro-p-N,N-bis(ethoxycarbonylmethyl)aminophenyl]-2,6-bis(trichloromethyl)-s-triazine, 4-[o-fluoro-p-N,N-bis(ethoxycarbonylmethyl)aminophenyl]-2,6-bis(trichloromethyl)-s-triazine, 4-[o-bromo-p-N,N-bis(chloroethyl)aminophenyl]-2,6-bis(trichloromethyl)-s-triazine, 4-[o-chloro-p-N,N-bis(chloroethyl)aminophenyl]-2,6-bis(trichloromethyl)-s-triazine, 4-[o-fluoro-p-N,N-bis(chloroethyl)aminophenyl]-2,6-bis(trichloromethyl)-s-triazine, 4-[m-bromo-p-N,N-bis(chloroethyl)aminophenyl]-2,6-bis(trichloromethyl)-s-triazine, 4-[m-chloro-p-N,N-bis(chloroethyl)aminophenyl]-2,6-bis(trichloromethyl)-s-triazine, 4-[m-fluoro-p-N,N-bis(chloroethyl)aminophenyl]-2,6-bis(trichloromethyl)-s-triazine, 4-(m-bromo-p-N-ethoxycarbonylmethylaminophenyl)-2,6-bis(trichloromethyl)-s-triazine, 4-(m-chloro-p-N-ethoxycarbonylmethylaminophenyl)-2,6-bis(trichloromethyl)-s-triazine, 4-(m-fluoro-p-N-ethoxycarbonylmethylaminophenyl)-2,6-bis(trichloromethyl)-s-triazine, 4-(o-bromo-p-N-ethoxycarbonylmethylaminophenyl)-2,6-bis(trichloromethyl)-s-triazine, 4-(o-chloro-p-N-ethoxycarbonylmethylaminophenyl)-2,6-bis(trichloromethyl)-s-triazine, 4-(o-fluoro-p-N-ethoxycarbonylmethylaminophenyl)-2,6-bis(trichloromethyl)-s-triazine, 4-(m-bromo-p-N-chloroethylaminophenyl)-2,6-bis(trichloromethyl)-s-triazine, 4-(m-chloro-p-N-chloroethylaminophenyl)-2,6-bis(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine, 4-(o-fluoro-p-N-chloroethylaminophenyl)-2,6-bis(trichloromethyl)-s-triazine and the like.

Other exemplary embodiments thereof include the TAZ series products manufactured by Midori Kagaku Co., Ltd., such as TAZ-107, TAZ-110, TAZ-104, TAZ-109, TAZ-140, TAZ-204, TAZ-113, TAZ-123 and TAZ-104; the T series products manufactured by PANCHIM, such as T-OMS, T-BMP, T-R, and T-B; Irgacure series products manufactured by Ciba-Geigy Corp., such as Irgacure 369, Irgacure 784, Irgacure 651, Irgacure 184, Irgacure 500, Irgacure 1,000, Irgacure 149, Irgacure 819, and Irgacure 261; Darocur series products such as Darocur 1,173; 4,4'-bis(diethylamino)-benzophenone, 2-(O-benzoyloxime)-1-[4-(phenylthio)phenyl]-1,2-octandione, 2-benzyl-2-dimethylamino-4-morpholinobutylophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methyl mercaptophenyl)-4,5-diphenylimidazolyl dimer, benzoin isopropylether, and the like.

The colored curable composition according to the invention may contain a known photopolymerization initiator other than the photopolymerization initiator additionally. Typical examples thereof include the vicinal polyketol aldonyl compounds described in U.S. Pat. No. 2,367,660; the α-carbonyl compounds described in U.S. Pat. Nos. 2,367,661 and 2,367,670; the acyloin ethers described in U.S. Pat. No. 2,448,828; the α-hydrocarbon-substituted aromatic acyloin compounds described in U.S. Pat. No. 2,722,512; the polynuclear quinone compounds described in U.S. Pat. Nos. 3,046,127 and 2,951,758; the combination of triallylimidazole dimer/p-aminophenylketone described in U.S. Pat. No. 3,549,367; the benzothiazole compound/trihaloemethyl-s-triazine compound described in JP-B No. 51-48,516, and the like.

The content of the photopolymerization initiator in the colored curable composition is preferably 0.01 to 50 mass %, more preferably 1 to 30 mass %, and particularly preferably 1 to 20 mass %, with respect to the polymerizable monomer solid matter (by mass). A content of less than 0.01 mass % may result in decrease in polymerization efficiency, while a content of more than 50 mass % in increase in polymerization rate but also in decrease of the molecular weight and deterioration in film strength.

A sensitizer or a photostabilizer may be used in combination with the photopolymerization initiator.

Typical examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzalacetone, p-(dimethylamino) phenylstyrylketone, p-(dimethylamino)propylphenyl-p-methylstyrylketone, benzophenone, p-(dimethylamino)benzophenone (or Michler's ketone), p-(diethylamino)benzophenone, benzanthrone, the benzothiazole compounds and others described in JP-B No. 51-48,516; Tinuvin 1130, Tinuvin 400, and the like.

In addition to the compounds above, addition of a thermal polymerization inhibitor is preferable, and exemplary embodiments thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), 2-mercaptobenzimidazole, and the like.

—Naphthoquinonediazide Compound—

Hereinafter, the naphthoquinonediazide compound used in a positive working composition will be described.

The naphthoquinonediazide compound is a compound having at least one o-quinonediazide group, and examples thereof include o-naphthoquinonediazide-5-sulfonic ester, o-naphthoquinonediazide-5-sulfonic amide, o-naphthoquinonediazide-4-sulfonic ester, o-naphthoquinonediazide-4-sulfonic amide, and the like. These ester and amide compounds can be prepared by any known method for example, by using a phenol compound represented by Formula (I) of JP-A No. 2-84,650 or 3-49,437.

When the colored curable composition is a positive working composition, the alkali-soluble phenol resin and the crosslinking agent are normally, preferably dissolved in an organic solvent respectively in amounts of approximately 2 to 50 mass % and approximately 2 to 30 mass % with respect to the total solid added. The contents of the naphthoquinonediazide compound and the dye are preferably, respectively 2 to 30 mass % and 2 to 50 mass % normally, with respect to the solution containing the dissolved binder and crosslinking agent.

—Solvent—

Generally, a solvent may be used in preparation of the colored curable composition according to the invention.

The solvent for use is not fundamentally, particularly limited, if it satisfies the requirements in solubility of the respective components in the composition and coating efficiently of the colored curable composition, but preferably selected properly, by considering the solubility of binder, coating efficiency, and safety.

Typical exemplary embodiments of the solvents include esters such as ethyl acetate, acetic acid-n-butyl, isobutyl acetate, amyl formate, isoamyl acetate, isobutyl acetate, butyl propionate, isopropyl butyrate, ethyl butyrate, butyl butyrate, methyl lactate, ethyl lactate, oxybutyl acetate, methoxymethyl acetate, methoxyethyl acetate, methoxybutyl acetate, ethoxymethyl acetate, and ethoxyethyl acetate;

3-oxyalkyl propionate esters such as 3-oxymethyl propionate and 3-oxyethyl propionate; 2-oxyalkyl propionate esters such as 3-methoxymethyl propionate, 3-methoxyethyl propionate, 3-ethoxymethyl propionate, 3-ethoxyethyl propionate, 2-oxymethyl propionate, 2-oxyethyl propionate, and 2-oxypropyl propionate; other esters such as 2-methoxymethyl propionate, 2-methoxyethyl propionate, 2-methoxypropyl propionate, 2-ethoxymethyl propionate, 2-ethoxyethyl propionate, methyl 2-oxy-2-methylpropionate, 2-oxy-2-methylethyl propionate, methyl 2-methoxy-2-methylpropionate, 2-ethoxy-2-methylethyl propionate, methyl pyruvate, ethyl pyruvate, propyl pyruvate, methyl acetoacetate, ethylacetoacetate, 2-oxomethyl butanoate, and 2-oxoethyl butanoate;

ethers such as diethylene glycol dimethylether, tetrahydrofuran, ethylene glycol monomethylether, ethylene glycol monoethylether, methyl cellosolve acetate, ethyl cellosolve acetate, diethylene glycol monomethylether, diethylene glycol monoethylether, diethylene glycol monobutylether, diethylene glycol monomethylether acetate, diethylene glycol monoethylether acetate, diethylene glycol monobutylether acetate, propylene glycol methylether, propylene glycol methylether acetate, propylene glycol ethylether acetate, propylene glycol propylether acetate, and methoxybutanol; ketones such as methylethylketone, cyclohexanone, 2-heptanone, and 3-heptanone; alcohols such as 3-methoxy-1-butanol and 4-methoxy-1-butanol; aromatic hydrocarbons such as toluene and xylene; and the like.

Among them, 3-ethoxymethyl propionate, 3-ethoxyethyl propionate, ethyl cellosolve acetate, ethyl lactate, diethylene glycol dimethyl ether, butyl acetate, 3-methoxymethyl propionate, 2-heptanone, cyclohexanone, diethylene glycol monoethylether acetate, diethylene glycol monobutylether acetate, propylene glycol methylether, propylene glycol methylether acetate, and the like are more preferable.

—Various Additives—

Various additives such as filler, polymer compound other than those above, surfactant, adhesion accelerator, antioxidant, ultraviolet absorbent, discoloration inhibitor, and aggregation inhibitor may be added to the colored curable composition according to the invention as needed.

Typical examples of the various additives include fillers such as glass and alumina; polymer compounds other than binder resin such as polyvinylalcohol, polyacrylic acid, polyethylene glycol monoalkylethers, and polyfluoroalkyl acrylates; nonionic, cationic, anionic and other surfactants; adhesion accelerators such as vinyltrimethoxysilane, vinyltriethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-t-butylphenol) and 2,6-di-t-butylphenol; ultraviolet absorbents such as 2-(3-t-butyl-5-methyl-2-hydroxyphenyl)-5-chlorobenzotriazolyl and alkoxybenzophenone; and aggregation inhibitors such as sodium polyacrylate.

An organic carboxylic acid, preferably a low-molecular-weight organic carboxylic acid having a molecular weight 1,000 or less, may be added to the composition, for improvement of the alkali solubility of the region to be developed (unhardened nonimage region when a negative working composition is used) and further improvement of the developing efficiency of the colored curable composition according to the invention.

Typical examples thereof include fatty monocarboxylic acids such as formic acid, acetic acid, propionic acid, butyric acid, valeric acid, pivalic acid, caproic acid, diethylacetic acid, enanthic acid, and caprylic acid; fatty dicarboxylic acids such as oxalic acid, malonic acid, succinic acid, glutaric acid, adipic acid, pimelic acid, suberic acid, azelaic acid, sebacic acid, brassic acid, methylmalonic acid, ethylnalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cuminic acid, hemellitic acid, and mesitylenic acid; aromatic polycarboxylic acids such as phthalic acid, isophthalic acid, terephthalic acid, trimellitic acid, trimesic acid, mellophanic acid, and pyromellitic acid; other carboxylic acids such as phenylacetic acid, hydratropic acid, hydrocinnamic acid, mandelic acid, phenylsuccinic acid, atropic acid, cinnamic acid, cinnamylideneacetic acid, coumalic acid, and umbellic acid; and the like.

The colored curable composition according to the invention can be used as a colored pixel-forming material such as color filter for use in liquid crystal display elements (LCD) and solid state imaging devices (e.g., CCD, CMOS, etc.) and also, as a material for preparation of printing ink, inkjet ink, paint, and others.

<<Color Filter and its Production Method>>

Hereinafter, the method of preparing a color filter according to the present invention will be described in detail.

In preparation of the color filter according to the present invention, the dye-containing curable composition according to the present invention described above is used. The color filter according to the invention is prepared favorably with the colored curable composition according to the invention, by forming a radiation-sensitive composition layer by coating the colored curable composition on a substrate by application for example by spin coating, cast coating, or roll coating, irradiating the coated film with light through a particular mask pattern, and forming a negative working or positive working colored pattern (resist pattern) by developing the coated film with a developing solution (image-forming step). A step of curing the formed colored pattern by heating and/or light exposure may be carried out additionally as needed. The light or radiation ray used then is particularly preferably a ultraviolet ray such as g ray, h ray, or i ray. Alternatively, a step of post-baking the colored pattern after image formation may be carried out additionally when the colored curable composition is a positive working composition.

In preparation of the color filter, it is possible to prepare a color filter having a desirable number of colors, by repeating the image-forming step (and as needed curable step) according to the desirable number of colors in the case of a negative working composition, and by repeating the image-forming step and the post-baking step according to the desirable number of colors in the case of a positive working composition.

Examples of the substrates include soda-lime glass, borosilicate glass, and quartz glass used, for example, in liquid crystal display elements and those having a transparent conductive film formed thereon; photoelectrically-converting-device substrates used for example for image sensors such as silicon substrate; complimentary metal oxide semiconductors (CMOSs), and the like. Black stripes separating pixels are often formed on the substrate. In addition, an undercoat layer may be formed on the substrate as needed, for improvement in adhesiveness to the upper layer, prevention of substance diffusion, or smoothening of the substrate surface.

The developing solution for use in preparation of the color filter according to the invention is not particularly limited, if it dissolves the region to be developed and removed in the colored curable composition (e.g., unhardened region in the case of a negative working composition) and does not dissolve the hardened filter region. Specifically, various combinations of an organic solvent and an aqueous alkaline solution are used favorably. Examples of the organic solvents include the solvents used in preparation of the composition according to the invention above.

Exemplary embodiments of the aqueous alkaline solutions include aqueous alkaline solutions containing an alkaline compound such as sodium hydroxide, potassium hydroxide, sodium carbonate, sodium silicate, sodium metasilicate, ammonia, ethylamine, diethylamine, dimethylethanolamine, tetramethylammonium hydroxide, tetraethylammonium hydroxide, choline, pyrrole, piperidine, or 1,8-diazabicyclo-[5.4,0]-7-undecene at a concentration of 0.001 to 10 mass %, preferably 0.01 to 1 mass %. When an aqueous alkaline solution is used as the developing solution, the color filter is generally washed with water after development.

The color filter according to the present invention may be used in a solid state imaging device, for example, in liquid crystal display elements and CCDs, and particularly favorably, for example, in high-resolution CCD elements and CMOS elements having a resolution of more than 1,000,000 pixels. The color filter according to the present invention may be used, for example, as a color filter to be installed between a light-receiving unit for CCD corresponding to each pixel and a photoconverging microlens.

EXAMPLES

Hereinafter, the present invention will be described more specifically with reference to Examples, but it should be understood that the invention is only restricted by its Claims and not by the Examples below. "Part" in the following Examples is a part by mass, unless specified otherwise.

Example 1

1) Preparation of Resist Solution

Propylene glycol monomethylether acetate 5.20 parts (PGMEA)
Ethyl lactate (EL) 52.6 parts
Binder (benzyl methacrylate/methacrylic acid/2-hydroxyethyl methacrylate) copolymer (molar ratio: 60:20:20) 41% EL solution 30.5 parts
Dipentaerythritol hexaacrylate 10.2 parts
Polymerization inhibitor (p-methoxyphenol) 0.006 parts
Fluorochemical surfactant 0.80 parts
Photopolymerization initiator TAZ-107 (manufactured by Midori Kagaku Co., Ltd.) 0.58 parts
These components were mixed and dissolved in each other, to give a resist solution.

2) Preparation of Glass Plate Having an Undercoat Layer

A glass plate (Corning 1737) was ultrasonicated in 0.5% aqueous NaOH solution, washed with water, and baked for dehydration (200° C./20 minutes). The resist solution obtained in 1) was then coated on the cleaned glass plate to a film thickness of 2 μm by using a spin coater, and the coated film was dried under heat at 220° C. for 1 hour, to give a curable film (undercoat layer).

3) Preparation of Dye Resist Solution ([Negative Working] Colored Curable Composition)

9.4 g of the resist solution obtained in 1), 0.9 g of a dye according to the invention, an exemplary compound C-1, [tetraazaporphyrin dye represented by Formula (C1), hereinafter referred to as dye C-1], and 0.36 g of an exemplary compound M-1 [azomethine dye represented by Formula (I), hereinafter referred to as dye M-1] were mixed and dissolved in each other, to give a dye resist solution ([negative working] colored curable composition solution).

4) Exposure and Development (Image Formation) of Dye Resist Solution

The dye resist solution obtained in 3) was coated on the undercoat layer of the glass plate having an undercoat layer obtained in 2) to a film thickness of 1.0 μm by using a spin coater, and the coated film was prebaked at 100° C. for 120 seconds.

Then, the coated film was irradiated with a light at a wavelength of 365 nm through a 5-mm square mask (island pattern) at an exposure intensity of 500 mJ/cm$^2$ by using a photoirradiation device. After irradiation, the film was developed under a condition at 25° C. for 40 seconds with a developing solution CD-2000 (manufactured by FUJIFILM Electronic Materials), washed with running water for 30 seconds, and then, spray dried, to give a blue pattern favorable as a blue color filter.

5) Evaluation

The storage stability of the dye resist solution thus prepared and the heat resistance and the light stability of the coated film formed on a glass plate by using the dye resist solution were determined in the manners below. Evaluation results are summarized in the following Table 1.

—Storage Stability Over Time (Storability)—

The dye resist solution was stored at room temperature for one month, and the degree of sedimentation of foreign matter was observed visually and evaluated according to the following criteria:

[Criteria]
a: No sedimentation observed
b: Slight sedimentation observed
c: Distinct sedimentation observed —Developing Efficiency—

The residual color remaining in the unexposed region was evaluated. The absorbance at 650 nm in the unexposed region was determined.

[Criteria]
a: 0<Absorbance≦0.01
b: 0.01≦Absorbance≦0.03
c: 0.03<Absorbance

—Heat Resistance—

The glass plate carrying the dye resist solution coated was placed on a hot plate at 180° C. for 1 hour, while the hot plate was in contact with the substrate surface, and the difference in color between before and after heating ΔEab was determined by using chromoscope MCPD-1,000 (manufactured by Otsuka Electronics Co., Ltd.) and used as an indicator for evaluation of the heat resistance. The heat resistance was evaluated according to the following criteria. A smaller ΔEab value indicates favorable heat resistance.

[Criteria]
a: ΔEab<5
b: 5≦ΔEab≦10
c: 10<ΔEab

—Light Stability—

A glass plate carrying a coated dye resist solution was irradiated with a xenon lamp at 100,000 lux for 20 hours (equivalent to 2,000,000 lux-h), and the difference in color between before and after irradiation (ΔEab) was determined and used as an indicator for evaluation of light stability. The light stability was evaluated according to the following criteria. A smaller ΔEab value indicates favorable light stability.

[Criteria]
a: ΔEab<5
b: 5≦ΔEab≦10
c: 10<ΔEab

Examples 2 to 10

Blue patterns were formed and evaluated a similar manner to Example 1, except that the dye according to the invention used in "3) preparation of dye resist solution" of Example 1 was replaced with the following dye shown in Table 1 (in the same amount). Evaluation results are summarized in the following Table 1.

Comparative Example 1

A blue pattern was formed and evaluated in a similar manner to Example 1, except that the dye according to the invention used in "3) preparation of dye resist solution" of Example 1 was replaced with the dye shown in the following Table 1 (in the same molar amount). Evaluation results are summarized in the following Table 1.

Comparative Example 2

A blue pattern was formed and evaluated in a similar manner to Example 1, except that the dye according to the invention used in "3) preparation of dye resist solution" of Example 1 was replaced with the following dye shown in Table 1 (in the same total amount by mole) and the molar ratio of C.I. solvent blue 67 to C.I. Acid Blue 83 was changed to 1/1. Evaluation results are summarized in the following Table 1.

Comparative Example 3

A blue pattern was formed and evaluated in a similar manner to Example 1, except that the dye according to the invention used in "3) preparation of dye resist solution" of Example 1 was replaced with the following dye shown in Table 1 (in the same total amount by mole) and the molar ratio of C.I. solvent blue 67, C.I. Acid Blue 83 and comparative dye C was changed to 2/1/1. Evaluation results are summarized in the following Table 1.

TABLE 1

Comparative dye A

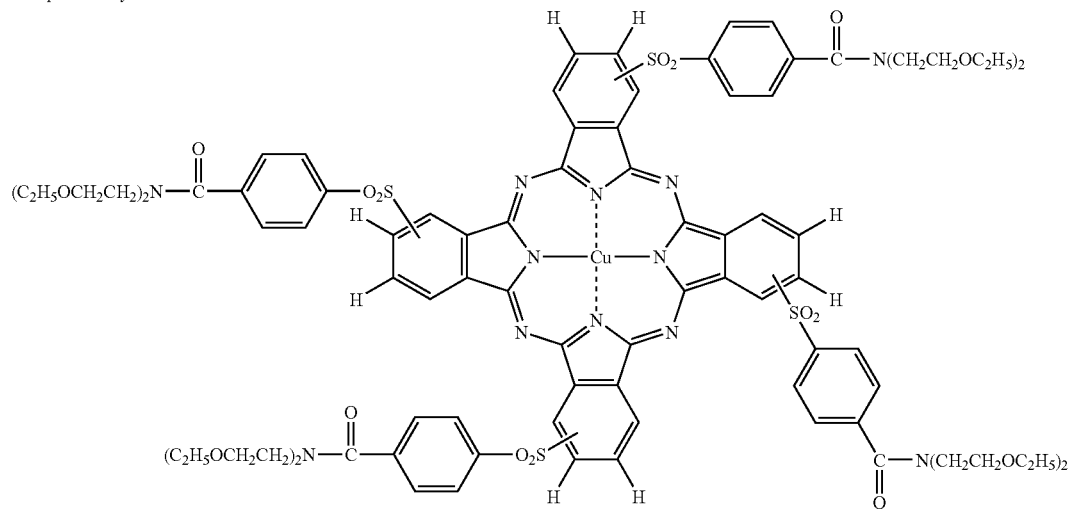

Comparative dye B

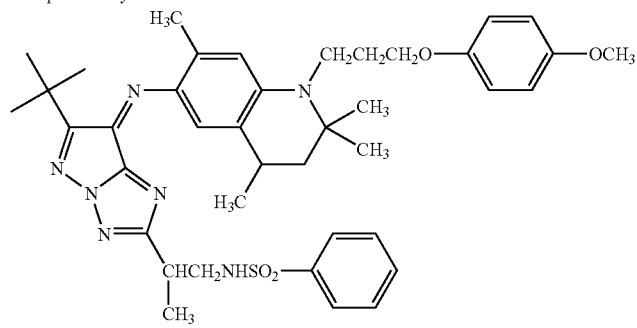

Comparative dye C

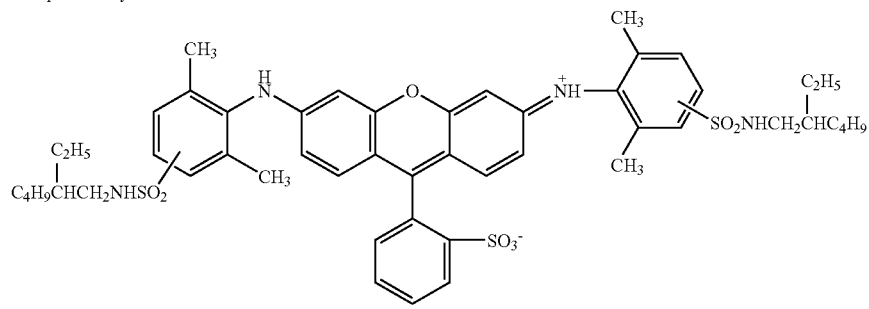

| | Compound of Formula (C1) | Compound of Formula (I) | Storability | Heat resistance | Light stability | Developing efficiency | Note |
| --- | --- | --- | --- | --- | --- | --- | --- |
| Example 1 | C-1 | M-1 | a | a | a | a | The invention |
| Example 2 | C-2 | M-2 | b | a | a | a | The invention |
| Example 3 | C-5 | M-1 | a | a | a | a | The invention |
| Example 4 | C-7 | M-1 | b | a | a | a | The invention |
| Example 5 | C-11 | M-12 | a | a | a | a | The invention |
| Example 6 | C-24 | M-15 | a | b | a | a | The invention |
| Example 7 | C-29 | M-1 | a | b | a | a | The invention |
| Example 8 | C-51 | M-1 | a | a | a | a | The invention |
| Example 9 | C-53 | M-2 | a | a | a | a | The invention |
| Example 10 | C-59 | M-2 | a | a | a | a | The invention |
| Example 11 | C-1 | M-1 | a | a | a | a | The invention |
| Comparative example 1 | Comparative dye A | Comparative dye B | a | a | a | c | Comparative example |
| Comparative example 2 | C.I. Solvent Blue 67 and C.I. Acid Blue 83 | | c | c | c | c | Comparative example |

TABLE 1-continued

| Comparative example 3 | C.I. Solvent Blue 67, C.I. Acid Blue 83 and Comparative dye C | c | c | c | c | Comparative example |

As shown in Table 1 above, the dye resist solutions in examples using the dye according to the invention showed a developing efficiency better than that in Comparative Example 1 in which a different dye was used. In addition, the liquid dye resist solutions (colored curable compositions) in examples using the dye according to the invention were better in storage stability over time and also in developing efficiency than those in Comparative Examples 2 and 3 using a different dye, and the blue patterns formed with the dye resist solutions were more favorable in heat resistance and light stability.

Example 11

1) Preparation of [Positive Working] Colored Curable Composition

Ethyl lactate (EL) 30 parts
Following resin P-1 3.0 parts
Following naphthoquinonediazide compound N-1 1.8 parts
Hexamethoxymethylolated melamine (crosslinking agent) 0.6 part
TAZ-107 (photochemical acid generator, manufactured by Midori Kagaku) 1.2 parts
F-475 0.0005 parts
(fluorochemical surfactant, manufactured by Dainippon Ink and Chemicals, Inc.)
Exemplary compound C-1 0.38 parts
(tetraazaporphyrin dye represented by Formula (C1))
exemplary compound M-1 1.12 parts
(azomethine dye represented by Formula (I))
—Preparation of Resin P-1—
70.0 g of benzyl methacrylate, 13.0 g of methacrylic acid, 17.0 g of 2-hydroxyethyl methacrylate, and 600 g of 2-methoxypropanol were placed in a three-necked flask equipped with a stirrer, a reflux condenser tube and a thermometer, and the mixture was stirred with a catalytic amount of a polymerization initiator V-65 (manufactured by Wako Pure Chemical Industries) under nitrogen stream at 65° C. for 10 hours. The resin solution obtained was added dropwise into 20 L of ion-exchange water vigorously agitated, to give a white powder. The white powder was collected by filtration and dried at 40° C. under vacuum for 24 hours, to give 145 g of a resin P-1. Molecular weight analysis by GPC showed a weight-average molecular weight Mw of 28,000 and a number-average molecular weight Mn of 11,000.
—Preparation of Naphthoquinonediazide Compound N-1—
42.4 g of TrisP-PA (manufactured by Honshu Chemical Industry), 61.80 g of o-naphthoquinonediazide-5-sulfonyl chloride, and 300 ml of acetone were placed in a three-necked flask, and 24.44 g of triethylamine was added thereto at room temperature over 1 hour. After dropwise addition, the mixture was stirred additionally for 2 hours, and the reaction solution was poured into a great amount of water while the mixture was agitated. The precipitated naphthoquinonediazide sulfonic ester was collected by filtration under reduce pressure and dried at 40° C. under vacuum for 24 hours, to give a photosensitive compound N-1.

2) Exposure and Development (Image Formation) of Colored Curable Composition

A glass plate carrying an undercoat layer was prepared similarly to Example 1; the colored curable composition thus prepared was coated, prebaked, photoirradiated, developed, washed and spray dried on the glass plate having an undercoat layer in a similar manner to Example 1, to give a blue pattern; and the pattern was then heated at 180° C. (post-baked) for 5 minutes. The blue pattern image formed had a favorable rectangular profile.

Subsequently, the storage stability of the dye resist solution thus prepared and the heat resistance and the light stability of the coated film formed on the glass plate by using the dye resist solution were evaluated in a similar manner to Example 1, showing that the storage stability and the light stability and heat resistance thereof were all favorable similarly to the negative working dye resist solution and the coated film above. Results are summarized in Table 1.

Examples 12 to 21

A coated film was formed on a silicon wafer substrate in a similar manner to Examples 1 to 10, except that the glass plate used in Example 1 to 10 was replaced with a the silicon wafer substrate. Then, the coated film was irradiated into a 2-μm square pattern with i-ray at an exposure intensity of 500 mJ/cm$^2$ by using a contraction projection photoirradiation device, and the resulting film was developed with a developing solution of CD-2000 (manufactured by FUJIFILM Electronic Materials) previously diluted to 60% at 23° C. for 60 seconds. The processed film was then washed with running water for 30 seconds and spray dried, to give a pattern favorable as a color filter for charge coupled device (CCD) that had a favorable profile with its cross section almost in the rectangular shape.

Some exemplary embodiments of the invention are shown below.

In the first aspect of the invention (1):

(2) The colored curable composition described in (1), comprising at least one tetraazaporphyrin dye represented by formula (C1): wherein, $R^1$ represents a carboxy, carbamoyl, hydroxy, aliphatic oxycarbonyl, aliphatic oxy, aliphatic sulfonylcarbamoyl, aliphatic carbonylsulfamoyl, aliphatic sulfonylsulfamoyl, imido or aliphatic sulfonyl group.

(3) The colored curable composition described in (1) comprising at least one tetraazaporphyrin dye represented by formula (C1), wherein, L represents an aliphatic group having 1 to 6 total carbon atoms or an aromatic group having 6 to 10 total carbon atoms.

(4) The colored curable composition described in (1) comprising at least one tetraazaporphyrin dye represented by formula (C1), wherein, $Z^1$ represents a non-metal atom group needed for forming a benzene ring.

(5) The colored curable composition described in (1) comprising at least one tetraazaporphyrin dye represented by formula (C1), wherein, M represents VO, Co, Cu or Zn.

(6) The colored curable composition described in (1) comprising at least one tetraazaporphyrin dye represented by formula (C1), wherein, m is 2.

(7) The colored curable composition described in (1) comprising at least one tetraazaporphyrin dye represented by formula (C1), wherein, p is 1.

(8) The colored curable composition described in (1), additionally comprising at least one azomethine dye represented by the following Formula (I):

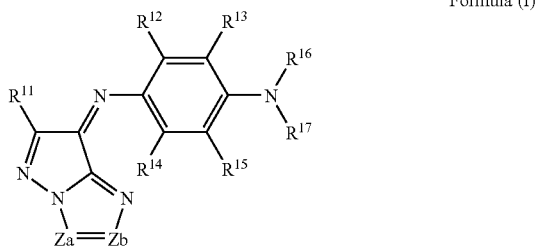

Formula (I)

[wherein, $R^{11}$, $R^{12}$, $R^{13}$, $R^{14}$ and $R^{15}$ each independently represent a hydrogen atom or a substituent group; $R^{16}$ and $R^{17}$ each independently represent an alkyl, alkenyl, aryl or heterocyclic group; Za and Zb each independently represent —N= or —C($R^{18}$)=; $R^{18}$ represents a hydrogen atom or an alkyl, aryl or heterocyclic group; and $R^{12}$ and $R^{13}$, $R^{13}$ and $R^{16}$, $R^{14}$ and $R^{15}$, $R^{15}$ and $R^{17}$, and $R^{16}$ and $R^{17}$ each may independently bind to each other, forming a five- to seven-membered ring].

(9) The colored curable composition described in (8), wherein the azomethine dye is represented by the following Formula (II):

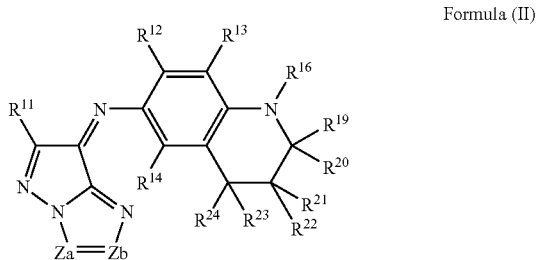

Formula (II)

wherein, $R^{19}$ to $R^{24}$ each independently represent a hydrogen atom or a substituent group. $R^{11}$ to $R^{14}$ and $R^{16}$ are the same as $R^{11}$ to $R^{14}$ and $R^{16}$ in Formula (I) above; Za and Zb in Formula (II) are the same as Za and Zb in Formula (I) above; the substituent group represented by $R^{19}$ to $R^{24}$ above are the same as the substituent group represented by $R^{11}$ in Formula (I) above; and $R^{12}$ and $R^{13}$, $R^{13}$ and $R^{16}$, $R^{16}$ and $R^{19}$, $R^{14}$ and $R^{24}$ each may independently bind to each other, forming a five-, six-, or seven-membered ring.

(10) The colored curable composition described in (9), wherein the azomethine dye is represented by the following Formula (III):

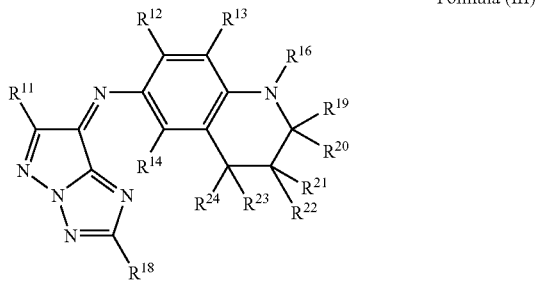

Formula (III)

wherein, $R^{18}$ represents a hydrogen atom or an alkyl, aryl or heterocyclic group; and $R^{11}$ to $R^{14}$ and $R^{16}$ and $R^{19}$ to $R^{24}$ are respectively the same as $R^{11}$ to $R^{14}$ and $R^{16}$ and $R^{19}$ to $R^{24}$ in Formula (I) or (II) above;

In the second aspect of the invention (11):

(12) The color filter described in (11) comprising at least one tetraazaporphyrin dye represented by Formula (C1), wherein $R^1$ represents a carboxy, carbamoyl, hydroxy, aliphatic oxycarbonyl, aliphatic oxy, aliphatic sulfonylcarbamoyl, aliphatic carbonylsulfamoyl, aliphatic sulfonylsulfamoyl, imido or aliphatic sulfonyl group.

(13) The color filter described in (11) comprising at least one tetraazaporphyrin dye represented by Formula (C1), wherein L represents an aliphatic group having 1 to 6 total carbon atoms or an aromatic group having 6 to 10 total carbon atoms.

(14) The color filter described in (11) comprising at least one tetraazaporphyrin dye represented by Formula (C1), wherein, $Z^1$ represents a non-metal atom group needed for forming a benzene ring.

(15) The color filter described in (11) comprising at least one tetraazaporphyrin dye represented by Formula (C1), wherein, M represents VO, Co, Cu or Zn.

(16) The color filter described in (11) comprising at least one tetraazaporphyrin dye represented by Formula (C1), wherein, m is 2 and p is 1.

(17) The color filter described in (11) additionally comprising at least one azomethine dye represented by the following Formula (I):

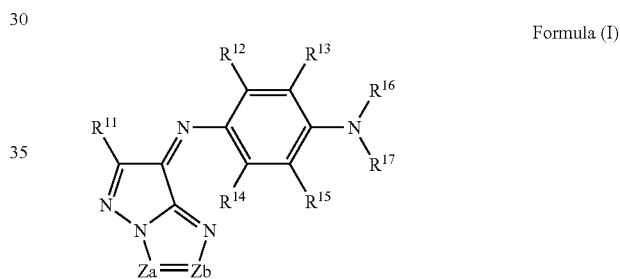

Formula (I)

wherein, $R^{11}$, $R^{12}$, $R^{13}$, $R^{14}$ and $R^{15}$ each independently represent a hydrogen atom or a substituent group; $R^{16}$ and $R^{17}$ each independently represent an alkyl, alkenyl, aryl or heterocyclic group; Za and Zb each independently represent —N= or —C($R^{18}$)=, and $R^{18}$ represents a hydrogen atom or an alkyl, aryl or heterocyclic group; and $R^{12}$ and $R^{13}$, $R^{13}$ and $R^{16}$, $R^{14}$ and $R^{15}$, $R^{15}$ and $R^{17}$, and $R^{16}$ and $R^{17}$ each may independently bind to each other, forming a five- to seven-membered ring].

(18) The color filter described in (17), wherein the azomethine dye is represented by the following Formula (II):

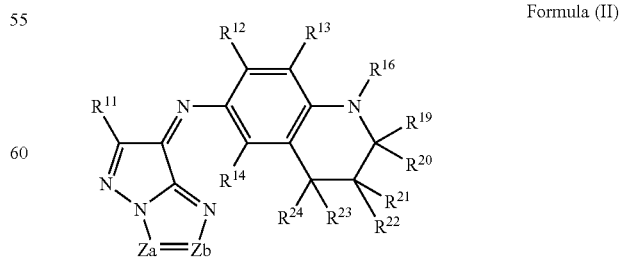

Formula (II)

wherein, $R^{19}$ to $R^{24}$ each independently represent a hydrogen atom or a substituent group; $R^{11}$ to $R^{14}$ and $R^{16}$ are respectively the same as $R^{11}$ to $R^{14}$ and $R^{16}$ in Formula (I) above; Za and Zb in Formula (II) are respectively the same as Za and Zb in Formula (I) above; the substituent group represented by $R^{19}$ to $R^{24}$ above are the same as the substituent group represented by $R^{11}$ in Formula (I) above; and $R^{12}$ and $R^{13}$, $R^{13}$ and $R^{19}$, $R^{14}$ and $R^{24}$ each may independently bind to each other, forming a five-, six-, or seven-membered ring.

(19) The color filter described in (18), wherein the azomethine dye is represented by the following Formula (III):

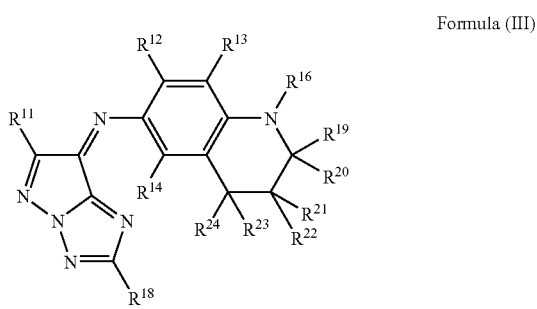

Formula (III)

wherein, $R^{18}$ represents a hydrogen atom or an alkyl, aryl or heterocyclic group; and $R^{11}$ to $R^{14}$ and $R^{16}$ and $R^{19}$ to $R^{24}$ are respectively the same as $R^{11}$ to $R^{14}$ and $R^{16}$ and $R^{19}$ to $R^{24}$ in Formula (I) or (II) above.

What is claimed is:

1. A colored curable composition, comprising at least one tetraazaporphyrin dye represented by the following Formula (C1):

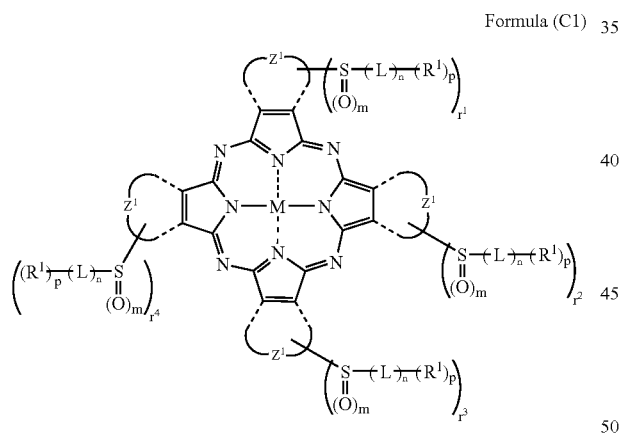

Formula (C1)

wherein in Formula (C1): $R^1$ represents a substituent group; L represents an aliphatic connecting group; each $Z^1$ represents a non-metal atom group needed for forming a six-membered ring together with two carbon atoms and the four groups $Z^1$ may be the same as or different from each other; M represents two hydrogen atoms, a bivalent metal atom, a bivalent metal oxide, a bivalent metal hydroxide or a bivalent metal chloride; m is 1 or 2; n is 0 or 1; p is an integer of 1 to 5; multiple groups $R^1$ in the molecule may be the same as or different from each other and at least one of the multiple groups $R^1$ includes —COOY, —SO₃Y, —CON(Y)CO—, —CON(Y)SO₂— or —SO₂N(Y)CO—; Y represents a hydrogen atom, a metal atom or a conjugate acid; and each of $r^1$, $r^2$, $r^3$ and $r^4$ is 0 or 1 and satisfy the following relationship: $r^1 + r^2 + r^3 + r^4 \geq 1$.

2. The colored curable composition according to claim 1, comprising at least one tetraazaporphyrin dye represented by Formula (C1), wherein $R^1$ represents a carboxy, carbamoyl, hydroxy, aliphatic oxycarbonyl, aliphatic oxy, aliphatic sulfonylcarbamoyl, aliphatic carbonylsulfamoyl, aliphatic sulfonylsulfamoyl, imido or aliphatic sulfonyl group.

3. The colored curable composition according to claim 1, comprising at least one tetraazaporphyrin dye represented by Formula (C1), wherein L represents an aliphatic group having 1 to 6 carbon atoms.

4. The colored curable composition according to claim 1, comprising at least one tetraazaporphyrin dye represented by Formula (C1), wherein $Z^1$ represents a non-metal atom group needed for forming a benzene ring.

5. The colored curable composition according to claim 1, comprising at least one tetraazaporphyrin dye represented by Formula (C1), wherein M represents VO, Co, Cu, or Zn.

6. The colored curable composition according to claim 1, comprising at least one tetraazaporphyrin dye represented by Formula (C1), wherein m is 2.

7. The colored curable composition according to claim 1, comprising at least one tetraazaporphyrin dye represented by Formula (C1), wherein p is 1.

8. The colored curable composition according to claim 1, further comprising at least one azomethine dye represented by the following Formula (I):

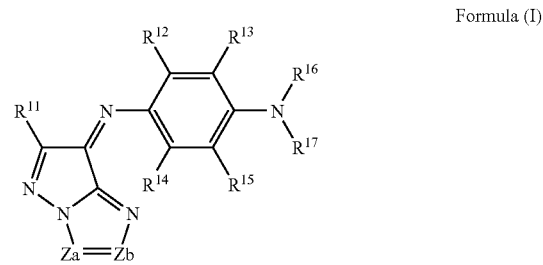

Formula (I)

wherein in Formula (I): $R^{11}$, $R^{12}$, $R^{13}$, $R^{14}$ and $R^{15}$ each independently represent a hydrogen atom or a substituent group; $R^{16}$ and $R^{17}$ each independently represent an alkyl, alkenyl, aryl or heterocyclic group; Za and Zb each independently represent —N= or —C($R^{18}$)= and $R^{18}$ represents a hydrogen atom or an alkyl, aryl or heterocyclic group; and $R^{12}$ and $R^{13}$, $R^{13}$ and $R^{16}$, $R^{14}$ and $R^{15}$, $R^{15}$ and $R^{17}$, and $R^{16}$ and $R^{17}$ each may independently be joined to each other, forming a five- to seven-membered ring.

9. The colored curable composition according to claim 8, wherein the azomethine dye is represented by the following Formula (II):

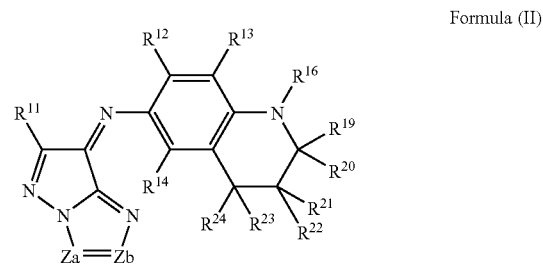

Formula (II)

wherein in Formula (II): $R^{19}$ to $R^{24}$ each independently represent a hydrogen atom or a substituent group; $R^{11}$ to $R^{14}$ and $R^{16}$ are respectively the same as $R^{11}$ to $R^{14}$ and $R^{16}$ in Formula (I), and Za and Zb in Formula (II) are the same as Za and Zb in Formula (I); the substituent groups represented by $R^{19}$ to $R^{24}$ are the same as the substituent group represented by $R^{11}$ in Formula (I) above; and $R^{12}$ and $R^{13}$, $R^{13}$ and $R^{16}$, $R^{16}$ and $R^{19}$, $R^{14}$ and $R^{24}$ each may independently be joined to each other, forming a five-, six-, or seven-membered ring.

10. The colored curable composition according to claim 9, wherein the azomethine dye is represented by the following Formula (III):

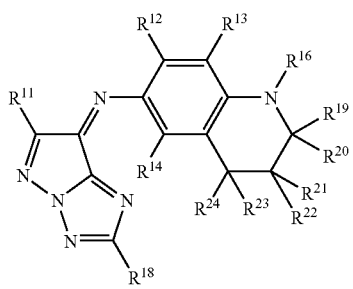

Formula (III)

wherein in Formula (III): $R^{18}$ represents a hydrogen atom or an alkyl, aryl or heterocyclic group; and $R^{11}$ to $R^{14}$ and $R^{16}$ and $R^{19}$ to $R^{24}$ are respectively the same as $R^{11}$ to $R^{14}$ and $R^{16}$ and $R^{19}$ to $R^{24}$ in Formula (I) or (II) above.

11. A method of producing a color filter, comprising: coating the colored curable composition described in claim 1 on or above a substrate; and forming a pattern image by exposing the coated film through a mask and developing the coated film.

12. The colored composition of claim 1, further comprising an oxime compound.

13. A color filter, comprising at least one tetraazaporphyrin dye represented by the following Formula (C1):

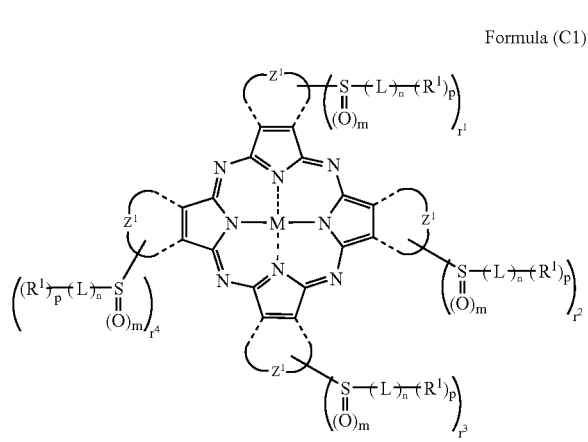

Formula (C1)

wherein in Formula (C1): $R^1$ represents a substituent group; L represents an aliphatic connecting group; each $Z^1$ represents a non-metal atom group needed for forming a six-membered ring together with two carbon atoms, and the four groups $Z^1$ may be the same as or different from each other; M represents two hydrogen atoms, a bivalent metal atom, a bivalent metal oxide, a bivalent metal hydroxide or a bivalent metal chloride; m is 1 or 2; n is 0 or 1; p is an integer of 1 to 5; multiple groups $R^1$ in the molecule may be the same as or different from each other, and at least one of the multiple groups $R^1$ includes —COOY, —SO$_3$Y, —CON(Y)CO—, —CON(Y)SO$_2$— or —SO$_2$N(Y)CO—; Y represents a hydrogen atom, a metal atom or a conjugate acid; and each of $r^1$, $r^2$, $r^3$ and $r^4$ is 0 or 1 and satisfy the following relationship: $r^1+r^2+r^3+r^4 \geq 1$.

14. The color filter according to claim 13 containing at least one tetraazaporphyrin dye represented by Formula (C1), wherein, $R^1$ represents a carboxy, carbamoyl, hydroxy, aliphatic oxycarbonyl, aliphatic oxy, aliphatic sulfonylcarbamoyl, aliphatic carbonylsulfamoyl, aliphatic sulfonylsulfamoyl, imido or aliphatic sulfonyl group.

15. The color filter according to claim 13 containing at least one tetraazaporphyrin dye represented by Formula (C1), wherein L represents an aliphatic group having 1 to 6 carbon atoms.

16. The color filter according to claim 13 containing at least one tetraazaporphyrin dye represented by Formula (C1), wherein $Z^1$ represents a non-metal atom group needed for forming a benzene ring.

17. The color filter according to claim 13 containing at least one tetraazaporphyrin dye represented by Formula (C1), wherein M represents VO, Co, Cu or Zn.

18. The color filter according to claim 13 containing at least one tetraazaporphyrin dye represented by Formula (C1), wherein, m is 2 and p is 1.

19. The color filter according to claim 13, further comprising at least one azomethine dye represented by Formula (I):

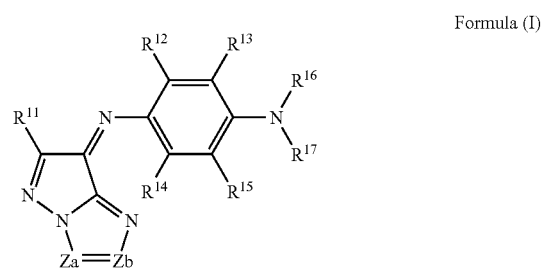

Formula (I)

wherein in Formula (I): $R^{11}$, $R^{12}$, $R^{13}$, $R^{14}$ and $R^{15}$ each independently represent a hydrogen atom or a substituent group, and $R^{16}$ and $R^{17}$ each independently represent an alkyl, alkenyl, aryl or heterocyclic group; Za and Zb each independently represent —N═ or —C(R$^{18}$)═ and $R^{18}$ represent a hydrogen atom or an alkyl, aryl or heterocyclic group; and $R^{12}$ and $R^{13}$, $R^{13}$ and $R^{16}$, $R^{14}$ and $R^{15}$, $R^{15}$ and $R^{17}$, and $R^{16}$ and $R^{17}$ each may independently be joined to each other, forming a five- to seven-membered ring.

20. The color filter according to claim 19, wherein the azomethine dye is represented by the following Formula (II):

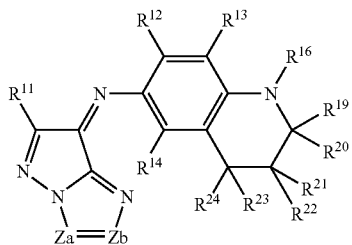

Formula (II)

wherein in Formula (II): $R^{19}$ to $R^{24}$ each independently represent a hydrogen atom or a substituent group; $R^{11}$ to $R^{14}$ and $R^{16}$ are respectively the same as $R^{11}$ to $R^{14}$ and $R^{16}$ in Formula (I), and Za and Zb in Formula (II) are respectively the same as Za and Zb in Formula (I); the substituent groups represented by $R^{19}$ to $R^{24}$ are the same as the substituent group represented by $R^{11}$ in Formula (I); and $R^{12}$ and $R^{13}$, $R^{13}$ and $R^{16}$, $R^{16}$ and $R^{19}$, $R^{14}$ and $R^{24}$ each may independently be joined to each other, forming a five-, six-, or seven-membered ring.

21. The color filter according to claim 20, wherein the azomethine dye is represented by the following Formula (III):

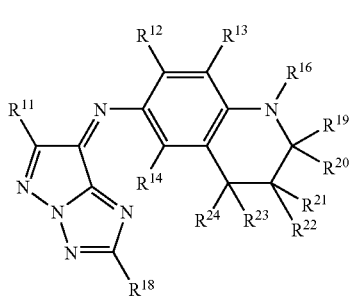

Formula (III)

wherein in Formula (III): $R^{18}$ represents a hydrogen atom or an alkyl, aryl or heterocyclic group; and $R^{11}$ to $R^{14}$ and $R^{16}$ and $R^{19}$ to $R^{24}$ are respectively the same as $R^{11}$ to $R^{14}$ and $R^{16}$ and $R^{19}$ to $R^{24}$ in Formula (I) or (II).

* * * * *